(12) United States Patent
Takahashi

(10) Patent No.: US 9,385,691 B2
(45) Date of Patent: *Jul. 5, 2016

(54) TIMING CONTROL DEVICE AND CONTROL METHOD THEREOF

(71) Applicant: Renesas Electronics Corporation, Kanagawa (JP)

(72) Inventor: Atsushi Takahashi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/628,993

(22) Filed: Feb. 23, 2015

(65) Prior Publication Data

US 2015/0171837 A1 Jun. 18, 2015

Related U.S. Application Data

(63) Continuation of application No. 13/569,378, filed on Aug. 8, 2012, now Pat. No. 9,009,519.

(30) Foreign Application Priority Data

| Aug. 9, 2011 | (JP) | 2011-173709 |
| Aug. 9, 2011 | (JP) | 2011-173710 |
| Apr. 26, 2012 | (JP) | 2012-101781 |

(51) Int. Cl.
*G06F 1/14* (2006.01)
*H03K 3/017* (2006.01)
(Continued)

(52) U.S. Cl.
CPC ............ *H03K 3/017* (2013.01); *F02D 41/2403* (2013.01); *F02D 41/28* (2013.01); *G06F 1/14* (2013.01); *F02D 2250/14* (2013.01)

(58) Field of Classification Search
CPC ........ G06F 1/14; F02D 41/28; F02D 41/2403; F02D 2250/14
USPC .......................................... 713/500, 501, 502
See application file for complete search history.

(56) References Cited

U.S. PATENT DOCUMENTS

| 4,408,279 A | 10/1983 | Imai et al. |
| 5,377,347 A | 12/1994 | Hiiragizawa et al. |

(Continued)

FOREIGN PATENT DOCUMENTS

| JP | 60-3034 A | 1/1985 |
| JP | 9-139732 A | 5/1997 |

(Continued)

OTHER PUBLICATIONS

Communication dated Sep. 29, 2015 from the Japanese Patent Office in counterpart application No. 2012-101781.

*Primary Examiner* — Dennis M Butler
(74) *Attorney, Agent, or Firm* — Sughrue Mion, PLLC

(57) ABSTRACT

Provided is a timing control device including: a storage unit that stores multiple pieces of timing control information including identification information and expected value data; a first selector that selectively outputs any of the multiple pieces of timing control information; a second selector that selectively outputs any of data items output from data output devices based on the identification information; a reference data generation unit that generates reference data based on expected value data and a data item output from the second selector in synchronization with a switching of the timing control information; a comparator that compares the reference data with the data item output from the second selector and outputs a coincidence signal when the reference data and the data item coincide with each other; and an output control unit that outputs a timing signal according to the coincidence signal.

9 Claims, 34 Drawing Sheets

(51) Int. Cl.
*F02D 41/24* (2006.01)
*F02D 41/28* (2006.01)

(56) References Cited

U.S. PATENT DOCUMENTS 5,535,376 A 7/1996 Catherwood et al.

9,009,519 B2 * 4/2015 Takahashi .................. 713/502

FOREIGN PATENT DOCUMENTS

| JP | 9-171418 A | 6/1997 |
| JP | 9-204239 A | 8/1997 |
| JP | 2002-303201 A | 10/2002 |
| JP | 2008-169709 A | 7/2008 |

* cited by examiner

PRIOR ART

TIMING CONTROL DEVICE AND CONTROL METHOD THEREOF

CROSS-REFERENCE TO RELATED APPLICATIONS

This application is a Continuation of U.S. Ser. No. 13/569,378, filed Aug. 8, 2012, which is based upon and claims the benefit of priority from Japanese patent application No. 2011-173710, filed on Aug. 9, 2011, Japanese patent application No. 2011-173709, filed on Aug. 9, 2011, and Japanese patent application No. 2012-101781, filed on Apr. 26, 2012, the disclosures of which are incorporated herein in their entirety by reference.

BACKGROUND

The present invention relates to a timing control device and a control method thereof, and more particularly, to a timing control device suitable for versatile timing control, and a control method thereof.

Along with the recent diversification of applications, there is a demand for controlling a plurality of control targets, such as an engine and a motor, using a single microcomputer. Existing microcomputers generally include timers exclusively used for the respective control targets. In other words, the existing microcomputers generally include a number of timers corresponding to the number of control targets. Therefore, the existing microcomputers have a problem of an increase in circuit size.

Japanese Unexamined Patent Application Publication Nos. 09-139732 and 09-171418 disclose countermeasures against such a problem. FIG. 16 is a block diagram showing a timing signal generator disclosed in Japanese Unexamined Patent Application Publication No. 09-139732. The timing signal generator shown in FIG. 16 is a device that detects a coincidence between a value counted by a timer 11 and a designated temporal position, and generates a timing signal. This timing signal generator includes a memory unit 13 that stores a plurality of positional information items to designate a temporal position of a change point of the timing signal, and a plurality of output control information items to designate an output terminal for the timing signal and a signal change at the change point; a coincidence detection unit 14 that generates a coincidence detection pulse when the positional information and the timer value coincide with each other; an output control unit 17 that generates a timing signal designated based on the output control information read from the memory and the coincidence detection pulse; and an address counter unit 15 that generates an address signal of corresponding subsequent information for the memory when the coincidence detection pulse is output. This configuration enables generation of a number of timing signals only by using a single coincidence detection unit.

Thus, the timing signal generator shown in FIG. 16 need not include a plurality of coincidence detection units even in the case of generating a number of timing signals. This results in suppression of an increase in circuit size.

FIG. 17 is a block diagram showing a timer/counter circuit disclosed in Japanese Unexamined Patent Application Publication No. 09-171418. The timer/counter circuit shown in FIG. 17 includes an incrementer 1, a latch circuit 2, a register block 3A, a coincidence flag 4A, a clear control unit 5, an operation control unit 6, a central processing unit 7, a data bus 8, an internal bus 9, and a transfer control circuit 10. The register block 3A includes a buffer circuit 30, counters 31A to 31D, a timer register 32 having a coincidence detection function, and coincident data storage circuits 33A to 33D having no coincidence detection function.

The coincident data storage circuits 33A to 33D store timer values respectively corresponding to the counters 31A to 31D. The transfer control circuit 10 transfers the timer value stored in any of the coincident data storage circuits 33A to 33D to the timer register 32. The timer register 32 detects a coincidence between the timer value transferred from any of the coincident data storage circuits 33A to 33D and the count value of the corresponding counter, and outputs a coincidence signal F. The coincidence flag 4A generates a corresponding interrupt signal (any of IA to ID) according to the coincidence signal F from the timer register 32.

In this manner, the timer/counter circuit shown in FIG. 17 includes a plurality of coincident data storage circuits which are formed of RAM cells having no coincidence detection function and which have a small circuit size, instead of including a plurality of timer registers which are formed of CAM cells having the coincidence detection function and which have a large circuit size. This results in suppression of an increase in circuit size.

Additionally, Japanese Unexamined Patent Application Publication No. 2002-303201 discloses a vehicle control device including a microcomputer. This microcomputer counts values of control counters for use in various controls at predetermined time intervals in a base process. Further, the microcomputer determines an execution timing for each of the various controls based on the counter values, and carries out the corresponding process when the timing is reached. This microcomputer counts up a reference counter in a fixed-time interrupt process, and calculates a delay of the base process by referring to the reference counter at each count-up timing of each control counter. When the delay reaches an operation width for one counting operation by the control counter, the value of the control counter is corrected.

Furthermore, Japanese Unexamined Patent Application Publication No. 2008-169709 discloses an on-vehicle engine control device that generates a pulse width modulation signal to improve the accuracy of authentication/collation of a start key with an inexpensive configuration. In a microprocessor provided in the on-vehicle engine control device, two timer circuit units constitute first and second drive control timers TIM1 and TIM2, respectively, and generate control output signals for controlling ignition/fuel injection which operate in synchronization with a crank angle sensor. The control output signals are distributed to cylinders by a plurality of cylinder selecting gate circuits and sequentially drive respective engine driving devices.

Until completion of the authentication/collation, the pulse width modulation signal generated in the first drive control timer TIM1 is transmitted to an immobilizer through an authentication gate circuit. The immobilizer transmits a radio signal having a frequency and an amplitude corresponding to the cycle and duty of the received pulse width modulation signal to a transponder, and reads a personal identification number from the start key.

SUMMARY

In the timing signal generator (timing control device) disclosed in Japanese Unexamined Patent Application Publication No. 09-139732, when the timer value of a single timer 11 coincides with the timer value stored in the memory unit 13, the output control unit 17 generates the timing signal from the corresponding output terminal. In other words, the output control unit 17 does not generate a single timing signal based on timer values of a plurality of timers. Therefore, the timing signal generator of the related art has a problem that it is impossible to perform versatile timing control.

In the timer/counter circuit (timing control device) disclosed in Japanese Unexamined Patent Application Publication No. 09-171418, the coincidence flag 4A generates the interrupt signal IA when the count value of the counter 31A coincides with the timer value stored in the coincident data storage circuit 33A. The coincidence flag 4A generates the interrupt signal IB when the count value of the counter 31B coincides with the timer value stored in the coincident data memory circuit 33B. The coincidence flag 4A generates the interrupt signal IC when the count value of the counter 31C coincides with the timer value stored in the coincident data storage circuit 33C. The coincidence flag 4A generates the interrupt signal ID when the count value of the counter 31D coincides with the timer value stored in the coincident data storage circuit 33D.

In this manner, the coincidence flag 4A generates a corresponding interrupt signal (any one of IA to ID) when the count value of a single counter circuit coincides with the corresponding timer value. That is, the coincidence flag 4A is configured to generate a single interrupt signal based only on the count value of a single counter circuit, but is not configured to generate a single interrupt signal based on count values of a plurality of counter circuits. Therefore, the timer/counter circuit of the related art has a problem that it is impossible to perform versatile timing control even in the case of performing timing control using such an interrupt signal.

Particularly in recent years, along with the diversification of customer demands, the combination of counters included in a microcomputer, for example, varies even in the case of implementing the same function. Therefore, there is a demand for development of versatile products that meet various customer demands.

A first aspect of the present invention is a timing control device including: a storage unit that stores a plurality of pieces of timing control information including identification information of any of a plurality of data output devices and corresponding expected value data; a first selector that selectively outputs any of the plurality of pieces of timing control information; a second selector that selectively outputs any of data items output from the data output devices based on the identification information included in the timing control information output from the first selector; a reference data generation unit that generates reference data based on expected value data included in the timing control information output from the first selector and a data item output from the second selector in synchronization with a switching of the timing control information selected by the first selector; a comparator that compares the reference data with the data item output from the second selector and outputs a coincidence signal when the reference data and the data item coincide with each other; and an output control unit that outputs a timing signal according to the coincidence signal. When the coincidence signal is output, the first selector switches the selection of any of the plurality of pieces of timing control information to subsequent timing control information.

A second aspect of the present invention is a control method of a timing control device, including: storing a plurality of pieces of timing control information including identification information of any of a plurality of data output devices and corresponding expected value data; selectively outputting, from a first selector, any of the plurality of pieces of timing control information; selecting any of data items output from the data output devices based on identification information included in the timing control information output from the first selector, and outputting the selected data item from a second selector; generating reference data based on expected value data included in the timing control information output from the first selector and a data item output from the second selector in synchronization with a switching of the timing control information selected by the first selector; comparing the reference data with the data item output from the second selector and outputting a coincidence signal when the reference data and the data item coincide with each other; and outputting a timing signal according to the coincidence signal. When the coincidence signal is output, the selection of any of the plurality of pieces of timing control information is switched to subsequent timing control information, and the subsequent timing control information is output from the first selector.

The circuit configuration as described above enables versatile timing control.

According to the present invention, it is possible to provide a timing control device capable of performing versatile timing control, and a control method thereof.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Figure 1:
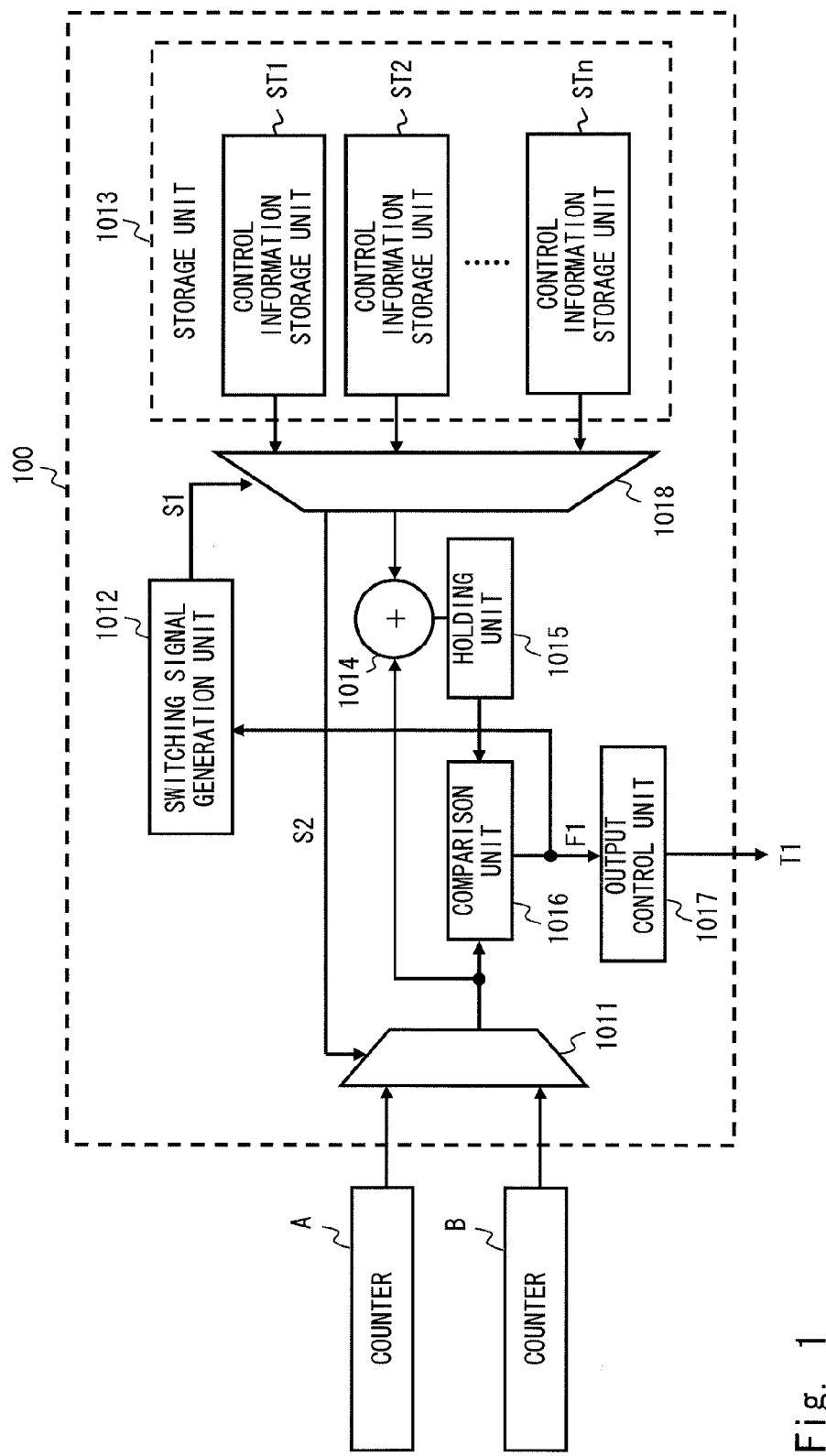
FIG. 1 is a block diagram showing a timing control device according to a first embodiment of the present invention.

Hereinafter, embodiments of the present invention will be described with reference to the drawings. Note that the drawings are in simplified form, and the technical scope of the present invention should not be narrowly interpreted based on the drawings. The same elements are denoted by the same reference numerals, and a repeated description is omitted.

First Embodiment

FIG. 1 is a block diagram showing an outline of a timing control device 100 according to a first embodiment of the present invention. The timing control device 100 according to the first embodiment generates a timing signal based on data output from a plurality of data output devices (counters A and B in the example of FIG. 1), thereby enabling versatile timing control. This configuration will be described in detail below.

As shown in FIG. 1, the timing control device 100 includes a selection circuit (second selector) 1011, a selection circuit (first selector) 1018, a switching signal generation unit 1012, a storage unit 1013, an arithmetic unit 1014, a data holding unit 1015, a comparison unit (comparator) 1016, and an output control unit 1017. The storage unit 1013 includes n (n is an integer equal to or greater than 2) control information storage units ST1 to STn. The selection circuits 1011 and 1018, the switching signal generation unit 1012, the storage unit 1013, the arithmetic unit 1014, the data holding unit 1015, the comparison unit 1016, and the output control unit 1017 constitute a single condition comparison unit. FIG. 1 illustrates an example in which the timing control device 100 includes one condition comparison unit, but the timing control device 100 may have a circuit configuration including two or more condition comparison units. The arithmetic unit 1014 and the data holding unit 1015 constitute a reference data generation unit.

A CPU (not shown) is provided outside the timing control device 100. The CPU supplies timing control information to the timing control device 100 in response to a request from the timing control device 100, for example.

The selection circuit 1011 receives data output from the counters A and B which are provided outside the timing control device. Each of the counters A and B, which are data output devices, outputs data at its own timing (hereinafter referred to as "data update timing", and the cycle of the data update timing is referred to as "data update cycle"). For example, each of the counters A and B increments and outputs a count value at its own data update timing. The number of data output devices can be appropriately changed.

The selection circuit 1011 selects and outputs any of the data output from the data output devices based on a switching signal S2 (described later) output from the selection circuit 1018. In the example of FIG. 1, the selection circuit 1011 selects and outputs any of the data output from the counters A and B based on the switching signal S2. The data output from the selection circuit 1011 is input to each of the arithmetic unit 1014 and the comparison unit 1016.

In the storage unit 1013, the control information storage units ST1 to STn preliminarily store the timing control information. Specifically, the control information storage units ST1 to STn preliminarily store identification information of any of the plurality of data output devices, and corresponding expected value data. The control information storage units ST2 to STn respectively store relative values with respect to the expected value data stored in the preceding units of the respective control information storage units ST1 to ST(n−1) as the expected value data.

The first embodiment illustrates, by way of example, the case where the identification information of the counter A indicates "0" and the identification information of the counter B indicates "1". For example, the control information storage unit ST1 stores "0" as the identification information and "1" as the expected value data. The control information storage unit ST2 stores "1" as the identification information and "2" as the expected value data.

The selection circuit 1018 selects and outputs any of the timing control information stored in the control information storage units ST1 to STn, based on a switching signal S1 (described later) output from the switching signal generation unit 1012. Specifically, the selection circuit 1018 outputs the identification information included in the selected timing control information as the switching signal S2 to the selection circuit 1011, and outputs the expected value data included in the selected timing control information to the arithmetic unit 1014.

For example, the selection circuit 1018 selects the timing control information stored in the control information storage unit ST1. In this case, the selection circuit 1018 outputs the identification information "0" as the switching signal S2, and also outputs the expected value data "1". The selection circuit 1011 selects and outputs the data output from the counter A based on the switching signal S2 corresponding to the identification information "0".

The reference data generation unit including the arithmetic unit 1014 and the data holding unit 1015 generates reference data based on the data output from the selection circuit 1011 in synchronization with the switching of the timing control information selected by the selection circuit 1018 and on the expected value data. More specifically, the arithmetic unit 1014 adds the data output from the selection circuit 1011 and the expected value data output from the selection circuit 1018 and outputs the addition result. The data holding unit 1015 holds the operation result (reference data) output from the arithmetic unit 1014 immediately after switching of the timing control information selected by the selection circuit 1018. Specifically, when the timing control information selected by the selection circuit 1018 is switched, the data holding unit 1015 holds additional values (reference data) of a first data item output from the selection circuit 1011 immediately after the switching and expected value data.

For example, a description is given of the case where the selection circuit 1018 switches the selection of the timing control information stored in the control information storage unit ST2 from the timing control information stored in the control information storage unit ST1, and starts to output the timing control information. In this case, the selection circuit 1018 starts to output the identification information "1" as the switching signal S2 to the selection circuit 1011 and starts to output the expected value data "2" to the arithmetic unit 1014. The selection circuit 1011 selects the data output from the counter B based on the switching signal S2 corresponding to the identification information "1" and starts to output the data. The arithmetic unit 1014 adds the data (for example, "5") output from the selection circuit 1011 and the expected value data "2", and outputs the addition result. Then, the data holding unit 1015 holds the operation result "7" of the arithmetic unit 1014.

The comparison unit 1016 compares the data output from the selection circuit 1011 with the data held in the data holding unit 1015. When the data coincide with each other, the comparison unit 1016 outputs a coincidence signal. For example, when the output data of the counter B, which is output from the selection circuit 1011, is "7", the output data coincides with the data held in the data holding unit 1015, so that the comparison unit 1016 outputs the coincidence signal.

The switching signal generation unit 1012 generates the switching signal S1 based on the coincidence signal from the comparison unit 1016. Specifically, the switching signal generation unit 1012 outputs the switching signal S1 so that the selection circuit 1018 selects and outputs the timing control information stored in the subsequent control information storage unit, every time the coincidence signal is output from the comparison unit 1016. Thus, the selection circuit 1018 sequentially selects the timing control information ranging from the timing control information stored in the control information storage unit ST1 to the timing control information stored in the control information storage unit STn, and outputs the selected timing control information every time the coincidence signal is output from the comparison unit 1016.

Upon receiving the coincidence signal from the comparison unit 1016, the output control unit 1017 outputs a timing signal T1 according to the coincidence signal. For example, upon receiving the coincidence signal from the comparison unit 1016, the output control unit 1017 inverts the logical value of the timing signal T1 in synchronization with the coincidence signal.

In this manner, the timing control device 100 according to the first embodiment can generate the timing signal based on the data output from each of the data output devices. That is, the timing control device 100 according to the first embodiment can perform versatile timing control based on the data output from each of the data output devices.

Further, the timing control device 100 according to the first embodiment relatively designates a timing of a change in the logical value of the timing signal T1 with reference to a timing of a change in the logical value immediately before the timing signal T1. Accordingly, the timing control device 100 according to the first embodiment can reliably perform the timing control using the timing control information stored in each of the control information storage units ST1 to STn even when each of the data output devices outputs data at its own data update timing.

Furthermore, the timing control device 100 according to the first embodiment preliminarily stores n pieces of timing control information in the storage unit 1013, and performs the timing control using these pieces of information in order. For this reason, before completion of at least n times of timing control (a change in the logical value of the timing signal T1), an interrupt for requesting the timing control information is not generated from the timing control device 100 to the CPU. Thus, the timing control device 100 according to the first embodiment need not involve the CPU or the like in the timing control, which makes it possible to increase the responsiveness of the timing control. Further, the occurrence frequency of the interrupt to the CPU is reduced, thereby reducing the load on the CPU and peripheral bus. Furthermore, the timing control device 100 according to the first embodiment can continuously perform the timing control even when the CPU shifts to a sleep mode (a mode for causing the CPU to stop execution of instructions) to reduce power consumption.

(Timing Diagram)

Figure 2:
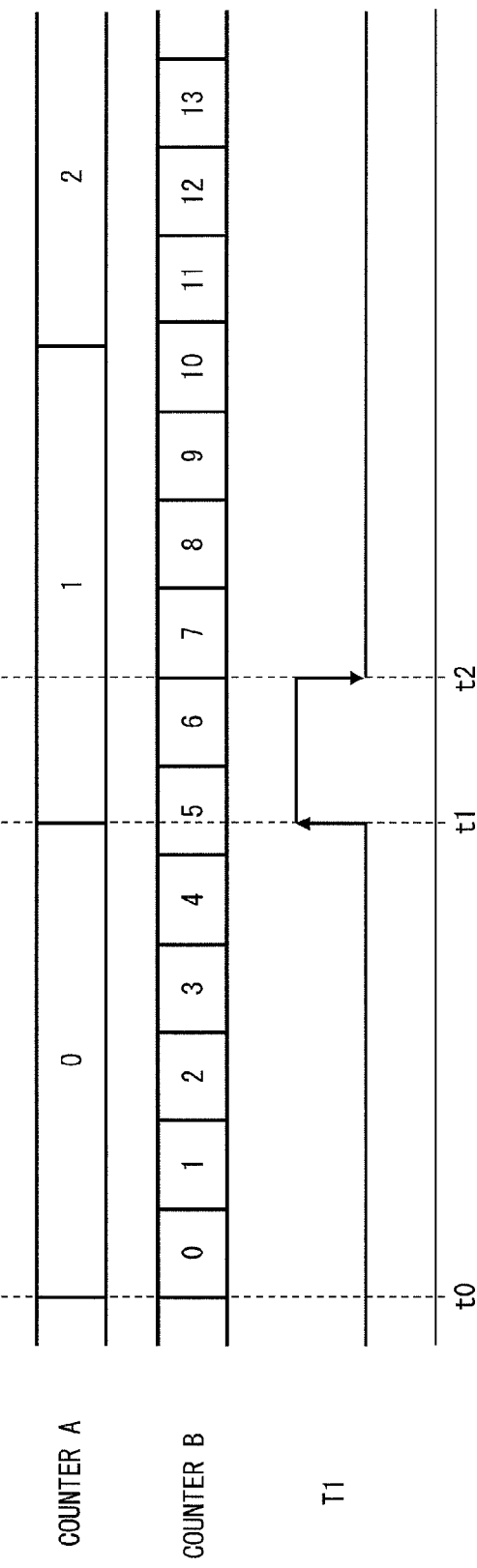
FIG. 2 is a timing diagram showing an operation of the timing control device according to the first embodiment of the present invention.

Next, an operation of the timing control device 100 shown in FIG. 1 will be described in more detail with reference to FIG. 2. FIG. 2 is a timing diagram showing an operation of the timing control device 100 shown in FIG. 1. In the example of FIG. 2, the counter A increments and outputs the count value at its own data update timing after the resetting (time t0) of the count value to "0", and the counter B increments and outputs the count value at the data update timing of a cycle smaller than that of the counter A after the resetting (time t0) of the count value to "0".

In the example of FIG. 2, the control information storage unit ST1 stores "0" as the identification information and "1" as the expected value data. The control information storage unit ST2 stores "1" as the identification information and "2" (relative value) as the expected value data.

First, the selection circuit 1018 selects and outputs the timing control information stored in the control information storage unit ST1, based on the switching signal S1. Specifically, the selection circuit 1018 outputs the identification information "0" as the switching signal S2, and also outputs the expected value data "1". The selection circuit 1011 selects and outputs the data output from the counter A, based on the switching signal S2 corresponding to the identification information "0".

Immediately after resetting of the counter A, the arithmetic unit 1014 outputs the result "1" of the addition between the data "0" output from the selection circuit 1011 and the expected value data "1". Then, the data holding unit 1015 holds the operation result "1" of the arithmetic unit 1014. Specifically, the data holding unit 1015 holds the result "1" of the addition between the output data "0" of the selection circuit 1011 immediately after resetting of the counter A and the expected value data "1".

When the output data of the counter A, which is output from the selection circuit 1011, is "1", the output data coincides with the data held in the data holding unit 1015, so that the comparison unit 1016 outputs a coincidence signal F1 (time t1). Upon receiving the coincidence signal F1 from the comparison unit 1016, the output control unit 1017 inverts the timing signal T1 from an L level to an H level in synchronization with the coincidence signal F1 (time t1).

Upon receiving the coincidence signal F1 from the comparison unit 1016, the switching signal generation unit 1012 outputs the switching signal S1 so that the selection circuit 1018 selects the timing control information stored in the subsequent control information storage unit ST2 (time t1). Accordingly, the selection circuit 1018 selects and outputs the timing control information stored in the control information storage unit ST2. Specifically, the selection circuit 1018 outputs the identification information "1" as the switching signal S2, and also outputs the expected value data "2" (relative value). The selection circuit 1011 selects and outputs the data output from the counter B, based on the switching signal S2 corresponding to the identification information "1".

Immediately after switching of the timing control information selected by the selection circuit 1018, the arithmetic unit 1014 outputs the result "7" of the addition between the data "5" output from the selection circuit 1011 and the expected value data "2". Then, the data holding unit 1015 holds the operation result "7" of the arithmetic unit 1014. Specifically, when the timing control information selected by the selection circuit 1018 is switched, the data holding unit 1015 holds the result "7" of the addition between the initial output data "5" of the selection circuit 1011 immediately after the switching and the expected value data "2".

When the output data of the counter B, which is output from the selection circuit 1011, is "7", the data coincides with the data held in the data holding unit 1015, so that the comparison unit 1016 outputs the coincidence signal F1 (time t2). Upon receiving the coincidence signal F1 from the comparison unit 1016, the output control unit 1017 inverts the timing signal T1 from the H level to the L level in synchronization with the coincidence signal F1 (time t2).

Upon receiving the coincidence signal F1 from the comparison unit 1016, the switching signal generation unit 1012 outputs the switching signal S1 so that the selection circuit 1018 selects the timing control information stored in a subsequent control information storage unit ST3 (time t2). Accordingly, the selection circuit 1018 selects and outputs the timing control information stored in the control information storage unit ST3.

In this manner, the timing control device 100 causes the timing signal T1 to rise based on the output data of the counter A (time t1), and causes the timing signal T1 to fall based on the output data of the counter B (time t2).

(Modified Example of Timing Control Device 100)

Figure 3:
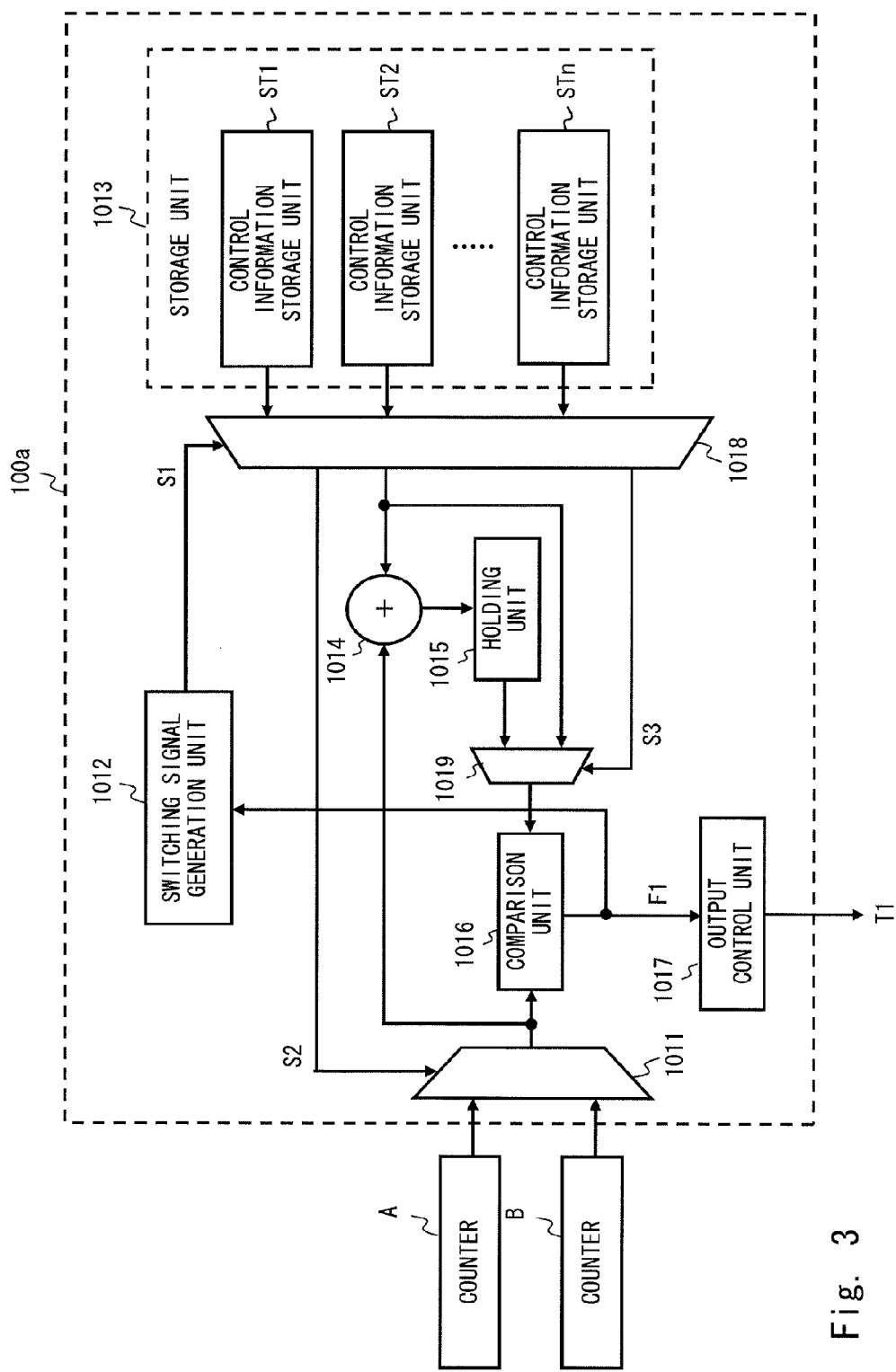
FIG. 3 is a block diagram showing a modified example of the timing control device according to the first embodiment of the present invention.

FIG. 3 is a block diagram showing a modified example of the timing control device 100 shown in FIG. 1. A timing control device 100a shown in FIG. 3 enables storage of relative expected value data and absolute expected value data in a mixed manner in the storage unit 1013.

Compared with the timing control device 100 shown in FIG. 1, the timing control device 100a further includes a selection circuit (third selector) 1019. The selection circuits 1011, 1018, and 1019, the switching signal generation unit 1012, the storage unit 1013, the arithmetic unit 1014, the data holding unit 1015, the comparison unit 1016, and the output control unit 1017 constitute a single condition comparison unit.

Further, the timing control device 100a stores the expected value data and the identification information, as well as additional information for identifying whether the expected value data is an absolute value or a relative value, in each control information storage unit. The selection circuit 1018 further outputs a switching signal S3 corresponding to the additional information. Accordingly, when the expected value data output from the selection circuit 1018 is a relative value, the selection circuit 1019 selects the data output from the data holding unit 1015 and outputs the selected data to the comparison unit 1016. On the other hand, when the expected value data output from the selection circuit 1018 is an absolute value, the selection circuit 1019 selects the expected value data output from the selection circuit 1018 and outputs the selected expected value data to the comparison unit 1016. The other circuit configuration and operation of the timing control device 100a are similar to those of the timing control device 100 shown in FIG. 1, so the description thereof is omitted.

In this manner, the timing control device 100a shown in FIG. 3 performs the timing control using relative expected value data and absolute expected value data, thereby enabling more versatile timing control, compared with the timing control device 100.

(Description of Timing Control Device of Related Art)

Figure 4:
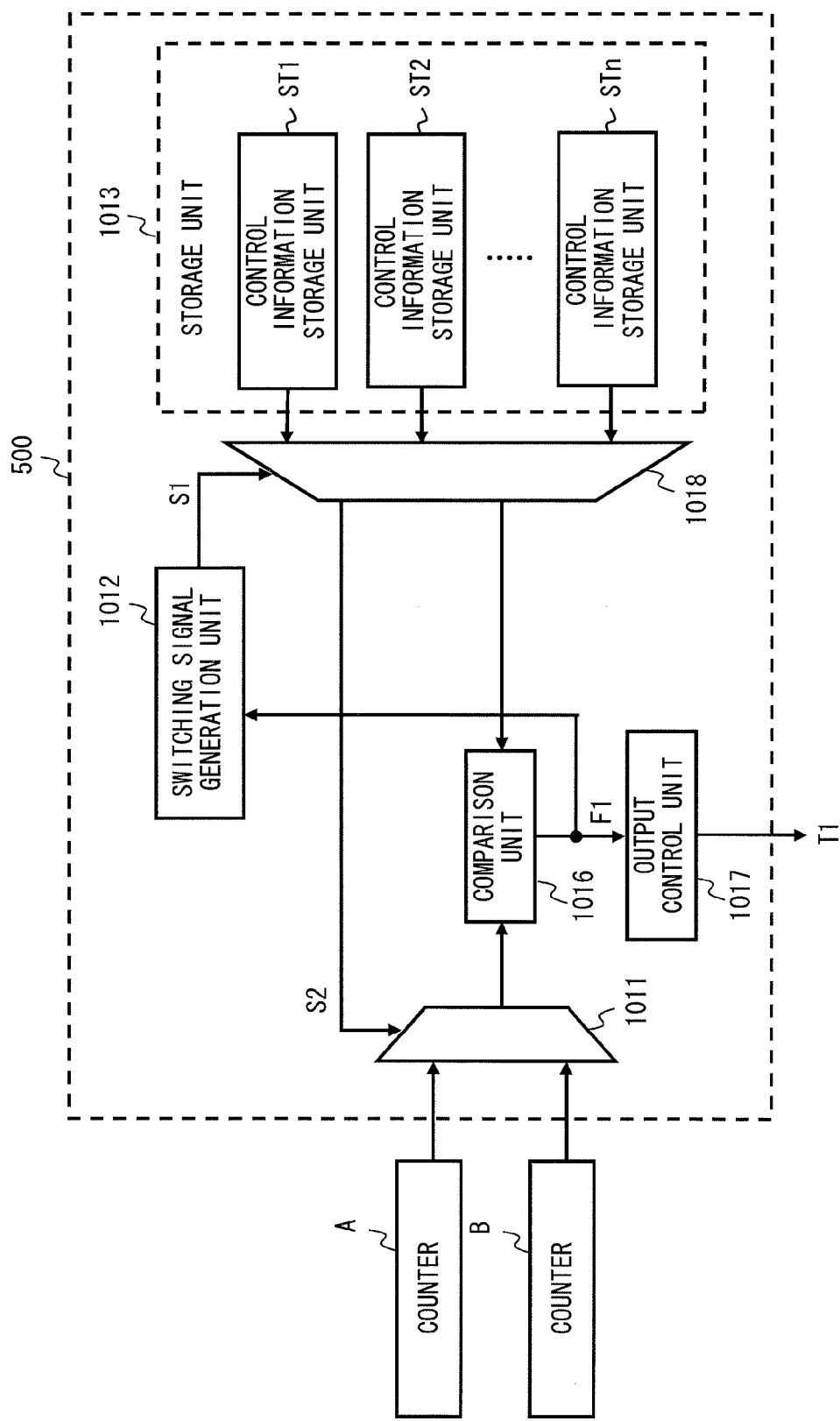
FIG. 4 is a block diagram showing a timing control device of a related art.
Figure 5:
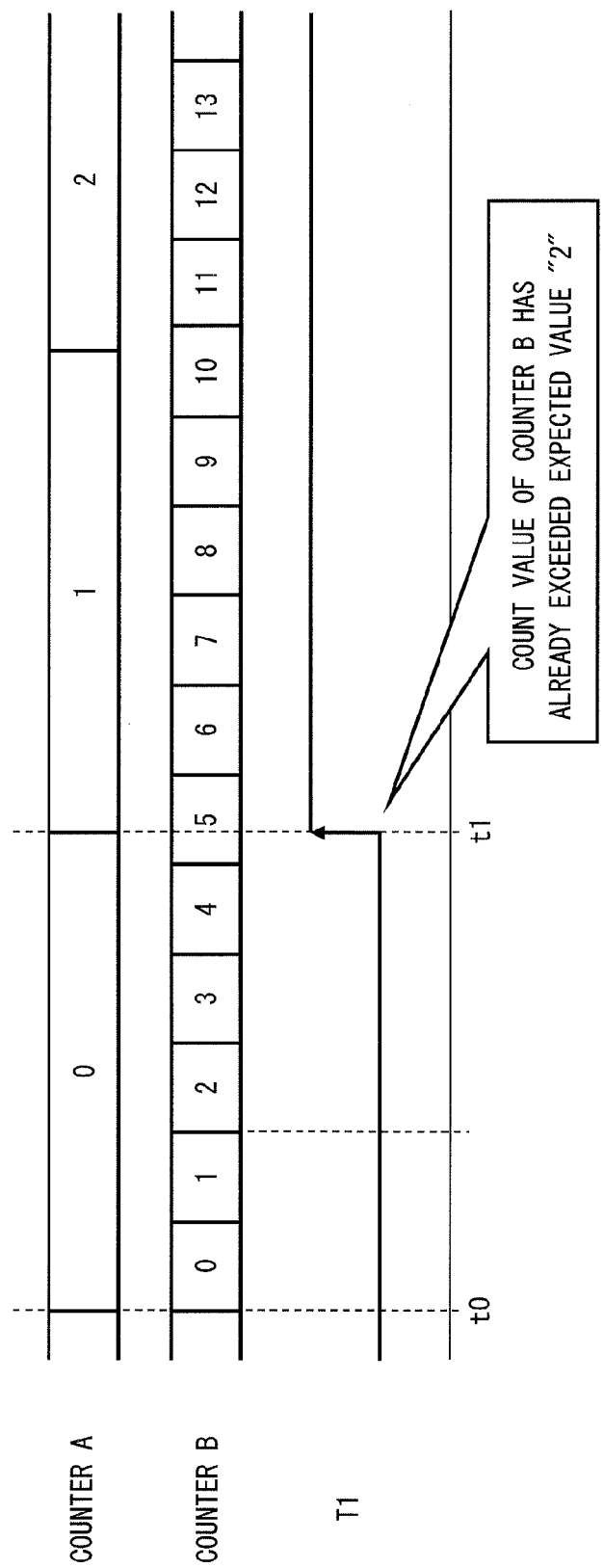
FIG. 5 is a timing diagram showing an operation of the timing control device of the related art.

Referring next to FIGS. 4 and 5, a description is given of a problem caused when the number of data output devices is simply increased and timing control is carried out without using any relative expected value data. FIG. 4 is a block diagram showing a timing control device 500 of a related art. FIG. 5 is a timing diagram showing an operation of the timing control device 500 of the related art.

Unlike the timing control device 100 shown in FIG. 1, the timing control device 500 of the related art stores absolute expected value data and identification information in each control information storage unit. Further, in the timing control device 500 of the related art, the arithmetic unit 1014 and the data holding unit 1015 are omitted and the expected value data output from the selection circuit 1018 is directly input to the comparison unit 1016. The other circuit configuration of the timing control device 500 of the related art is similar to that of the timing control device 100 according to the first embodiment, so the description thereof is omitted.

In the example of FIG. 5, the counters A and B operate in the same manner as in FIG. 2. The control information storage unit ST1 stores "0" as the identification information and "1" as the expected value data. The control information storage unit ST2 stores "1" as the identification information and "2" as the expected value data.

First, the selection circuit 1018 selects and outputs the timing control information stored in the control information storage unit ST1, based on the switching signal S1. Specifically, the selection circuit 1018 outputs the identification information "0" as the switching signal S2, and also outputs the expected value data "1". The selection circuit 1011 selects and outputs the data output from the counter A, based on the switching signal S2 corresponding to the identification information "0".

When the output data of the counter A, which is output from the selection circuit 1011, is "1", the data coincides with the expected value data output from the selection circuit 1018, so that the comparison unit 1016 outputs the coincidence signal F1 (time t1). Upon receiving the coincidence signal F1 from the comparison unit 1016, the output control unit 1017 inverts the timing signal T1 from the L level to the H level in synchronization with the coincidence signal F1 (time t1).

Upon receiving the coincidence signal F1 from the comparison unit 1016, the switching signal generation unit 1012 outputs the switching signal S1 so that the selection circuit 1018 selects the timing control information stored in the subsequent control information storage unit ST2 (time t1). Accordingly, the selection circuit 1018 selects and outputs the timing control information stored in the control information storage unit ST2. Specifically, the selection circuit 1018 outputs the identification information "1" as the switching signal S2, and also outputs the expected value data "2". The selection circuit 1011 selects and outputs the data output from the counter B, based on the switching signal S2 corresponding to the identification information "1".

When the output data of the counter B, which is output from the selection circuit 1011, is "2", the comparison unit 1016 is supposed to output the coincidence signal F1 because the output data coincides with the expected value data output from the selection circuit 1018. However, the output data of the counter B indicates "5" which exceeds the expected value data "2" at time t2. Since the output data of the counter B, which is output from the selection circuit 1011, does not coincide with the expected value data output from the selection circuit 1018, the comparison unit 1016 cannot output the coincidence signal F1. In other words, the timing control device 500 of the related art cannot perform the timing control using the timing control information stored in the control information storage unit ST2.

Thus, when each of the data output devices outputs data at its own data update timing, the timing control device 500 of the related art cannot ensure the temporal order of the timing control information stored in the control information storage units ST1 to STn. Therefore, the timing control device 500 of the related art has a problem that it is impossible to perform a desired timing control.

(Description of Control System to which the Present Invention is Applied)

Figure 6:
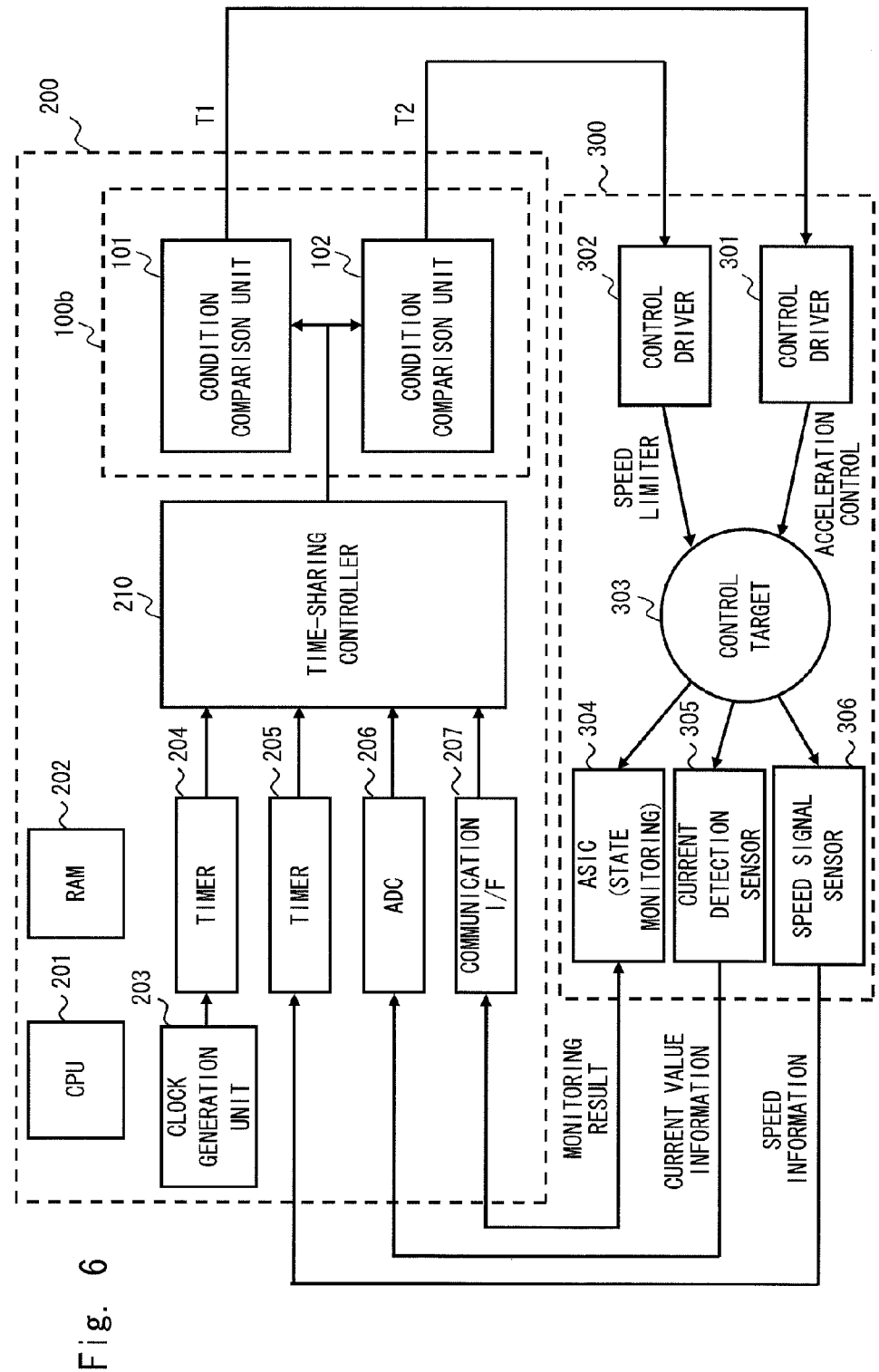
FIG. 6 is a block diagram showing an outline of a control system to which the present invention is applied.

The timing control device according to the present invention is mounted on a microcomputer as shown in FIG. 6, for example. FIG. 6 is a block diagram showing a control system including a microcomputer 200 and a control target device 300. The microcomputer 200 incorporates a timing control device 100b including two condition comparison units 101 and 102, as a modified example of the timing control device 100a shown in FIG. 3. The control target device 300 is controlled by the microcomputer 200. The timing control device 100b shown in FIG. 6 includes the condition comparison unit 101 that generates the timing signal T1, and the condition comparison unit 102 that generates a timing signal T2. Each of the condition comparison units 101 and 102 includes the selection circuits 1011, 1018, and 1019, the switching signal generation unit 1012, the storage unit 1013, the arithmetic unit 1014, the data holding unit 1015, the comparison unit 1016, and the output control unit 1017. The detailed configuration and operation of the condition comparison units 101 and 102 are similar to those of the condition comparison unit of the timing control device 100a shown in FIG. 3, so the description thereof is omitted. Note that the timing control device that generates a plurality of timing signals is equivalent to the case where a plurality of timing control devices that generates a single timing signal is present.

The microcomputer 200 shown in FIG. 6 includes the timing control device 100b, a time-sharing controller 210, a CPU 201 that processes programs, a RAM 202 that stores programs and the like, a clock generation unit 203 that generates a reference clock, timers 204 and 205, an AD converter 206, and a communication I/F 207. The control target device 300 includes control drivers 301 and 302, a control target 303, an ASIC 304, a current detection sensor 305, and a speed signal sensor 306.

The timer 204, the timer 205, the AD converter 206, and the communication I/F 207 are data output devices. The timer 204 increments and outputs a count value in synchronization with the reference clock generated by the clock generation unit 203. The timer 205 increments and outputs a count value based on speed information (pulse signal) output from the control target device 300. The AD converter 206 converts current value information (analog value) output from the control target device 300 into digital data and outputs the digital data. The communication I/F 207 outputs a monitoring result (digital value) output from the control target device 300 as digital data. In the example of FIG. 6, the timer 204, the timer 205, the AD converter 206, and the communication I/F 207 are used as the data output devices, but the data output devices are not limited thereto. Various types of data output devices may be used depending on the specifications. In the example of FIG. 6, the speed information, the current value information, and the monitoring result are supplied from the control target device 300 to the microcomputer 200, but the type of the information is not limited thereto. The type of the information to be supplied from the control target device 300 to the microcomputer 200 can be appropriately changed depending on the specifications.

The time-sharing controller 210 sequentially selects the data output from the timer 204, the timer 205, the AD converter 206, and the communication I/F 207, and outputs the selected data as time-shared data.

The timing control device 100b outputs the timing signals T1 and T2 having pulse waveforms based on a plurality data items contained in the time-shared data. Specifically, the timing control device 100b outputs the timing signals T1 and T2 having pulse waveforms based on the data output from each of the data output devices 204 to 207. The first embodiment illustrates, by way of example, the case where the microcomputer 200 includes the time-sharing controller 210, but the configuration of the microcomputer 200 is not limited thereto. The configuration of the microcomputer 200 can be appropriately changed into a configuration in which the time-sharing controller 210 is omitted. In this case, the data output from each of the data output devices is directly supplied to the condition comparison units 101 and 102 which are provided in the timing control device 100b.

The timing signal T1 is supplied to the control driver 301 provided in the control target device 300. The timing signal T2 is supplied to the control driver 302 provided in the control target device 300. In the example of FIG. 6, the two timing signals T1 and T2 are supplied from the microcomputer 200 to the control target device 300, but the timing signals are not limited thereto. The number of timing signals can be appropriately changed depending on the specifications of the control target device 300.

The control drivers 301 and 302 drive the control target 303 based on the timing signals T1 and T2, respectively. The control target 303 is an on-vehicle engine, for example, and the rotation motion of the control target is controlled by the control drivers 301 and 302. For example, the control driver 301 accelerates the rotational speed of the control target 303 based on the timing signal T1. The control driver 302 limits the rotational speed of the control target 303 based on the timing signal T2.

The ASIC 304 monitors states of the control target 303, and outputs a monitoring result to the communication I/F 207 as digital data. For example, the ASIC 304 is used to monitor the state of the control target 303, such as a normal operation state or a suspended state, for example. The current detection sensor 305 detects a current flowing through the control target 303, and outputs a detection result to the AD converter 206 as current value information (analog value). For example, the current detection sensor 305 is used to check whether a desired current is flowing through the control target 303. The speed signal sensor 306 detects the rotational speed of the control target 303, and outputs a detection result as speed information (pulse signal) to the timer 205.

As described above, the timing control device 100b shown in FIG. 6 generates the timing signals T1 and T2 based on the data output from each of the data output devices. In other words, the timing control device 100b shown in FIG. 6 can perform versatile timing control based on the data output from each of the data output devices. Further, in the example of FIG. 6, some of the data output devices output data corresponding to the information (speed information or the like) obtained from the control target 303. This enables the timing control device shown in FIG. 6 to perform the timing control of the control target 303 based on various types of information obtained from the control target 303. That is, the timing control device 100b shown in FIG. 6 can determine how to control the control target 303 based on various types of information obtained from the control target 303, and can perform versatile timing control in real time.

(Timing Diagram)

Figure 7:
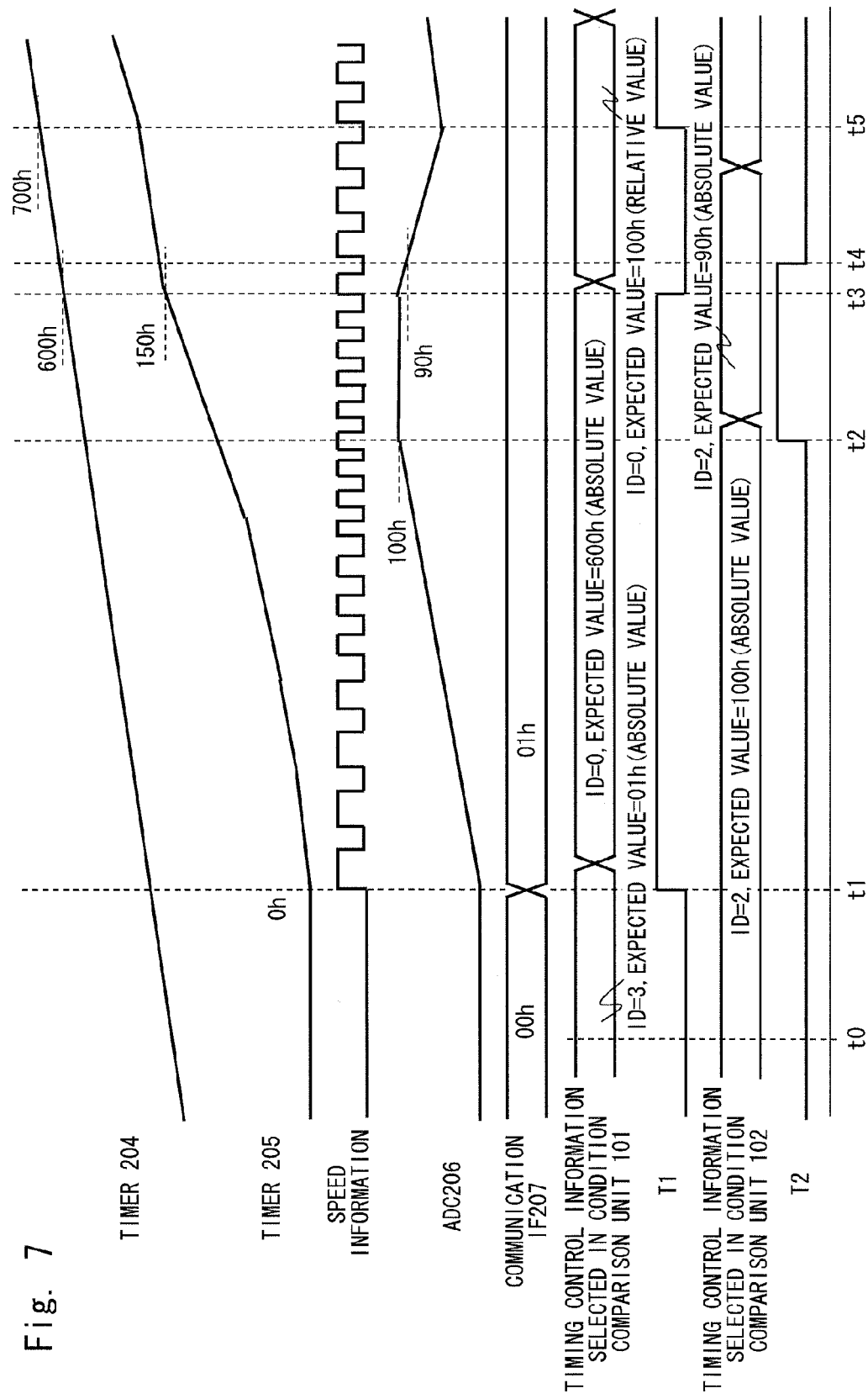
FIG. 7 is a timing diagram showing an operation of the control system to which the present invention is applied.

Next, an operation of the control system shown in FIG. 6 will be described in more detail with reference to FIG. 7. FIG. 7 is a timing diagram showing an operation of the control system shown in FIG. 6.

As shown in FIG. 7, the timer 204 increments the count value at regular intervals. The timer 205 increments the count value based on the speed information (pulse signal) from the control target device 300. Accordingly, when the rotational speed of the control target 303 increases, the increase rate of the count value of the timer 205 increases, and when the rotational speed of the control target 303 decreases, the increase rate of the count value of the timer 205 decreases. The AD converter 206 converts the current value information (analog value) from the control target device 300 into digital data, and outputs the digital data. The communication I/F 207 outputs the monitoring result (state of the control target 303) from the control target device 300 as digital data. For example, the communication I/F 207 outputs data "00h" (in hexadecimal) when the control target 303 is in the suspended state, and outputs data "01h" when the control target 303 is in the normal operation state.

The first embodiment illustrates, by way of example, the case where the identification information of the timer 204 indicates "0"; the identification information of the timer 205 indicates "1"; the identification information of the AD converter 206 indicates "2"; and the identification information of the communication I/F 207 indicates "3".

In the condition comparison unit 101, the control information storage unit ST1 preliminarily stores "3" as the identification information and "01h" as the absolute expected value data. The control information storage unit ST2 preliminarily stores "0" as the identification information and "600h" as the absolute expected value data. The control information storage unit ST3 preliminarily stores "0" as the identification information and "100h" as the relative expected value data. Each of the control information storage units also stores additional information for identifying whether the expected value data is an absolute value or a relative value, but the additional information is not specifically described below.

In the condition comparison unit 102, the control information storage unit ST1 preliminarily stores "2" as the identification information and "100h" as the absolute expected value data. The control information storage unit ST2 preliminarily stores "2" as the identification information and "90h" as the absolute expected value data. Each of the control information storage units also stores additional information for identifying whether the expected value data is an absolute value or a relative value, but the additional information is not specifically described below.

First, in the condition comparison unit 101, the selection circuit 1018 selects and outputs the timing control information stored in the control information storage unit ST1 (time t0). Specifically, the selection circuit 1018 outputs the identification information "3" as the switching signal S2, and also outputs the absolute expected value data "01h". The selection circuit 1011 selects and outputs the data output from the communication I/F 207, based on the switching signal S2 corresponding to the identification information "3".

On the other hand, in the condition comparison unit 102, the selection circuit 1018 selects and outputs the timing control information stored in the control information storage unit ST1. Specifically, the selection circuit 1018 outputs the identification information "2" as the switching signal S2, and also outputs the absolute expected value data "100h". The selection circuit 1011 selects and outputs the data output from the AD converter 206, based on the switching signal S2 corresponding to the identification information "2".

The communication I/F 207 switches the data items "00h" to "01h" according to the change in the state of the control target 303, and outputs the switched data (time t1). At this time, the output data of the communication I/F 207 coincides with the expected value data stored in the control information storage unit ST1, so that the condition comparison unit 101 switches the timing T1 from the L level to the H level (time t1).

The rise of the timing signal T1 accelerates the rotational speed of the control target 303. Accordingly, the increase rate of the count value of the timer 205 increases. Further, since the value of the current flowing through the control target 303 increases, the value of the digital data output from the AD converter 206 also increases (time t1 to time t2).

Upon completion of this timing control (a rise of the timing signal T1), the selection circuit 1018 provided in the condition comparison unit 101 selects and outputs the timing control information stored in the subsequent control information storage unit ST2 (immediately after time t1). Specifically, the selection circuit 1018 outputs the identification information "0" as the switching signal S2, and also outputs the absolute expected value data "600h".

Next, when the digital data output from the AD converter 206 reaches "100h", the output data of the AD converter 206 coincides with the expected value data stored in the control information storage unit ST1, so that the condition comparison unit 102 switches the timing signal T2 from the L level to the H level (time t2). In other words, when the value of the current flowing through the control target 303 is excessively large, the condition comparison unit 102 switches the timing signal T2 from the L level to the H level to limit the rotational speed of the control target 303.

The rise of the timing signal T2 limits the rotational speed of the control target 303 to be equal to or less than a certain speed. As a result, the increase rate of the count value of the timer 205 stops increasing, and the value of the current flowing through the control target also stops increasing (time t2 to time t4).

Upon completion of this timing control (a rise of the timing signal T2), the selection circuit 1018 provided in the condition comparison unit 102 selects and outputs the timing control information stored in the subsequent control information storage unit ST2 (immediately after time t2). Specifically, the selection circuit 1018 outputs the identification information "2" as the switching signal S2, and outputs the absolute expected value data "90h".

On the other hand, when the count value of the timer 204 reaches "600h", the count value of the timer 204 coincides with the data stored in the data holding unit 1015 (time t3), so that the condition comparison unit 101 switches the timing signal T1 from the H level to the L level. In other words, when the control target 303 is accelerated for a certain period of time, the condition comparison unit 101 switches the timing signal T1 from the H level to the L level to reduce the rotational speed of the control target 303. The count value of the timer 204 at this time is "600h".

The fall of the timing signal T1 decelerates the rotational speed of the control target 303. Accordingly, the increase rate of the count value of the timer 205 decreases. Further, since the value of the current flowing through the control target 303 decreases, the value of the digital data output from the AD converter 206 also decreases (time t3 to time t5).

Upon completion of this timing control (a fall of the timing signal T1), the selection circuit 1018 provided in the condition comparison unit 101 selects and outputs the timing control information stored in the subsequent control information storage unit ST3 (immediately after time t3). Specifically, the selection circuit 1018 outputs the identification information "0" as the switching signal S2, and also outputs the relative expected value data "100h".

Then, when the digital data output from the AD converter 206 decreases to "90h", the output data of the AD converter 206 coincides with the expected value data stored in the control information storage unit ST2, so that the condition comparison unit 102 switches the timing signal T2 from the H level to the L level (time t4). In other words, when the value of the current flowing through the control target 303 decreases to an allowable value, the condition comparison unit 102 switches the timing signal T2 from the H level to the L level to release the limitation of the rotational speed of the control target 303.

Further, when the count value of the timer 205 reaches "700h", the count value of the timer 205 coincides with the data stored in the data holding unit 1015, so that the condition comparison unit 101 switches the timing signal T1 from the L level to the H level (time t5). In other words, after a lapse of a predetermined period after the reduction in the rotational speed of the control target 303, the condition comparison unit 101 switches the timing signal T1 from the L level to the H level to increase the rotational speed of the control target 303.

In this manner, the timing control device 100b generates the timing signal based on the data output from each of the data output devices. That is, the timing control device 100b can perform versatile timing control based on the data output from each of the data output devices. Further, in the example of FIG. 6, some of the data output devices output data corresponding to the information (speed information or the like) obtained from the control target 303. This enables the timing control device 100b to perform the timing control of the control target 303 based on various types of information obtained from the control target 303. That is, the timing control device 100b can determine how to control the control target 303 based on various types of information obtained from the control target 303, and can perform versatile timing control in real time.

Furthermore, the timing control device 100b performs the timing control using relative expected value data and absolute expected value data, thereby enabling more versatile timing control.

Second Embodiment

Figure 8:
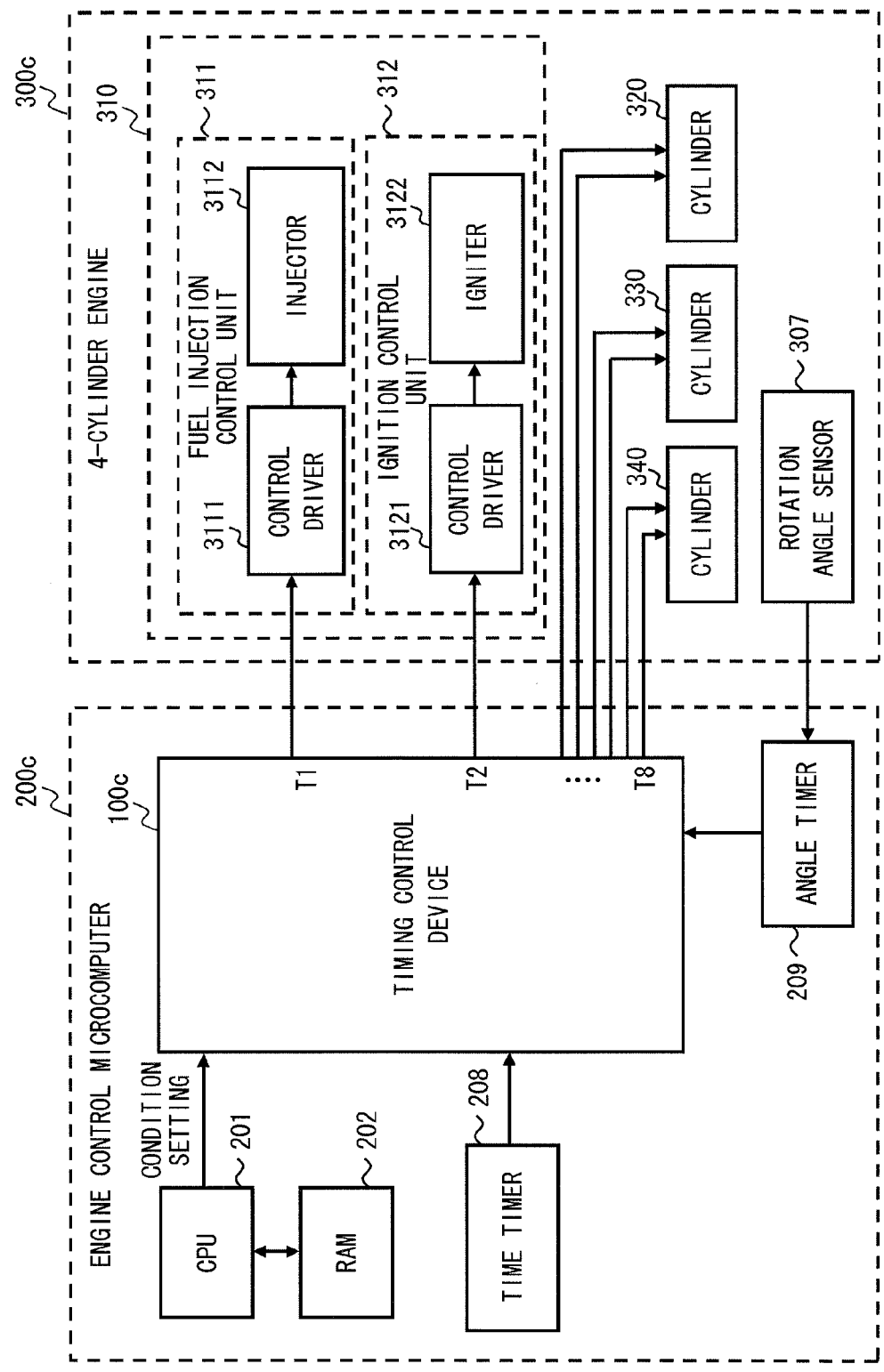
FIG. 8 is a block diagram showing an engine control system to which the present invention is applied.
Figure 9:
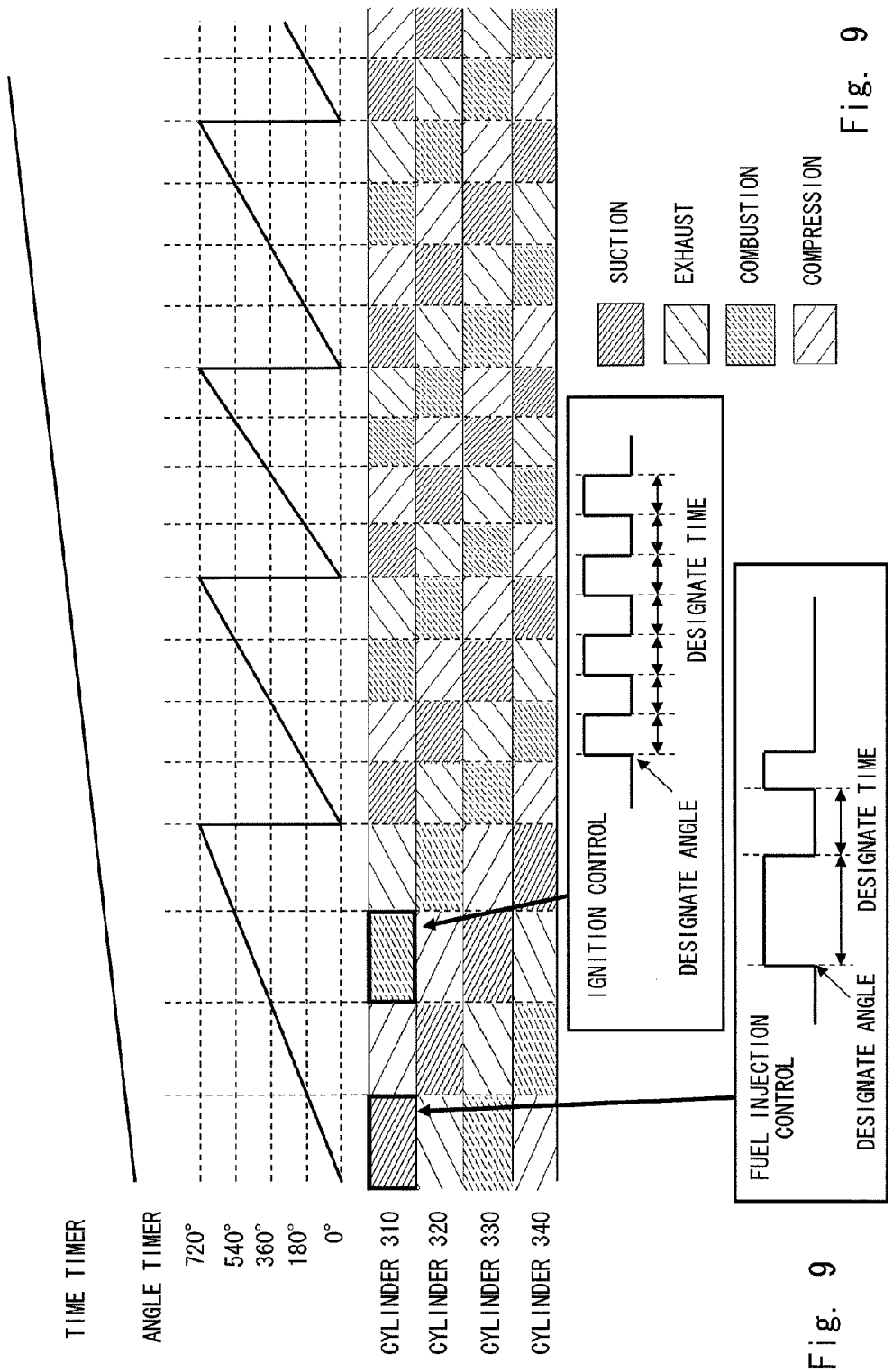
FIG. 9 is a timing diagram showing an operation of the engine control system to which the present invention is applied.

Referring to FIGS. 8 and 9, a description is given of an application example in which the timing control device according to the present invention is applied to a specific product. FIG. 8 is a block diagram showing an engine control system including an engine control microcomputer 200c and a 4-cylinder engine (on-vehicle engine) 300c. The engine control microcomputer 200c incorporates a timing control device 100c according to the present invention. The 4-cylinder engine (on-vehicle engine) 300c is controlled by the engine control microcomputer 200c. FIG. 9 is a timing diagram showing an operation of the engine control system shown in FIG. 8.

As shown in FIG. 8, the engine control microcomputer 200c includes the timing control device 100c, the CPU 201 that processes programs, the RAM 202 that stores programs and the like, a time timer (second timer) 208, and an angle timer (first timer) 209. The 4-cylinder engine 300c includes four cylinders 310, 320, 330, and 340 and a rotation angle sensor 307. The cylinder 310 includes a fuel injection control unit 311 and an ignition control unit 312. The fuel injection control unit 311 includes a control driver 3111 and an injector 3112. The ignition control unit 312 includes a control driver 3121 and an igniter 3122. The circuit configuration of each of the cylinders 320, 330, and 340 is similar to that of the cylinder 310, so the description thereof is omitted.

In the engine control microcomputer 200c, the time timer 208 increments and outputs a count value in synchronization with an internal clock (reference clock) of a certain cycle generated in the engine control microcomputer 200c (see the time timer shown in FIG. 9). The time timer 208 is a so-called free running timer.

The angle timer 209 increments and outputs a count value in synchronization with an angle signal (described later) of a pulse waveform output from the 4-cylinder engine 300c (see the angle timer shown in FIG. 9). In other words, the angle timer 209 increments and outputs the count value every time the rotating shaft of the 4-cylinder engine 300c rotates at a certain angle. The angle timer 209 increments the count value until the rotation angle reaches 720 degrees, assuming that a count value 0 corresponds to a rotation angle 0. When the rotation angle reaches 720 degrees, the angle timer 209 resets the count value to 0. In other words, the angle timer 209 increments the count value until the rotating shaft of the 4-cylinder engine 300c turns twice, assuming that the count value 0 corresponds to the rotation angle 0. When the rotating shaft of the 4-cylinder engine 300c turns twice, the angle timer 209 resets the count value to 0.

The timing control device 100c includes eight condition comparison units 101 to 108, and outputs eight timing signals T1 to T8 having pulse waveforms based on the data output from the time timer 208 and the angle timer 209. The timing signals T1 and T2 are supplied to the cylinder 310 provided in the 4-cylinder engine 300c. Similarly, the timing signals T3 and T4 are supplied to the cylinder 320; the timing signals T5 and T6 are supplied to the cylinder 330; and the timing signals T7 and T8 are supplied to the cylinder 340.

The 4-cylinder engine 300aX changes an angle of a crank shaft to turn the rotating shaft by piston motions of the four cylinders. The cylinders repeat operations of four processes including "suction", "compression", "combustion", and "exhaust", to thereby perform the piston motion (see the cylinders shown in FIG. 9). The 4-cylinder engine 300aX performs these four processes for one cycle, thereby causing the rotating shaft to turn twice.

In the cylinder 310, the fuel injection control unit 311 is a unit that controls injection of fuel into the cylinders. The control driver 3111 drives the injector 3112 based on the timing signal T1 from the engine control microcomputer 200c. The injector 3112 is driven by the control driver 3111, thereby allowing the fuel to be injected into the cylinders. The injection of the fuel into the cylinders is performed in the process of "suction" as shown in FIG. 9, and the timing thereof is controlled based on the output data from each of the time timer 208 and the angle timer 209.

In the cylinder 310, the ignition control unit 312 is a unit that ignites the fuel injected into the cylinders. The control driver 3121 drives the igniter 3122 based on the timing signal T2 from the engine control microcomputer 200c. The igniter 3122 is driven by the control driver 3121, thereby igniting the fuel injected into the cylinders. The ignition of the fuel injected into the cylinders is performed in the process of "combustion" as shown in FIG. 9, and the timing thereof is controlled based on the output data from each of the time timer 208 and the angle timer 209.

In the four cylinders, the operations of different processes are carried out in the same period as shown in FIG. 9. Accordingly, each of "fuel injection" and "fuel ignition" of the four cylinders are controlled at different timings.

The rotation angle sensor 307 detects an angular velocity of a rotational motion of the 4-cylinder engine 300c, and outputs an angle signal having a pulse shape every time the rotating shaft changes at a certain angle. This angle signal is input to the angle timer 209 provided in the engine control microcomputer 200c. The angle timer 209 increments and outputs the count value in synchronization with the angle signal. This allows the timing control device 100c to detect control timings for "fuel injection" and "fuel ignition" of the four cylinders based on the data output from the angle timer 209.

In this manner, the timing control device 100c shown in FIG. 8 controls different timings for "fuel injection" and "fuel ignition" for each cylinder based on the data (count value) output from each of the time timer 208 and the angle timer 209. That is, the timing control device 100c shown in FIG. 8 can perform versatile timing control based on the data output from each of the data output devices.

(Configuration and Basic Operation Of Timing Control Device 100c)

Figure 10:
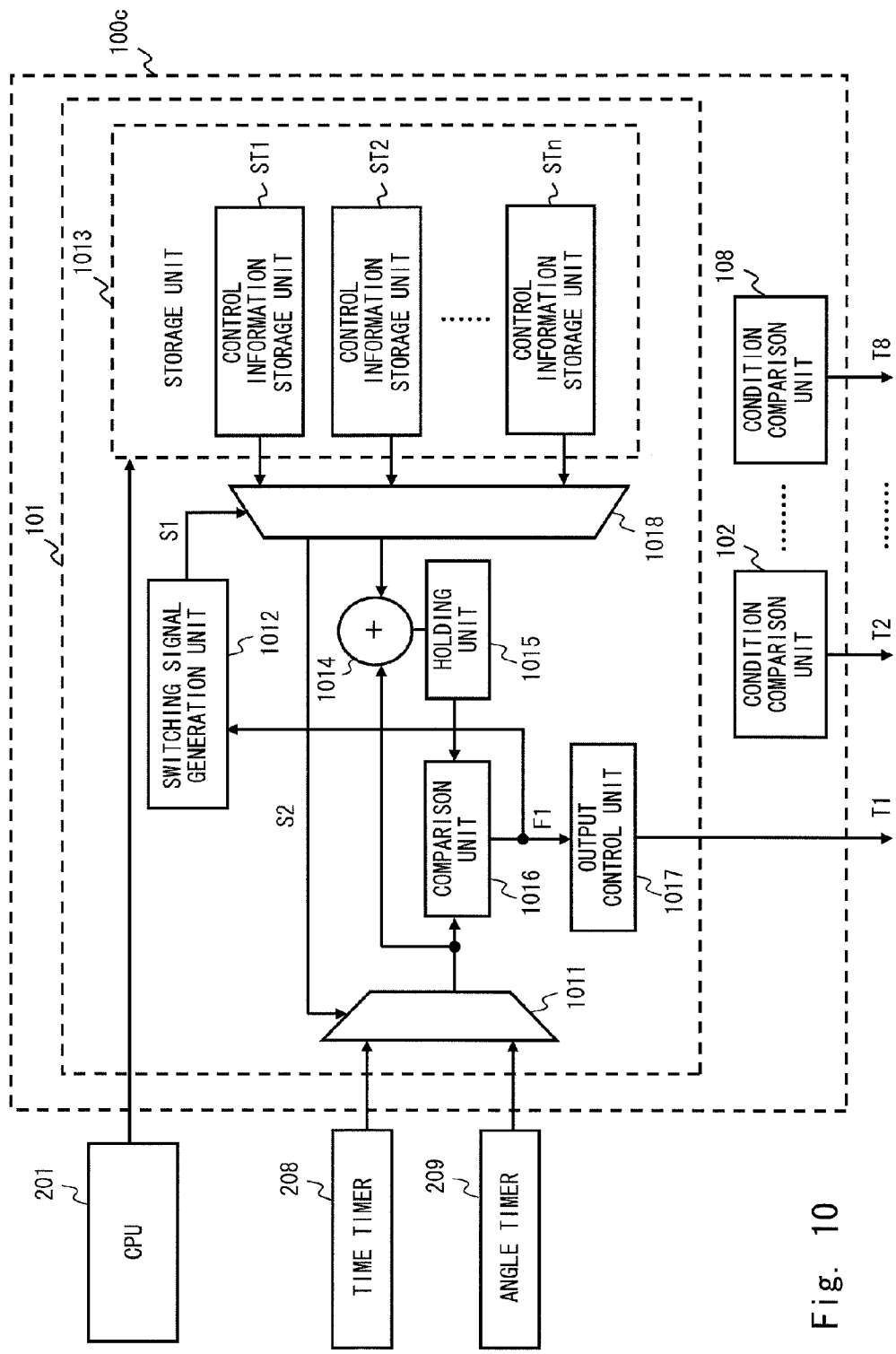
FIG. 10 is a timing diagram showing a timing control device according to a second embodiment of the present invention.
Figure 11:
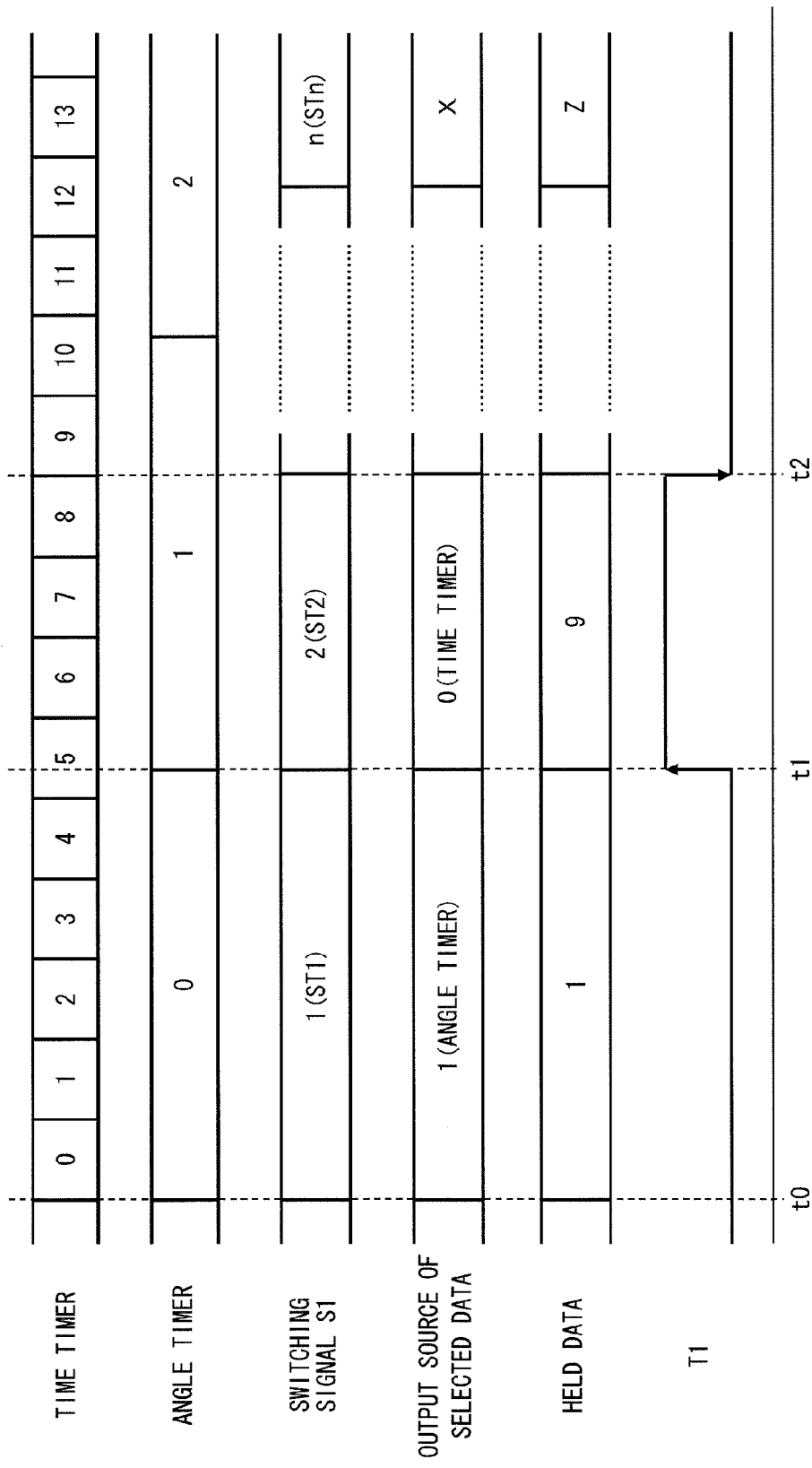
FIG. 11 is a timing diagram showing an operation of the timing control device according to the second embodiment of the present invention.

Next, the configuration and basic operation of the timing control device 100c will be described with reference to FIGS. 10 and 11. FIG. 10 is a block diagram showing the timing control device 100c according to the second embodiment. FIG. 11 is a timing diagram showing an operation of the timing control device 100c according to the second embodiment. FIG. 11 shows only the waveform of the timing signal T1 among the timing signals T1 to T8.

As shown in FIG. 10, the timing control device 100c includes the condition comparison units (timing signal generation units) 101 to 108. The circuit configuration and operation of the condition comparison units 101 to 108 are similar to those of the condition comparison units provided in the timing control device 100 shown in FIG. 1, so the description thereof is omitted. The condition comparison units 101 to 108 respectively output the timing signals T1 to T8 having pulse waveforms based on the data output from each of the time timer 208 and the angle timer 209.

In the example of FIG. 11, the time timer 208 resets the count value to "0" (time t0), and then increments and outputs the count value at its own data update timing. The angle timer 209 resets the count value to "0" (time t0), and then increments and outputs the count value at the data update timing having a cycle different from that of the time timer 208.

In the example of FIG. 11, the control information storage unit ST1 preliminarily stores "1" as the identification information and "1" as the expected value data. The control information storage unit ST2 preliminarily stores "0" as the identification information and "4" as the relative expected value data. The second embodiment illustrates, by way of example, the case where the identification information of the time timer 208 indicates "0" and the identification information of the angle timer 209 indicates "1".

First, the selection circuit 1018 selects and outputs the timing control information stored in the control information storage unit ST1 based on the switching signal S1 (time t0). Specifically, the selection circuit 1018 outputs the identification information "1" as the switching signal S2, and also outputs the expected value data "1". The selection circuit 1011 selects and outputs the data output from the angle timer 209, based on the switching signal S2 corresponding to the identification information "1".

Immediately after resetting of the angle timer 209, the arithmetic unit 1014 outputs the result "1" of the addition between the data "0" output from the selection circuit 1011 and the expected value data "1". Then, the data holding unit 1015 holds the operation result "1" of the arithmetic unit 1014. Specifically, the data holding unit 1015 holds the result "1" of the addition between the output data "0" of the selection circuit 1011 immediately after resetting of the angle timer 209 and the expected value data "1".

When the output data of the angle timer 209 output from the selection circuit 1011 is "1", the output data coincides with the data held in the data holding unit 1015, so that the comparison unit 1016 outputs the coincidence signal F1 (time t1). Upon receiving the coincidence signal F1 from the comparison unit 1016, the output control unit 1017 inverts the timing signal T1 from the L level to the H level in synchronization with the coincidence signal F1 (time t1).

Upon receiving the coincidence signal F1 from the comparison unit 1016, the switching signal generation unit 1012 outputs the switching signal S1 so that the selection circuit 1018 selects the timing control information stored in the subsequent control information storage unit ST2 (time t1). Accordingly, the selection circuit 1018 selects and outputs the timing control information stored in the control information storage unit ST2. Specifically, the selection circuit 1018 outputs the identification information "0" as the switching signal S2, and also outputs the relative expected value data "4". The selection circuit 1011 selects and outputs the data output from the time timer 208 based on the switching signal S2 corresponding to the identification information "0".

When the timing control information selected by the selection circuit 1018 is switched, the data holding unit 1015 holds the result "9" of the addition between the initial output data "5" of the selection circuit 1011 immediately after the switching and the expected value data "4".

When the output data of the time timer 208 output from the selection circuit 1011 is "9", the output data coincides with the data held in the data holding unit 105, so that the comparison unit 1016 outputs the coincidence signal F1 (time t2). Upon receiving the coincidence signal F1 from the comparison unit 1016, the output control unit 1017 inverts the timing signal T1 from the H level to the L level in synchronization with the coincidence signal F1 (time t2).

Upon receiving the coincidence signal F1 from the comparison unit 1016, the switching signal generation unit 1012 outputs the switching signal S1 so that the selection circuit 1018 selects the timing control information stored in the subsequent control information storage unit ST3 (time t1). Accordingly, the selection circuit 1018 selects and outputs the timing control information stored in the control information storage unit ST3.

Thus, the timing control device 100c causes the timing signal T1 to rise based on the output data of the angle timer 209 (time t1), and causes the timing signal T1 to fall based on the output data of the time timer 208 (time t2).

In this manner, the timing control device 100c according to the second embodiment can generate the timing signals T1 to T8 based on the data output from each of the data output devices. That is, the timing control device 100c according to the second embodiment can perform versatile timing control based on the data output from each of the data output devices.

Further, the timing control device 100c according to the second embodiment relatively designates a timing of a change in the logical value of each of the timing signals T1 to T8 with reference to the preceding timing of the change in the logical value of each of the timing signals T1 to T8. Accordingly, the timing control device 100c according to the second embodiment can reliably perform the timing control even when each of the data output devices outputs data at its own data update timing.

Furthermore, in the timing control device 100c according to the second embodiment, the condition comparison units 101 to 108 preliminarily store n pieces of timing control information in the storage unit 1013, and perform the timing control using these pieces of information in order. For this reason, before completion of at least n timing controls, an interrupt for requesting timing control information is not generated from each of the condition comparison units 101 to 108 to the CPU. Thus, the timing control device 100 according to the first embodiment need not involve the CPU or the like in the timing control, which makes it possible to increase the responsiveness of the timing control. Further, the occurrence frequency of the interrupt to the CPU is reduced, thereby reducing the load on the CPU and peripheral bus. Furthermore, the timing control device 100 according to the second embodiment can continuously perform the timing control even when the CPU shifts to a sleep mode (a mode for causing the CPU to stop execution of instructions) to reduce power consumption.

Third Embodiment

Figure 12:
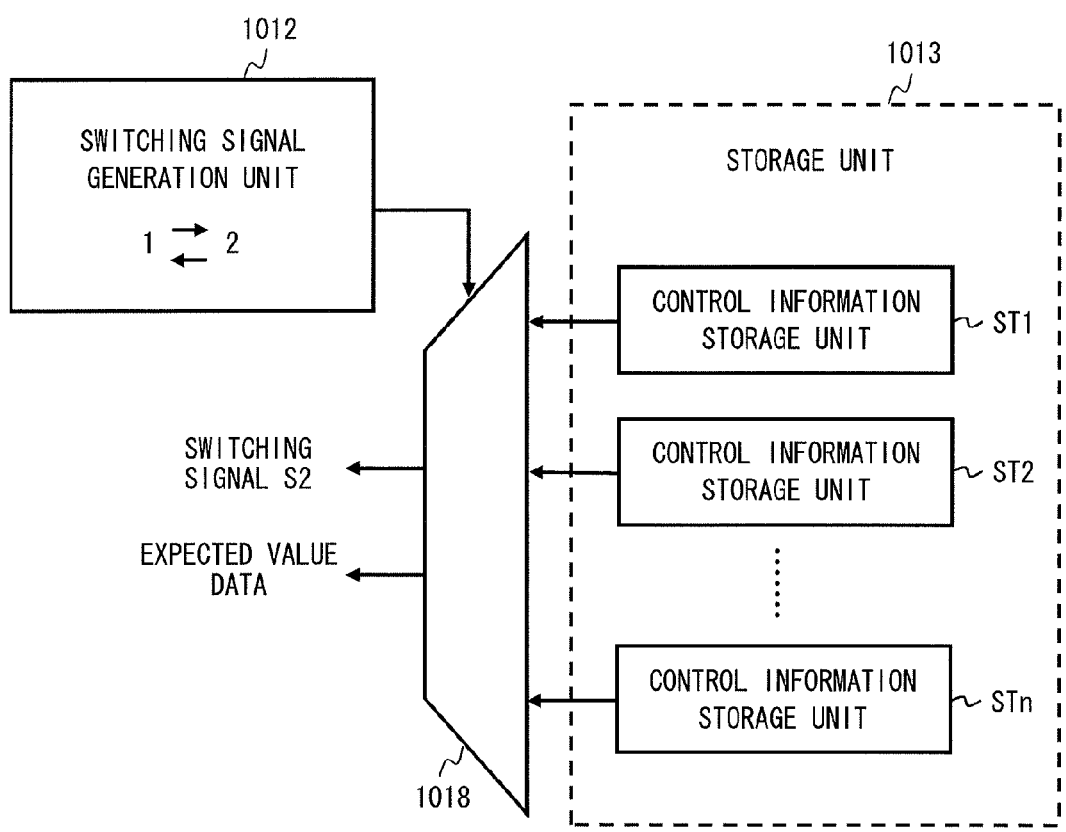
FIG. 12 is a block diagram showing a part of a timing control device according to a third embodiment of the present invention.
Figure 13:
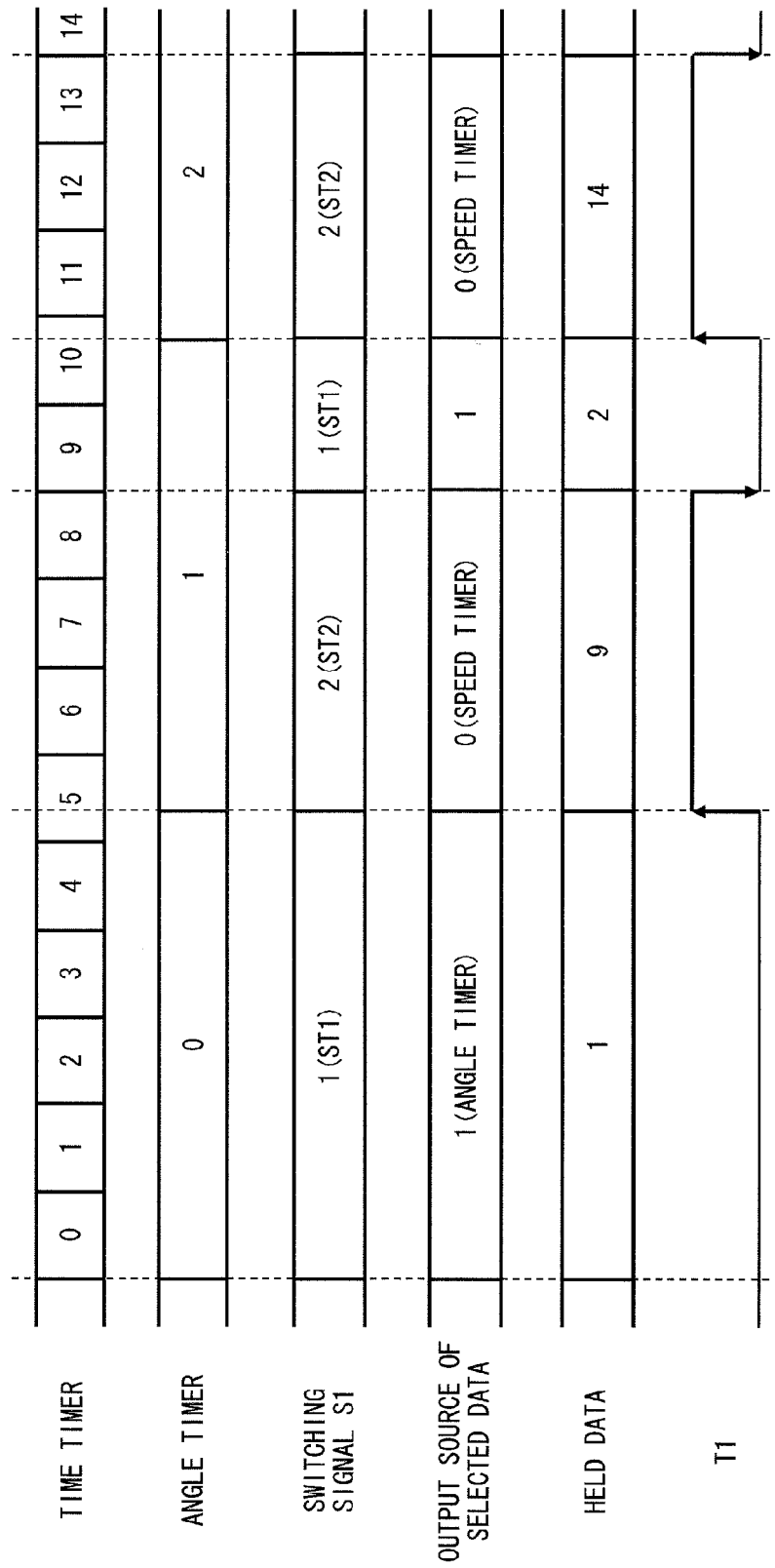
FIG. 13 is a timing diagram showing an operation of the timing control device according to the third embodiment of the present invention.

FIG. 12 is a diagram illustrating another operation of the timing control device 100c shown in FIG. 10. FIG. 12 shows only the switching signal generation unit 1012, the storage unit 1013, and the selection circuit 1018 which are provided in the condition comparison unit 101. FIG. 13 is a timing diagram showing an operation of the timing control device 100c according to a third embodiment of the present invention. FIG. 13 shows only the waveform of the timing signal T1 among the timing signals T1 to T8.

In the example shown in FIGS. 12 and 13, the switching signal generation unit 1012 outputs the switching signal S1 so that the selection circuit 1018 alternately selects and outputs the timing control information stored in the control information storage units ST1 and ST2, every time the coincidence signal F1 is output from the comparison unit 1016. Accordingly, the selection circuit 1018 alternately selects and outputs the timing control information stored in the control information storage units ST1 and ST2 every time the coincidence signal F1 is output from the comparison unit 1016. In this case, it is sufficient for the storage unit 1013 to include two control information storage units ST1 and ST2.

In the example of FIG. 13, the control information storage unit ST1 preliminarily stores "1" as the identification information and "1" as the relative expected value data. The control information storage unit ST2 preliminarily stores "0" as the identification information and "4" as the relative expected value data. The identification information of the time timer 208 indicates "0" and the identification information of the angle timer 209 indicates "1".

As shown in FIG. 13, the timing control device 100c causes the timing signal T1 to rise based on the output data of the angle timer 209 (time t1 and time t3), and causes the timing signal T1 to fall based on the output data of the time timer 208 (time t2 and time t4).

In this manner, in the timing control device 100c according to the third embodiment, the selection circuit 1018 alternately selects and outputs the timing control information stored in the control information storage units ST1 and ST2, every time the coincidence signal F1 is output from the comparison unit 1016. This allows the timing control device 100c according to the third embodiment to generate the timing signals T1 to T8 having pulse cycles depending on the data update cycle of each data output device. In this example, the timing signals T1 to T8 having pulse cycles depending on the data update cycle of the angle timer 209 (the number of revolution of the 4-cylinder engine 300c). In other words, even when the number of revolutions of the 4-cylinder engine 300c varies, the pulse cycle of each of the timing signals T1 to T8 also varies accordingly, which enables generation of the timing signals T1 to T8 having pulse cycles depending on the state of the control target (4-cylinder engine 300c).

Though the third embodiment illustrates, by way of example, the case where the selection circuit 1018 alternately selects and outputs the timing control information stored in the control information storage units ST1 and ST2, the configuration of the selection circuit 1018 is not limited thereto. The configuration may be appropriately changed into a configuration in which the selection circuit 1018 repeatedly selects and outputs the timing information stored in the control information storage units ST1 to STn.

Fourth Embodiment

Figure 14:
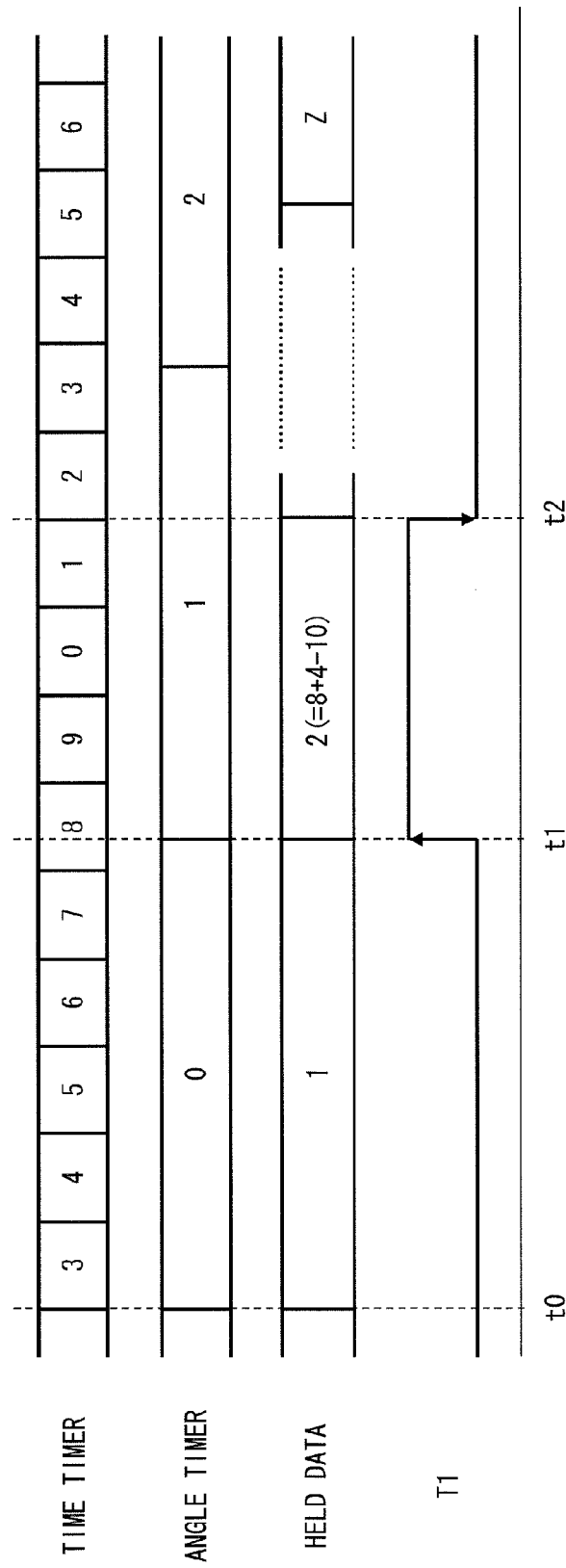
FIG. 14 is a timing diagram showing an operation of a timing control device according to a fourth embodiment of the present invention.

FIG. 14 is a timing diagram illustrating another operation of the timing control device 100c shown in FIG. 10. FIG. 14 shows only the waveform of the timing signal T1 among the timing signals T1 to T8.

In the example of FIG. 14, the control information storage unit ST1 preliminarily stores "1" as the identification information and "1" as the relative expected value data. The control information storage unit ST2 preliminarily stores "0" as the identification information and "4" as the relative expected value data. The identification information of the time timer 208 indicates "0", and the identification information of the angle timer 209 indicates "1". The time timer 208 increments the count value to "9" and then resets the count value to "0".

First, the selection circuit 1018 selects and outputs the timing control information stored in the control information storage unit ST1 based on the switching signal S1. Specifically, the selection circuit 1018 outputs the identification information "1" as the switching signal S2, and also outputs the expected value data "1". The selection circuit 1011 selects and outputs the data output from the angle timer 209 based on the switching signal S2 corresponding to the identification information "1".

Immediately after resetting of the angle timer 209, the arithmetic unit 1014 outputs the result "1" of the addition between the data "0" output from the selection circuit 1011 and the expected value data "1". Then, the data holding unit 1015 holds the operation result "1" of the arithmetic unit 1014. That is, the data holding unit 1015 holds the result "1" of the addition between the output data "0" of the selection circuit 1011 immediately after resetting of the angle timer 209 and the expected value data "1".

When the output data of the angle timer 209 output from the selection circuit 1011 is "1", the output data coincides with the data held in the data holding unit 1015, so that the comparison unit 1016 outputs the coincidence signal F1 (time t1). Upon receiving the coincide signal F1 from the comparison unit 1016, the output control unit 1017 inverts the timing signal T1 from the L level to the H level in synchronization with the coincidence signal F1 (time t1).

Upon receiving the coincidence signal F1 from the comparison unit 1016, the switching signal generation unit 1012 outputs the switching signal S1 so that the selection circuit 1018 selects the timing control information stored in the subsequent control information storage unit ST2 (time t1). Accordingly, the selection circuit 1018 selects and outputs the timing control information stored in the control information storage unit ST2. Specifically, the selection circuit 1018 outputs the identification information "0" as the switching signal S2, and also outputs the relative expected value data "4". The selection circuit 1011 selects and outputs the data output from the time timer 208 based on the switching signal S2 corresponding to the identification information "0".

Immediately after switching of the timing control information selected by the selection circuit 1018, the arithmetic unit 1014 outputs the result "12" of the addition between the data "8" output from the selection circuit 1011 and the expected value data "4". Here, the operation result "12" of the arithmetic unit 1014 exceeds the maximum value "9" of the output data (count value) of the time timer 208. In this case, the data holding unit 1015 holds the result "2" of the subtraction of "10" (maximum value "9"+1 of the count value of the time time 208) from the operation result "12" of the arithmetic unit 1014.

When the output data of the time timer 208 output from the selection circuit 1011 is "2", the output data coincides with the data held in the data holding unit 1015, so that the comparison unit 1016 outputs the coincidence signal F1 (time t2). Upon receiving the coincidence signal F1 from the comparison unit 1016, the output control unit 1017 inverts the timing signal T1 from the H level to the L level in synchronization with the coincidence signal F1 (time t2).

Thus, the timing control device 100c causes the timing signal T1 to rise based on the output data of the angle timer 209 (time t1), and causes the timing signal T1 to fall based on the output data of the time timer 208 (time t2).

In this manner, the timing control device 100c according to a fourth embodiment of the present invention provides the same advantageous effects as those of the other embodiments, even when a timer (counter) that outputs data (count value) having periodicity, for example, is used as the data output device.

Fifth Embodiment

A fifth embodiment of the present invention illustrates an outline of a processor system to which the present invention is applied. Though the present invention is applied to a processor system as described below, the processor system described below by way of example only. The present invention is also applicable to other processor systems.

Figure 15:
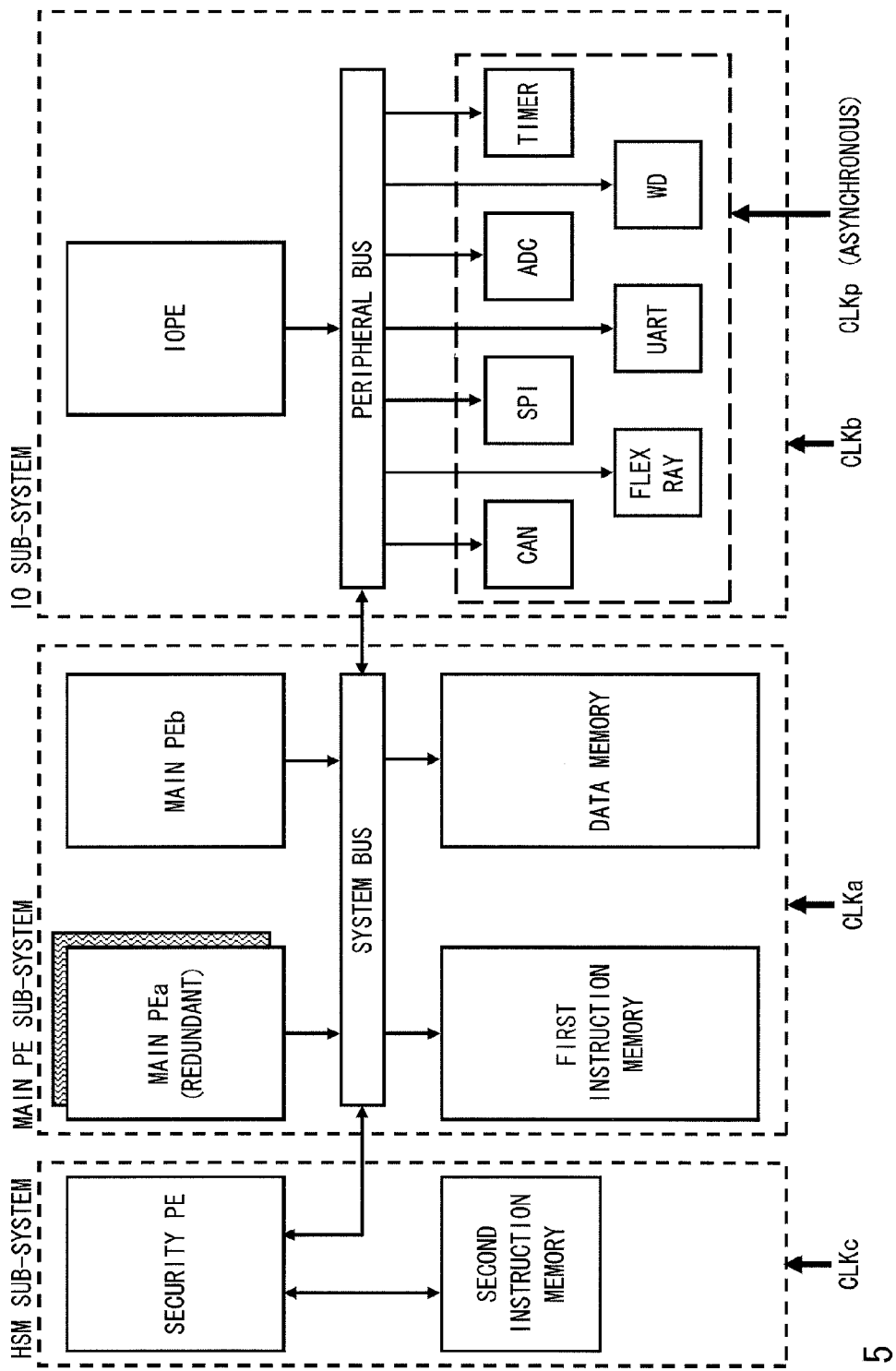
FIG. 15 is a schematic diagram of a processor system to which the present invention is applied.
Figure 16:
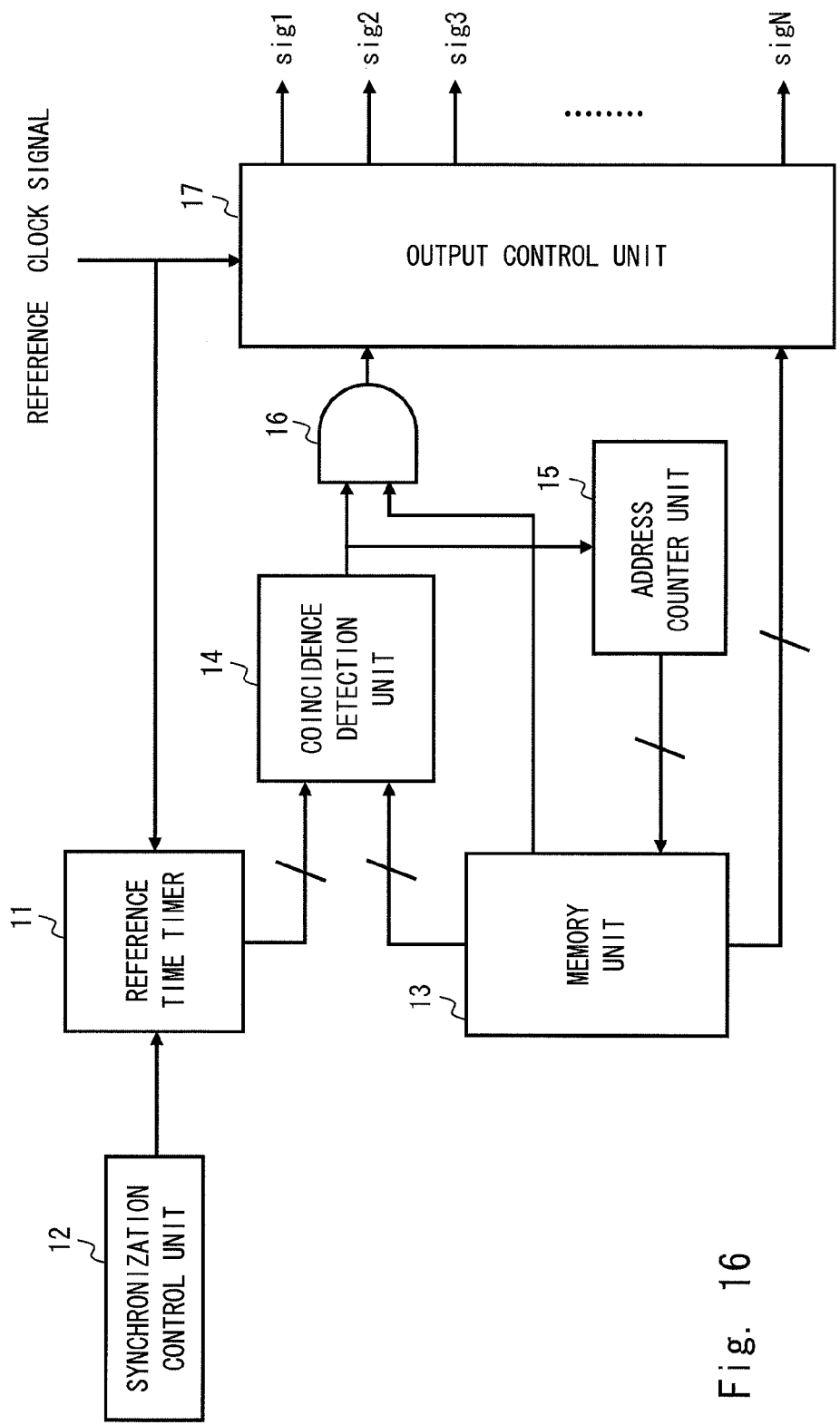
FIG. 16 is a block diagram showing a timing signal generator of a related art.
Figure 17:
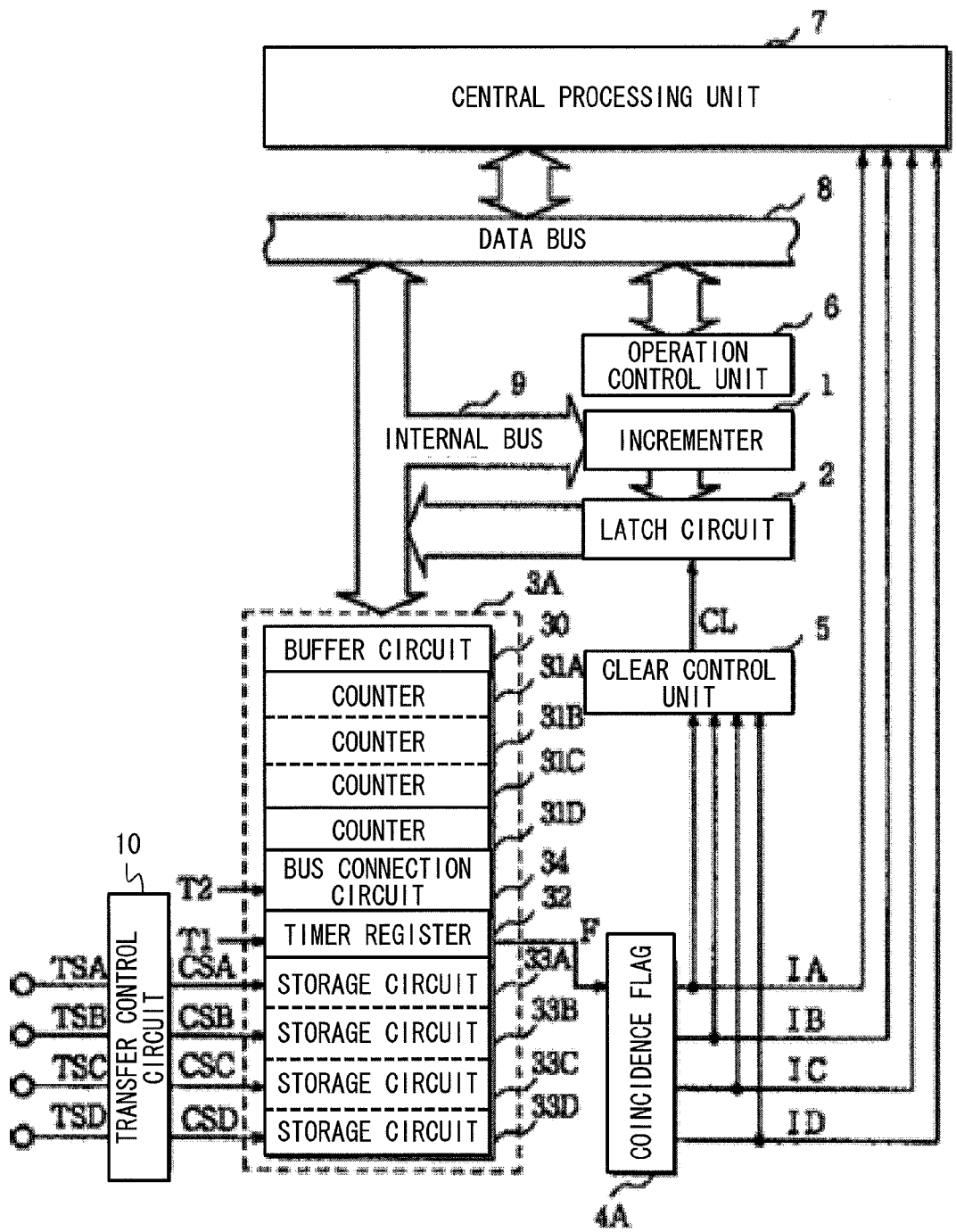
FIG. 17 is a block diagram showing a timer/counter circuit of a related art.

FIG. 15 shows a schematic diagram of a processor system to which the present invention is applied. As shown in FIG. 15, the processor system according to the present invention uses a plurality of PEs (Processing Elements), thereby achieving an improvement in throughput. Further, the processor system according to the present invention employs classification of functional blocks using the PEs, as well as classification of functions using three sub-systems. As shown in FIG. 15, the processor system according to the present invention includes a main PE (Processing Element) sub-system, an IO (Input Output) sub-system, and an HSM (Hardware Security Module) sub-system.

The main PE sub-system performs specific processes required for the processor system in accordance with a program preliminarily stored therein or a program loaded from the outside. The IO sub-system performs various processes for allowing peripheral devices used by the main PE sub-system or the HSM sub-system to operate. The HSM sub-system performs a security checking process for each process executed in the processor system. In the processor system according to the present invention, the sub-systems are supplied with clock signals CLKa, CLKb, CLKc, and CLKp. In the example of FIG. 15, the main PE sub-system is supplied with the clock signal CLKa; the IO sub-system is supplied with the clock signals CLKb and CLKp; and the HSM sub-system is supplied with the clock signal CLKc. These clock signals CLKa, CLKb, and CLKc may have the same frequency or different frequencies depending on the specifications of the overall system configuration. The clock signal CLKp is a clock signal that is supplied to the peripheral devices and is asynchronous with the clock signal CLKb supplied to the IO sub-system.

Subsequently, each of the sub-systems will be described in more detail. The main PE sub-system includes a main PEa, a main PEb, a first instruction memory, a data memory, and a system bus. In the main PE sub-system, the main PEa, the main PEb, the instruction memory, and the data memory are interconnected via the system bus. The first instruction memory stores programs. The data memory temporarily stores programs loaded from the outside and data processed in the processor system. The main PEa and the main PEb execute the programs using the instruction memory, the data memory, and the like. The main PEa is configured to be able to execute a redundant operation. The term "redundant operation" refers to an operation as a processor element in a software manner, or an operation for performing a highly reliable operation using a multiplexed configuration or a configuration incorporating an inspection circuit or the like in a hardware manner. Examples of the redundant operation include a lock step operation that compares the output results of the multiplexed circuit for each clock to determine whether the output results are identical or not.

The IO sub-system includes a peripheral bus, an IOPE, and peripheral devices. The IOPE performs processes required upon use of the peripheral devices. The IOPE may operate based on the programs stored in the first instruction memory of the main PE system, or may operate based on the programs stored in other storage areas. The peripheral bus connects the IOPE with each of the peripheral devices.

FIG. 15 illustrates a CAN unit, a FLEXRAY unit, an SPI unit, a UART unit, an ADC unit, a WD unit, and a timer as the peripheral devices. The CAN unit performs communication based on CAN (Controller Area Network) which is one of the on-vehicle communication standards for automobiles. The FLEXRAY unit performs communication based on the Flex Ray standard which is one of the on-vehicle communication standards for automobiles. The SPI unit performs communication based on the SPI (System Packet Interface) standard which is a three-wire or four-wire serial communication. The UART (Universal Asynchronous Receiver Transmitter) unit converts a serial signal of an asynchronous system into a parallel signal, and also performs the conversion reversely. The ADC (Analog to Digital Converter) unit converts an analog signal supplied from a sensor or the like into a digital signal. The WD (Watch Dog) unit provides a watchdog timer function for detecting a lapse of a predetermined period. The timer measures time and generates waveforms, for example. The example of FIG. 15 shows the above-mentioned units as the peripheral devices. Alternatively, units having other functions may be included, or only a part of the units may be included.

The HSM sub-system includes a security PE and a second instruction memory. The security PE is connected to the system bus. The security PE determines the validity of the data executed in the main PE sub-system, or the validity of the data obtained by executing programs. The second instruction memory stores programs. The second instruction memory is a memory which is accessible exclusively from the security PE. The second instruction memory and the first instruction memory may be provided in one storage area. In this case, however, it is necessary to perform access control to allow only the security PE to access the second instruction memory.

As described above, the processor system to which the present invention is applied achieves a high resistance to malfunction, such as an unpredictable failure or an unpredictable modification of program, while improving the throughput by using a plurality of PEs. The processor system described above is an example of the processor system to which the present invention is applied. For example, the layout of each of the instruction memory and the data memory and the number of instruction memories and data memories in the system may be changed depending on the architecture of the system. Further, the memories may be connected to the processor elements via a plurality of buses, or may be connected to the processor elements without involving any bus. Thus, various configurations may be adopted depending on the design of the architecture.

The processor system is described above to explain the overall configuration of the processor system to which the present invention is applied. The timing control device according to the present invention is provided as one of the peripheral devices of the IO sub-system (not shown), for example. This timing control device performs the timing control of the control target based on the data output from each of the data output devices such as the timer and the ADC unit which are peripheral devices.

In the timing control device according to the present invention, each of the condition comparison units preliminarily stores n pieces of timing control information in the storage unit, and performs the timing control using these pieces of information in order. For this reason, before completion of at least n timing controls, an interrupt for requesting timing control information is not generated from each of the condition comparison units to the IOPE (or other PEs). Thus, in the timing control device according to the present invention, there is no need to involve the IOPE in the timing control, which makes it possible to improve the responsiveness of the timing control. Further, the occurrence frequency of the interrupt to the IOPE is reduced, thereby reducing the load on the IOPE and peripheral bus.

Furthermore, the timing control device according to the present invention can continuously perform the timing control even when a plurality of PEs shifts to the sleep mode to reduce power consumption. Thus, the timing control device according to the present invention can continuously perform the timing control without causing the plurality of PEs to operate, which leads to an effective reduction in power consumption.

Note that the present invention is not limited to the first to five embodiments described above, but may be appropriately changed without departing from the scope of the invention. The second to fifth embodiments illustrate, by way of example, the case where the timing control device performs the timing control using relative expected value data, but the configuration of the timing control device is not limited thereto. The configuration of the timing control device may be appropriately changed into a configuration in which the timing control is performed using absolute expected value data and relative expected value data.

The second to fifth embodiments described above illustrate, by way of example, the case where the timing control device is mounted on the engine control microcomputer, but the configuration of the timing control device is not limited thereto. The timing control device may be mounted on various devices requiring timing control. The second to fifth embodiments described above illustrate, by way of example, the case where the timing control device generates the timing signals T1 to T8, but the configuration of the timing control device is not limited thereto. The configuration of the timing control device may be appropriately changed into a configuration in which an arbitrary number of timing signals are generated depending on the specifications of the control target. In this case, the timing control device includes a number of condition comparison units corresponding to the number of timing signals generated.

Incidentally, in recent years, along with the diversification of applications, there is a demand for controlling a plurality of control targets, such as an engine and a motor, using one microcomputer. The existing microcomputers typically include timers exclusively used for the respective control targets. That is, the existing microcomputers typically include a number of timers corresponding to the number of control targets. Therefore, the existing microcomputers have a problem of an increase in circuit size.

Figure 30:
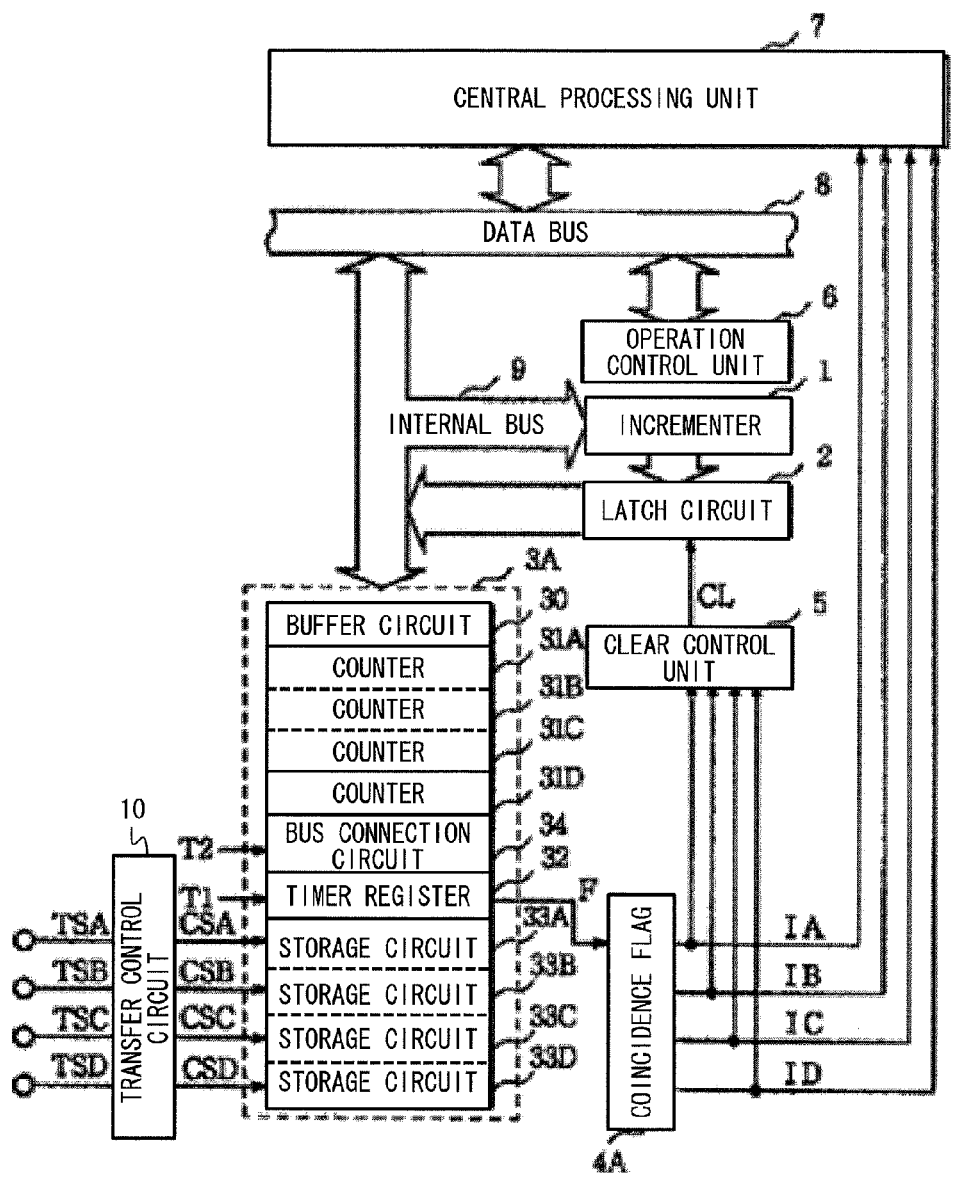
FIG. 30 is a block diagram showing a timer/counter circuit of a related art.

Japanese Unexamined Patent Application Publication No. 09-171418 discloses a countermeasure against this problem. FIG. 30 is a block diagram showing a timer/counter circuit disclosed in Japanese Unexamined Patent Application Publication No. 09-171418. The timer/counter circuit shown in FIG. 30 includes an incrementer 1, a latch circuit 2, a register block 3A, a coincidence flag 4A, a clear control unit 5, an operation control unit 6, a central processing unit 7, a data bus 8, an internal bus 9, and a transfer control circuit 10. The register block 3A includes a buffer circuit 30, counters 31A to 31D, a timer register 32 having a coincidence detection function, and coincident data storage circuits 33A to 33D having no coincidence detection function.

The coincident data storage circuits 33A to 33D store timer values respectively corresponding to the counters 31A to 31D. The transfer control circuit 10 transfers the timer value stored in any of the coincident data storage circuits 33A to 33D to the timer register 32. The timer register 32 detects a coincidence between the timer value transferred from any of the coincident data storage circuits 33A to 33D and the count value of the corresponding counter, and outputs a coincidence signal F. The coincidence flag 4A generates a corresponding interrupt signal (any of IA to ID) according to the coincidence signal F from the timer register 32.

In this manner, the timer/counter circuit shown in FIG. 30 includes a plurality of coincident data storage circuits which are formed of RAM cells having no coincidence detection function and which have a small circuit size, instead of including a plurality of timer registers which are formed of CAM cells having the coincidence detection function and which have a large circuit size. This results in suppression of an increase in circuit size.

Additionally, Japanese Unexamined Patent Application Publication No. 2002-303201 discloses a vehicle control device including a microcomputer. This microcomputer counts values of control counters for use in various controls at predetermined time intervals in a base process. Further, the microcomputer determines an execution timing for each of the various controls based on the counter values, and carries out the corresponding process when the timing is reached. This microcomputer counts up a reference counter in a fixed-time interrupt process, and calculates a delay of the base process by referring to the reference counter at each count-up timing of each control counter. When the delay reaches an operation width for one counting operation by the control counter, the value of the control counter is corrected.

Furthermore, Japanese Unexamined Patent Application Publication No. 2008-169709 discloses an on-vehicle engine control device that generates a pulse width modulation signal to improve the accuracy of authentication/collation of a start key with an inexpensive configuration. In a microprocessor provided in the on-vehicle engine control device, two timer circuit units constitute first and second drive control timers TIM1 and TIM2, respectively, and generate control output signals for controlling ignition/fuel injection which operate in synchronization with a crank angle sensor. The control output signals are distributed to cylinders by a plurality of cylinder selecting gate circuits and sequentially drive respective engine driving devices.

Until completion of the authentication/collation, the pulse width modulation signal generated in the first drive control timer TIM1 is transmitted to an immobilizer through an authentication gate circuit. The immobilizer transmits a radio signal having a frequency and an amplitude corresponding to the cycle and duty of the received pulse width modulation signal to a transponder, and reads a personal identification number from the start key.

In the timer/counter circuit (timing control device) disclosed in Japanese Unexamined Patent Application Publication No. 09-171418, however, the coincidence flag 4A generates the interrupt signal IA when the count value of the counter 31A coincides with the timer value stored in the coincident data storage circuit 33A. The coincidence flag 4A generates the interrupt signal IB when the count value of the counter 31B coincides with the timer value stored in the coincident data memory circuit 33B. The coincidence flag 4A generates the interrupt signal IC when the count value of the counter 31C coincides with the timer value stored in the coincident data storage circuit 33C. The coincidence flag 4A generates the interrupt signal ID when the count value of the counter 31D coincides with the timer value stored in the coincident data storage circuit 33D.

In this manner, the coincidence flag 4A generates a corresponding interrupt signal (any one of IA to ID) when the count value of a single counter circuit coincides with the corresponding timer value. That is, the coincidence flag 4A is configured to generate a single interrupt signal based only on the count value of a single counter circuit, but is not configured to generate a single interrupt signal based on count values of a plurality of counter circuits. Therefore, the timer/counter circuit of the related art has a problem that it is impossible to perform versatile timing control even in the case of performing timing control using such an interrupt signal.

Particularly in recent years, along with the diversification of customer demands, the combination of counters included in a microcomputer, for example, varies even in the case of implementing the same function. Therefore, there is a demand for development of versatile products that meet various customer demands.

A timing control device according to an aspect of the present invention includes: a time sharing controller that sequentially selects data output from a plurality of data output devices and outputs the selected data as time-shared data; and a timing signal generation unit that generates a timing signal based on the time-shared data. The timing signal generation unit includes a timing control information storage unit that stores expected value data of one of the data output devices; a comparison unit that compares the expected value data of the one of the data output devices with data included in the time-shared data and corresponding to the one of the data output devices, and outputs a coincidence signal when the data coincide with each other; and an output control unit that outputs the timing signal corresponding to the coincidence signal.

A control method of a timing control device according to another aspect of the present invention includes: sequentially selecting data output from a plurality of data output devices and outputting the selected data as time-shared data; and comparing expected value data of any of the data output devices stored in a timing control information storage unit with data included in the time-shared data and corresponding to any of the data output devices, and outputting a coincidence signal when the data coincide with each other; and outputting the timing signal corresponding to the coincidence signal.

The circuit configuration as described above enables versatile timing control.

The present invention can provide a timing control device capable of performing versatile timing control and a control method thereof.

Sixth Embodiment

Figure 18:
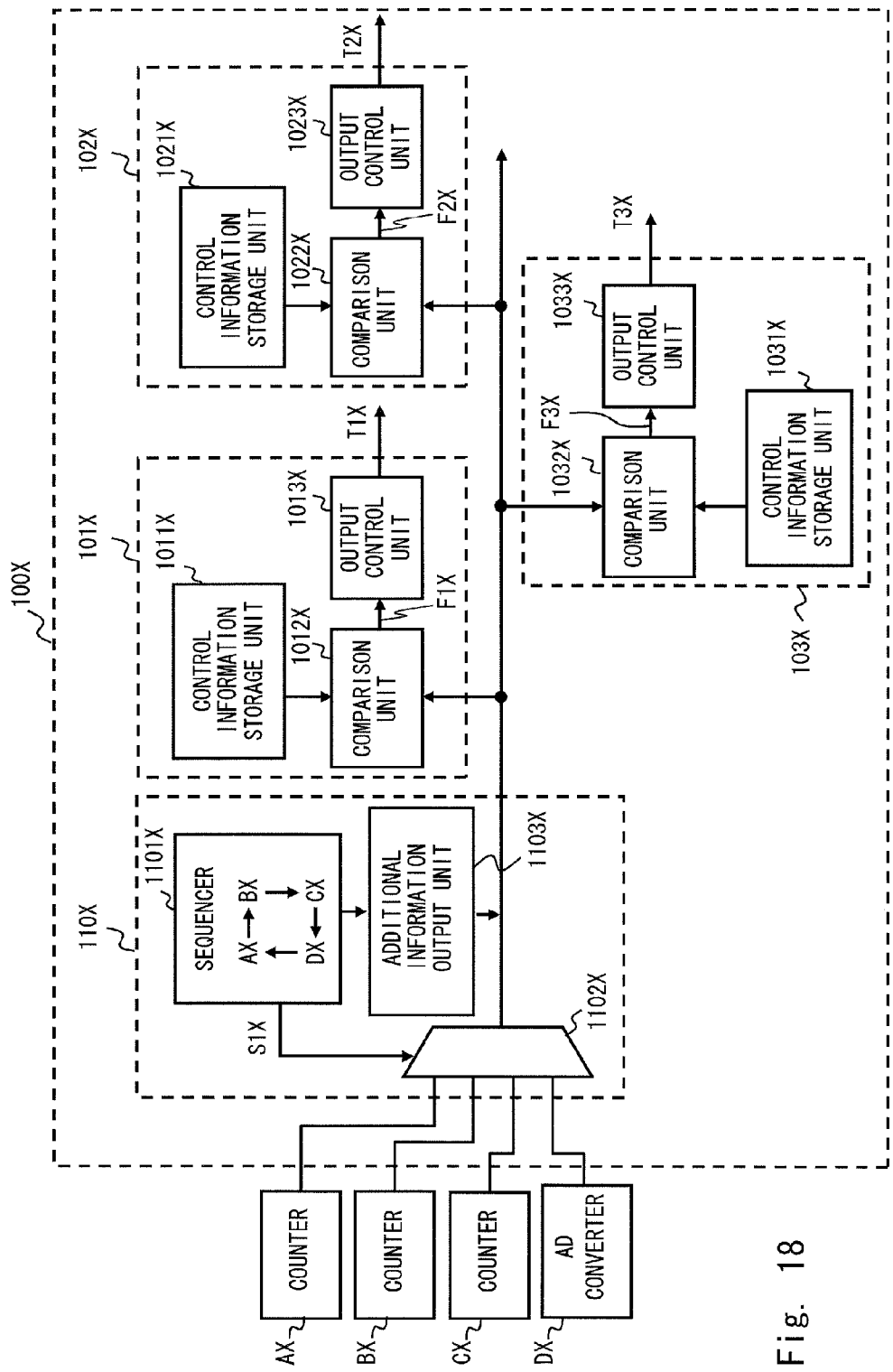
FIG. 18 is a block diagram showing a timing control device according to a sixth embodiment of the present invention.

FIG. 18 is a block diagram showing an outline of a timing control device 100X according to a sixth embodiment of the present invention. The timing control device 100X according to the sixth embodiment generates a timing signal based on data output from each of a plurality of data output devices, thereby enabling versatile timing control. The details thereof will be described below.

As shown in FIG. 18, the timing control device 100X includes a time-sharing controller 110X and condition comparison units (timing signal generation units) 101X to 103X. The time-sharing controller 110X includes a sequencer 1101X, a selector 1102X, and an additional information output unit 1103X. The condition comparison unit 101X includes a timing control information storage unit 1011X, a comparison unit 1012X, and an output control unit 1013X. Similarly, the condition comparison unit 102X includes a timing control information storage unit 1021X, a comparison unit 1022X, and an output control unit 1023X. The condition comparison unit 103X includes a timing control information storage unit 1031X, a comparison unit 1032X, and an output control unit 1033X. This embodiment illustrates, by way of example, a configuration including three condition comparison units, but the configuration can be appropriately changed to a circuit configuration including one or more condition comparison units.

In the time-sharing controller 110X, the selector 1102X receives data output from each of a counter AX, a counter BX, a counter CX, and an AD converter DX which are externally mounted. For example, the counter AX, the counter BX, the counter CX, and the AD converter DX, which are data output devices, output data in synchronization with a reference clock (not shown). Specifically, each of the counter AX, the counter BX, and the counter CX increments and outputs a count value in synchronization with the reference clock. The AD converter DX converts analog data externally provided into digital data in synchronization with the reference clock, and outputs the digital data. The sixth embodiment illustrates, by way of example, the configuration in which each of the data output devices outputs data in synchronization with the reference clock, but the present invention is not limited thereto. The configuration may be appropriately changed to a circuit configuration in which each of the data output devices outputs data at its own timing (hereinafter referred to as "data update timing", and the cycle of the data update timing is referred to as "data update cycle"). The number of data output devices can also be appropriately changed.

The sequencer 1101X outputs a switching signal S1X having a cycle corresponding to the cycle of the reference clock and the number of data output devices. The selector 1102X sequentially selects data output from each of the data output devices based on the switching signal S1X output from the sequencer 1101X, and outputs the selected data as time-shared data.

Specifically, the sequencer 1101X outputs the switching signal S1X having a ¼ cycle of the reference clock. At this time, the sequencer 1101X outputs the switching signal SD (so that the selector 1102X sequentially selects and outputs the output data in the order of the counter AX, the counter BX, the counter CX, and the AD converter DX. Accordingly, the selector 1102X sequentially outputs the data output from the counter AX, the counter BX, the counter CX, and the AD converter DX for each ¼ cycle of the reference clock. In other words, the selector 1102X performs time sharing of the data output from each of the counter AX, the counter BX, the counter CX, and the AD converter DX, and outputs the data as time-shared data.

The additional information output unit 1103X outputs additional information for each data included in the time-shared data. For example, the additional information output unit 1103X outputs, as the additional information, identification information of an output source (data output device) of the data selected by the selector 1102X. Specifically, when the selector 1102X selects and outputs the data of the counter AX, the additional information output unit 1103X outputs "0" as the identification information of the counter AX. Similarly, when the selector 1102X selects and outputs the data of the counter BX, the additional information output unit 1103X outputs "1" as the identification information of the counter BX. When the selector 1102X selects and outputs the data of the counter CX, the additional information output unit 1103X outputs "2" as the identification information of the counter CX. When the selector 1102X selects and outputs the data of the AD converter DX, the additional information output unit 1103X outputs "3" as the identification information of the AD converter DX. Thus, the additional information output unit 1103X outputs the corresponding additional information (identification information) in synchronization with the switching signal S1X output from the sequencer 1101X.

For example, the additional information (identification information) output from the additional information output unit 1103X is added to the most significant bit of the corresponding data included in the time-shared data. In this case, the time-sharing controller 110X performs time sharing of data obtained by adding the additional information (identification information) to the data output from each of the counter AX, the counter BX, the counter CX, and the AD converter DX, and outputs the data as time-shared data.

In the condition comparison unit 101X, the timing control information storage unit 1011X stores timing control information according to an instruction from a CPU (not shown). Specifically, the timing control information storage unit 1011X stores the identification information of any of the data output devices, and the corresponding expected value data. For example, the timing control information storage unit 1011X stores "1" as the identification information, and "yyy0" as the expected value data.

The comparison unit 1012X compares the identification information of the data output device obtained based on the additional information from the time-sharing controller 110X, with the identification information stored in the timing control information storage unit 1011X, and further compares the corresponding data included in the time-shared data with the expected value data. When the above-mentioned identification information coincide with each other and the above-mentioned data coincide with each other, the comparison unit 1012X outputs a coincidence signal F1X. For example, when the identification information that is the additional information output from the time-sharing controller 110X is "1" and the data included in the time-shared data at that time is "yyy0", that is, when the data transferred from the time-sharing controller 110X is "1yyy0", the identification information stored in the timing control information storage unit 1011X and the expected value data coincide with respective data, so that the comparison unit 1012X outputs the coincidence signal F1X.

Upon receiving the coincidence signal F1X from the comparison unit 1012X, the output control unit 1013X outputs a timing signal T1X according to the coincidence signal F1X. For example, upon receiving the coincidence signal F1X from the comparison unit 1012X, the output control unit 1013X inverts the logical value of the timing signal T1X in synchronization with the coincidence signal F1X.

Upon completion of this timing control, an interrupt for requesting the subsequent timing control information is generated from the condition comparison unit 101X to the CPU. Accordingly, the timing control information storage unit 1011X stores the subsequent timing control information according to the instruction from the CPU. For example, the timing control information storage unit 1011X stores "2" as the identification information, and "zzz1" as the expected value data. After that, the same operation is repeated to thereby control the timing signal T1X.

The circuit configuration of each of the condition comparison units 102X and 103X is similar to that of the condition comparison unit 101X, so the description thereof is omitted.

Thus, in the timing control device 100X shown in FIG. 18, each of the condition comparison units 101X to 103X is configured to generate a single timing signal based on the data output from each of the data output devices. That is, the timing control device 100X shown in FIG. 18 can perform versatile timing control based on the data output from each of the data output devices.

The cycle of the switching signal S1X of the sequencer 1101X, that is, the cycle at which the data selected by the selector 1102X is switched (the cycle is hereinafter referred to as "data switch cycle") depends on the number of data output devices and the data update cycle of each data output device, but does not depend on the number of condition comparison units. Accordingly, even if an additional condition comparison unit is provided, the data switch cycle of the selector 1102X does not change. Therefore, there is no need to further increase the operation frequency of the condition comparison unit.

(Timing Diagram)

Figure 19:
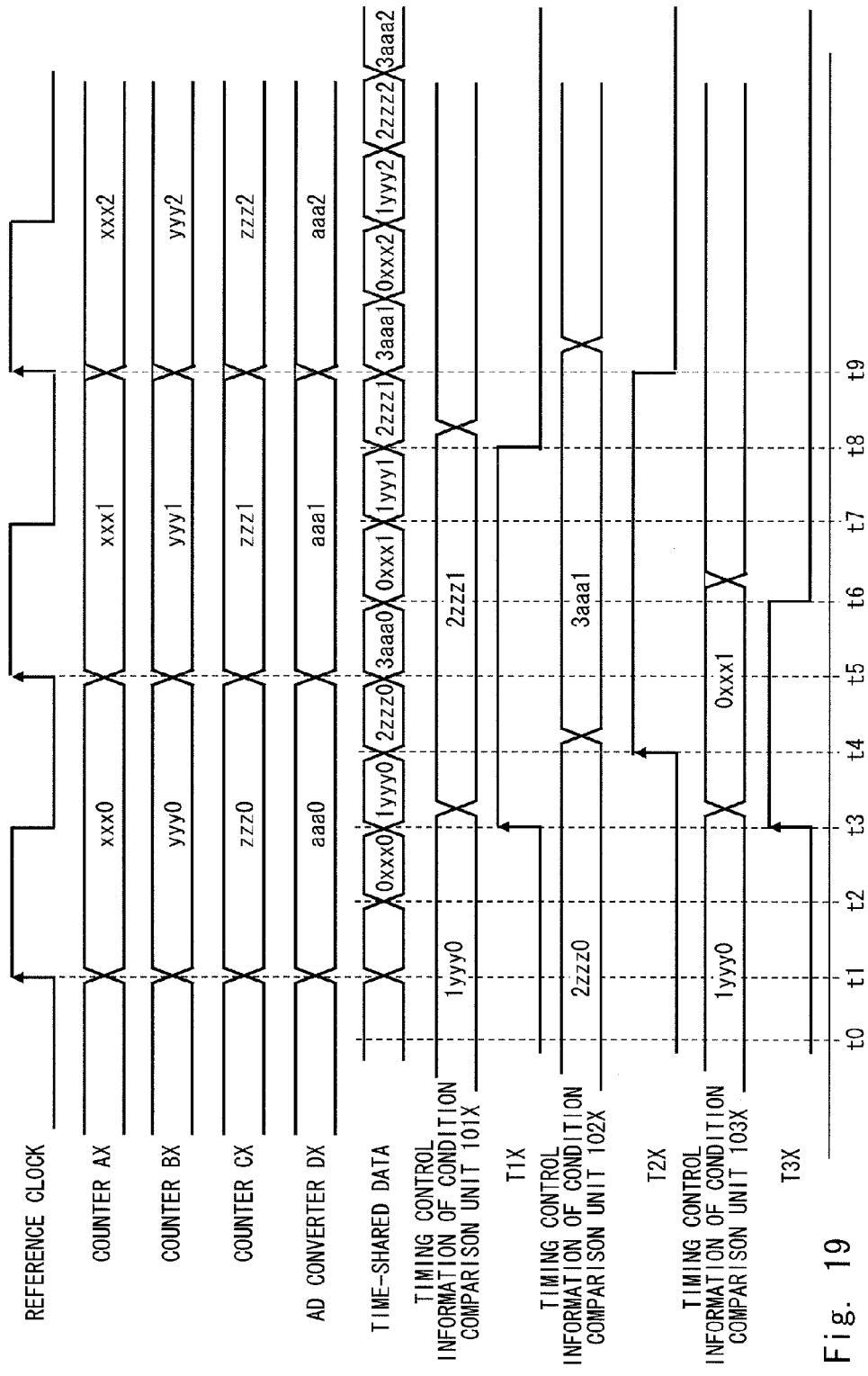
FIG. 19 is a timing diagram showing an operation of the timing control device according to the sixth embodiment of the present invention.

Next, an operation of the timing control device 100X shown in FIG. 18 will be described in more detail with reference to FIG. 19. FIG. 19 is a timing diagram showing an operation of the timing control device 100X shown in FIG. 18. In the example of FIG. 19, the counter AX sequentially outputs data items "xxx0", "xxx1", and "xxx2" in synchronization with the reference clock. The counter BX sequentially outputs data items "yyy0", "yyy 1 ", and "yyy2" in synchronization with the reference clock. The counter CX sequentially outputs data items "zzz0", "zzz1", and "zzz2" in synchronization with the reference clock. The AD converter DX sequentially outputs data items "aaa0", "aaa1", and "aaa2" with reference to the reference clock.

In the example of FIG. 19, the timing control information storage unit 1011X stores "1" as the identification information and "yyy0" as the expected value data (time t0). The timing control information storage unit 1021X stores "2" as the identification information and "zzz0" as the expected value data (time t0). The timing control information storage unit 1031X stores "1" as the identification information and "yyy0" as the expected value data (time t0).

First, the counter AX, the counter BX, the counter CX, and the AD converter DX output the data items "xxx0", "yyy0", "zzz0", and "aaa0", respectively, in synchronization with a rising edge of the reference clock (time t1).

The time-sharing controller 110X sequentially outputs data obtained by adding additional information (identification information) of "0", "1", "2", and "3" to the data items "xxx0", "yyy0", "zzz0", and "aaa0", respectively, as the time-shared data for each ¼ cycle of the reference clock (times t2, t3, t4, and t5).

Next, the counter AX, the counter BX, the counter CX, and the AD converter DX output the data items "xxx1", "yyy1", "zzz1", and "aaa1", respectively, in synchronization with a rising edge of the reference clock (time t5).

The time-sharing controller 110X sequentially outputs data obtained by adding additional information (identification information) of "0", "1", "2", and "3" to the data items "xxx1", "yyy1", "zzz1", and "aaa1", respectively, as the time-shared data for each ¼ cycle of the reference clock (times t6, t7, t8, and t9). Such an operation is repeated.

In the condition comparison unit 101X, when the identification information that is the additional information output from the time-sharing controller 110X is "1" and the data included in the time-shared data at that time is "yyy0", the identification information stored in the timing control information storage unit 1011X and the expected value data coincide with respective data, so that the comparison unit 1012X outputs the coincidence signal F1X (time t3). Upon receiving the coincidence signal F1X from the comparison unit 1012X, the output control unit 1013X inverts the timing signal T1X from the L level to the H level in synchronization with the coincidence signal F1X (time t3).

Upon completion of this timing control, an interrupt for requesting the subsequent timing control information is generated from the condition comparison unit 101X to the CPU. Accordingly, the timing control information storage unit 1011X stores the subsequent timing control according to the instruction from the CPU (immediately after time t3). In the example of FIG. 19, the timing control information storage unit 1011X stores "2" as the identification information and "zzz1" as the expected value data.

In the condition comparison unit 101X, when the identification information that is the additional information output from the time-sharing controller 110X is "2" and the data included in the time-shared data at that time is "zzz1", the identification information stored in the timing control information storage unit 1011X and the expected value data coincide with respective data, so that the comparison unit 1012X outputs the coincidence signal F1X (time T8). Upon receiving the coincidence signal F1X from the comparison unit 1012X, the output control unit 1013X inverts the timing signal T1X from the H level to the L level in synchronization with the coincidence signal F1X (time T8).

Thus, the condition comparison unit 101X causes the timing signal T1X to rise based on the output data of the counter BX (time t3), and causes the timing signal T1X to fall based on the output data of the counter CX (time t8). Similarly, the condition comparison unit 102X causes a timing signal T2X to rise based on the output data of the counter CX (time t4), and causes the timing signal T2X to fall based on the output data of the AD converter DX (time t9). Further, the condition comparison unit 103X causes a timing signal T3X to rise based on the output data of the counter BX (time t3), and causes the timing signal T3X to fall based on the output data of the counter AX (time t6).

(Description of Microcomputer Incorporating Timing Control Device)

Figure 20:
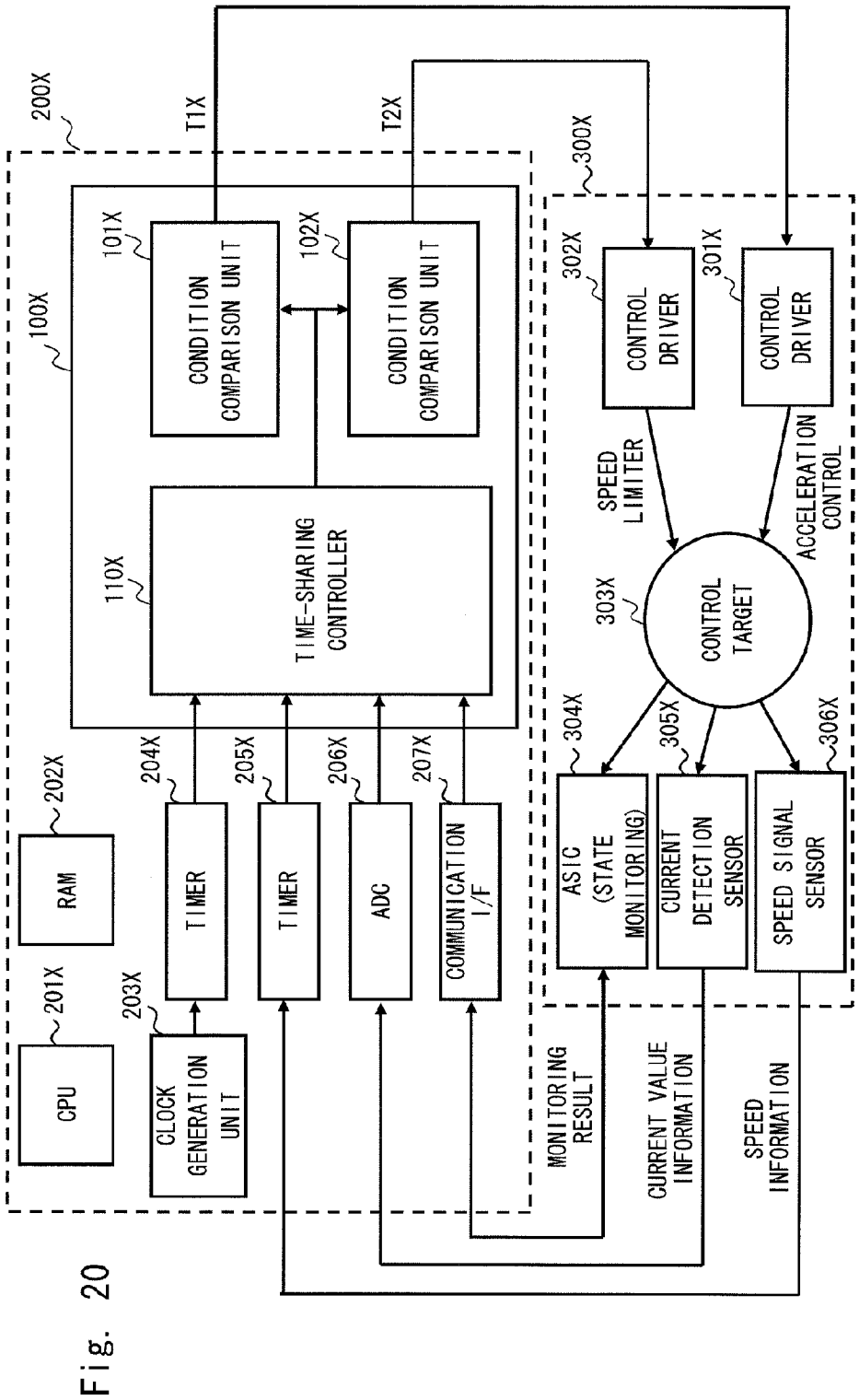
FIG. 20 is a block diagram showing an outline of a control system to which the present invention is applied.

As shown in FIG. 20, the timing control device 100X according to the sixth embodiment is mounted on a microcomputer. FIG. 20 is a block diagram showing a control system including a microcomputer 200X incorporating the timing control device 100X shown in FIG. 18, and a control target device 300X controlled by the microcomputer 200X. The timing control device 100X shown in FIG. 20 outputs the two timing signals T1X and T2X.

The microcomputer 200X shown in FIG. 20 includes the timing control device 100X, a CPU 201X that processes programs, a RAM 202X that stores programs and the like, a clock generation unit 203X that generates a reference clock, timers 204X and 205X, an AD converter 206X, and a communication I/F 207X. The control target device 300X includes control drivers 301X and 302X, a control target 303X, an ASIC 304X, a current detection sensor 305X, and a speed signal sensor 306X.

The timer 204X, the timer 205X, the AD converter 206X, and the communication I/F 207X are data output devices. The timer 204X increments and outputs a count value in synchronization with the reference clock generated by the clock generation unit 203X. The timer 205X increments and outputs a count value based on speed information (pulse signal) output from the control target device 300X. The AD converter 206X converts current value information (analog value) output from the control target device 300X into digital data, and outputs the digital data. The communication I/F 207X outputs the monitoring result (digital value), which is output from the control target device 300X, as digital data. In the example of FIG. 20, the timer 204X, the timer 205X, the AD converter 206X, and the communication I/F 207X are used as the data output devices, but the data output devices are not limited thereto. Various types of data output devices may be used depending on the specifications. In the example of FIG. 20, the speed information, the current value information, and the monitoring result are supplied to the microcomputer 200X from the control target device 300X, but the information is not limited thereto. The information supplied to the microcomputer 200X from the control target device 300X can be appropriately changed depending on the specifications.

The timing control device 100X outputs the timing signals T1X and T2X having pulse waveforms based on the data output from the data output devices 204X to 207X. The timing signal T1X is supplied to the control driver 301X provided in the control target device 300X. The timing signal T2X is supplied to the control driver 302X provided in the control target device 300X. In the example of FIG. 20, the two timing signals T1X and T2X are supplied to the control target device 300X from the microcomputer 200X, but the number of timing signals is not limited thereto. The number of timing signals can be appropriately changed depending on the specifications of the control target device 300X.

The control drivers 301X and 302X drive the control target 303X based on the timing signals T1X and T2X, respectively. The control target 303X is an on-vehicle engine, for example, and the rotational motion thereof is controlled by the control drivers 301X and 302X. For example, the control driver 301X accelerates the rotational speed of the control target 303X based on the timing signal T1X. The control driver 302X limits the rotational speed of the control target 303X based on the timing signal T2X.

The ASIC 304X monitors the state of the control target 303X, and outputs the monitoring result to the communication I/F 207X as digital data. For example, the ASIC 304X is used to monitor the state of the control target 303X, such as a normal operation state or a suspended state, for example. The current detection sensor 305X detects a current flowing through the control target 303X, and outputs the detection result to the AD converter 206X as the current value information (analog value). For example, the current detection sensor 305X is used to check whether a desired current is flowing through the control target 303X. The speed signal sensor 306X detects the rotational speed of the control target 303X, and outputs the detection result to the timer 205X as the speed information (pulse signal).

As described above, the timing control device 100X shown in FIG. 20 generates the timing signals T1X and T2X based on the data output from each of the data output devices. That is, the timing control device 100X shown in FIG. 20 can perform versatile timing control based on the data output from each of the data output devices. Further, in the example of FIG. 20, some of the data output devices output data corresponding to the information (speed information and the like) obtained from the control target 303X. This enables the timing control device 100X shown in FIG. 20 to perform timing control of the control target 303X based on various types of information obtained from the control target 303X. That is, the timing control device 100X shown in FIG. 20 can determine how to control the control target 303X based on various types of information obtained from the control target 303X, and can perform versatile timing control in real time.

(Timing Diagram)

Figure 21:
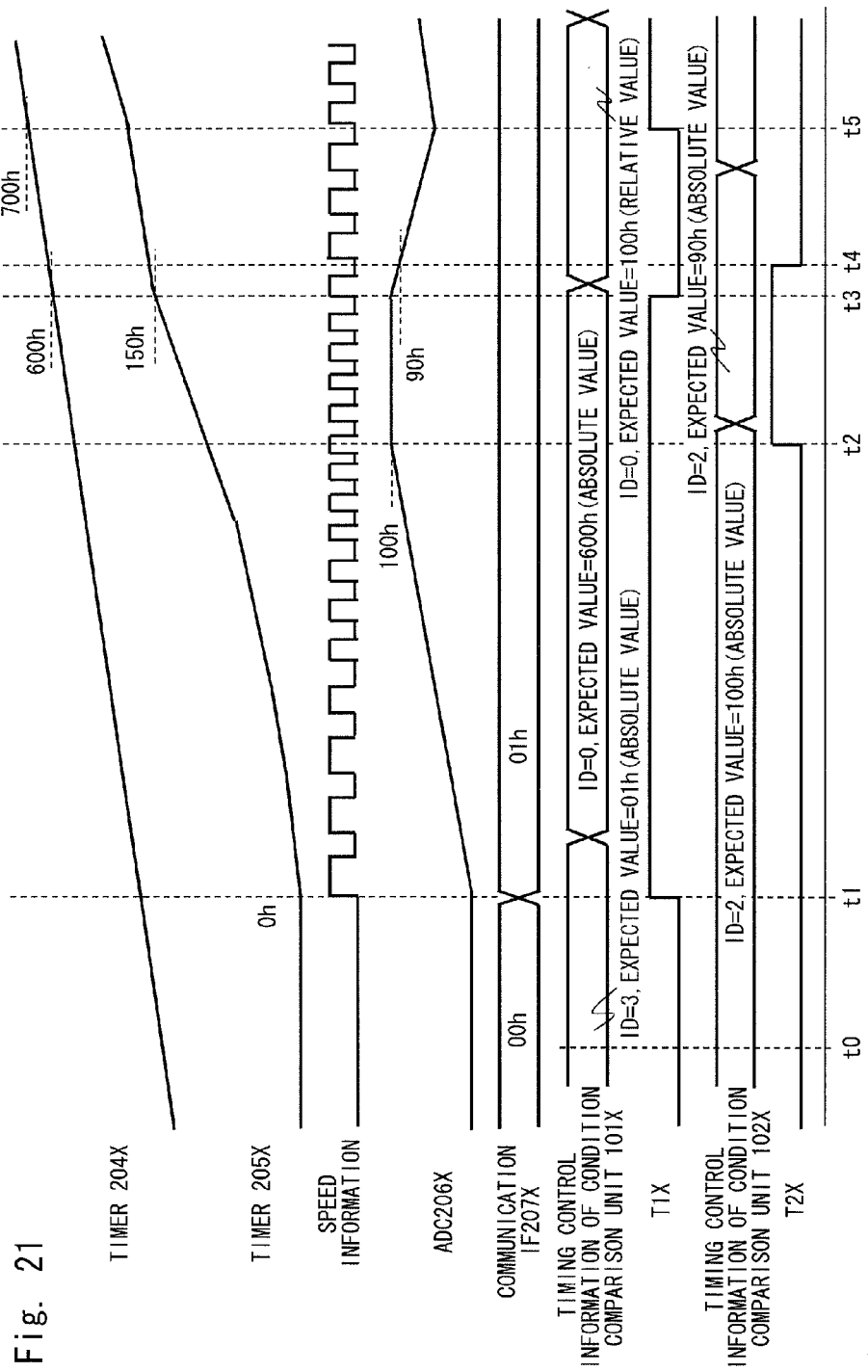
FIG. 21 is a timing diagram showing an operation of the control system to which the present invention is applied.

Next, an operation of the control system shown in FIG. 20 will be described in more detail with reference to FIG. 21. FIG. 21 is a timing diagram showing an operation of the control system shown in FIG. 20.

As shown in FIG. 21, the timer 204X increments the count value at regular intervals. The timer 205X increments the count value based on the speed information (pulse signal) from the control target device 300X. Accordingly, as the rotational speed of the control target 303X increases, the increase rate of the count value of the timer 205X increases. Meanwhile, as the rotational speed of the control target 303X decreases, the increase rate of the count value of the timer 205X decreases. The AD converter 206X converts the current value information (analog value) from the control target device 300X into digital data and outputs the digital data. The communication I/F 207X outputs the monitoring result (state of the control target 303X) from the control target device 300X as digital data. For example, the communication I/F 207X outputs data "00h" (in hexadecimal) when the control target 303X is in the suspended state, and outputs data "01h" when the control target 303X is in the normal operation state.

In the example of FIG. 21, the timing control information storage unit 1011X stores "3" as the identification information and "01h" (absolute value) in hexadecimal as the expected value data (time t0). The timing control information storage unit 1021X stores "2" as the identification information and "100h" (absolute value) in hexadecimal as the expected value data (time t0). The identification information "0", "1", "2", and "3" respectively correspond to the timer 204X, the timer 205X, the AD converter 206X, and the communication I/F 207X.

The communication I/F 207X first switches the data items "00h" to "01h" according to a change in the state of the control target 303X and outputs the switched data (time t1). At this time, the output data of the communication I/F 207X coincides with the expected value data stored in the timing control information storage unit 1011X, so that the condition comparison unit 101X switches the timing signal T1X from the L level to the H level (time t1).

The rise of the timing signal T1X accelerates the rotational speed of the control target 303X. Accordingly, the increase rate of the count value of the timer 205X increases. Further, as the value of the current flowing through the control target 303X increases, the value of the digital data output from the AD converter 206X also increases (time t1 to time t2).

Upon completion of this timing control (a rise of the timing signal T1X), the timing control information storage unit 1011X stores the subsequent timing control information (immediately after time t1). In the example of FIG. 21, the timing control information storage unit 1011X stores "0" as the identification information and "600h" (absolute value) as the expected value data.

Next, when the digital data output from the AD converter 206X reaches "100h", the output data of the AD converter 206X coincides with the expected value data stored in the timing control information storage unit 1021X, so that the condition comparison unit 102X switches the timing signal T2X from the L level to the H level (time t2). That is, when the value of the current flowing through the control target 303X is excessively large, the condition comparison unit 102X switches the timing signal T2X from the L level to the H level so as to limit the rotational speed of the control target 303X.

The rise of the timing signal T2X limits the rotational speed of the control target 303X to be equal to or lower than a certain speed. This prevents the increase rate of the count value of the timer 205X from increasing, and also prevents the value of the current flowing through the control target from increasing (time t2 to time t4).

Upon completion of this timing control (a rise of the timing signal T2X), the timing control information storage unit 1021X stores the subsequent timing control information (immediately after time t2). In the example of FIG. 21, the timing control information storage unit 1021X stores "2" as the identification information and "90h" (absolute value) as the expected value data.

On the other hand, when the count value of the timer 204X reaches "600h", the count value of the timer 204X coincides with the expected value data stored in the timing control information storage unit 1011X, so that the condition comparison unit 101X switches the timing signal T1X from the H level to the L level (time t3). That is, when the control target 303X is accelerated for a predetermined period of time, the condition comparison unit 101X switches the timing signal T1X from the H level to the L level so as to reduce the rotational speed of the control target 303X.

The fall of the timing signal T1X decelerates the rotational speed of the control target 303X. Accordingly, the increase rate of the count value of the timer 205X decreases. Further, as the value of the current flowing through the control target 303X decreases, the value of the digital data output from the AD converter 206X also decreases (time t3 to time t5).

Upon completion of this timing control (a fall of the timing signal T1X), the timing control information storage unit 1011X stores the subsequent timing control information (immediately after time t3). In the example of FIG. 21, the timing control information storage unit 1011X stores "0" as the identification information and "100h" (relative value from time t3) as the expected value data.

Then, when the digital data output from the AD converter 206X decreases to "90h", the output data of the AD converter 206X coincides with the expected value data stored in the timing control information storage unit 1021X, so that the condition comparison unit 102X switches the timing signal T2X from the H level to the L level (time t4). That is, when the value of the current flowing through the control target 303X decreases to an allowable value, the condition comparison unit 102X switches the timing signal T2X from the H level to the L level so as to release the limitation of the rotational speed of the control target 303X.

Further, when the count value of the timer 205X reaches "700h", the count value of the timer 205X coincides with the expected value data stored in the timing control information storage unit 1011X, so that the condition comparison unit 101X switches the timing signal T1X from the L level to the H level (time t5). That is, the condition comparison unit 101X switches the timing signal T1X from the L level to the H level so as to increase the rotational speed of the control target 303X, after a lapse of a predetermined period after the reduction in the rotational speed of the control target 303X.

In this manner, the timing control device 100X according to the sixth embodiment generates a timing signal based on the data output from each of the data output devices. That is, the timing control device 100X according to the sixth embodiment can perform versatile timing control based on the data output from each of the data output devices. Further, in the example of FIG. 20, some of the data output devices output data corresponding to the information (speed information and the like) obtained from the control target 303X. This enables the timing control device 100X according to the sixth embodiment to perform timing control of the control target 303X based on various types of information obtained from the control target 303X. That is, the timing control device 100X according to the sixth embodiment can determine how to control the control target 303X based on various types of information obtained from the control target 303X, and can perform versatile timing control in real time.

Seventh Embodiment

Figure 22:
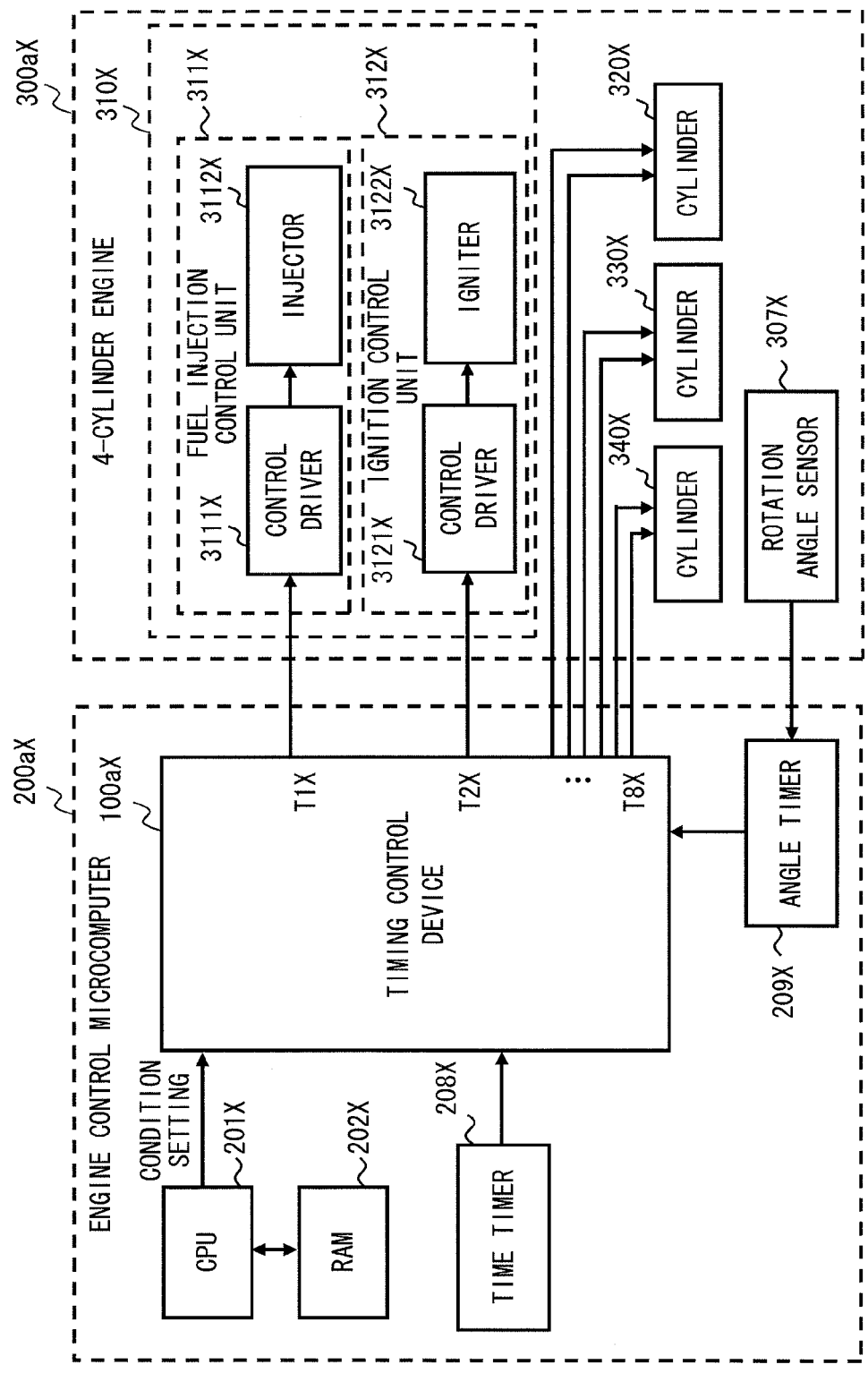
FIG. 22 is a block diagram showing an engine control system to which the present invention is applied.
Figure 23:
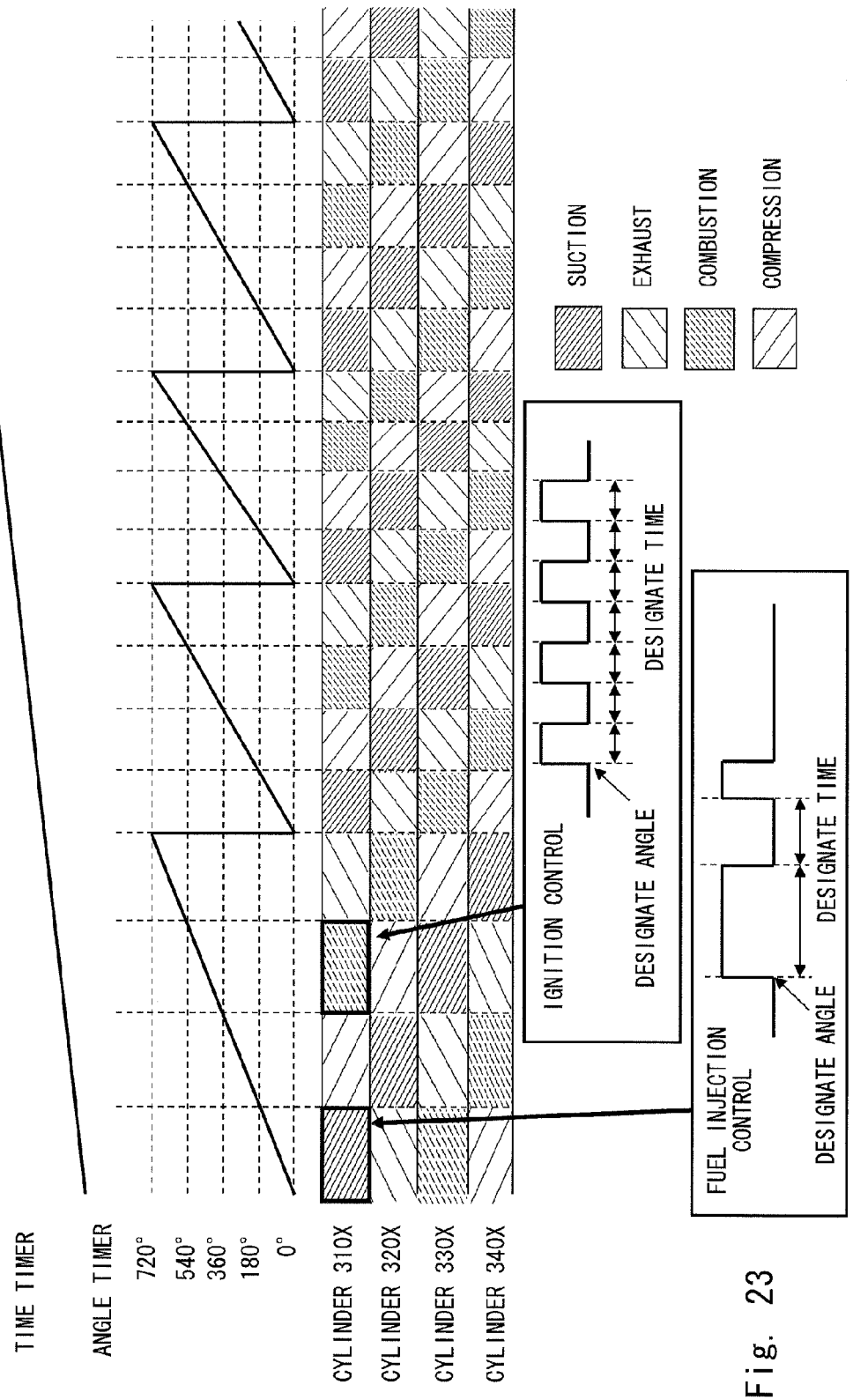
FIG. 23 is a timing diagram showing an operation of the engine control system to which the present invention is applied.

An application example in which the timing control device according to the present invention is applied to a specific product will be described with reference to FIGS. 22 and 23. FIG. 22 is a block diagram showing an engine control system including an engine control microcomputer 200aX incorporating a timing control device 100aX according to the present invention, and a 4-cylinder engine (on-vehicle engine) 300aX controlled by an engine control microcomputer 200aX. FIG. 23 is a timing diagram showing an operation of the engine control system shown in FIG. 22.

As shown in FIG. 22, the engine control microcomputer 200aX includes the timing control device 100aX, the CPU 201X that processes programs, a RAM 202X that stores programs and the like, a time timer (second timer) 208X, and an angle timer (first timer) 209X. The 4-cylinder engine 300aX includes four cylinders 310X, 320X, 330X, and 340X and a rotation angle sensor 307X. The cylinder 310X includes a fuel injection control unit 311X and an ignition control unit 312X. The fuel injection control unit 311X includes a control driver 3111X and an injector 3112X. The ignition control unit 312X includes a control driver 3121X and an igniter 3122X. The circuit configuration of each of the cylinders 320X, 330X, and 340X is similar to that of the cylinder 310X, so the description thereof is omitted.

In the engine control microcomputer 200aX, the time timer 208X increments and outputs a count value in synchronization of an internal clock (reference clock) having a certain cycle and generated in the engine control microcomputer 200aX (see the time timer shown in FIG. 23). The time timer 208X is a so-called free running timer.

The angle timer 209X increments and outputs a count value in synchronization with an angle signal (described later) of a pulse waveform output from the 4-cylinder engine 300aX (see the angle timer shown in FIG. 23). In other words, the angle timer 209X increments and outputs the count value every time the rotating shaft of the 4-cylinder engine 300aX rotates by a certain angle. Assuming that the count value 0 corresponds to the rotation angle of 0 degrees, the angle timer 209X increments the count value until the rotation angle reaches 720 degrees. Then, when the rotation angle reaches 720 degrees, the angle timer 209X resets the count value to 0. In other words, assuming that the count value 0 corresponds to the rotation angle of 0 degrees, the angle timer 209X increments the count value until the rotating shaft of the 4-cylinder engine 300aX turns twice. Then, when the rotating shaft of the 4-cylinder engine 300aX turns twice, the angle timer 209X resets the count value to 0. The seventh embodiment illustrates, by way of example, the case where the data update timings (count-up timings) of the time timer and the angle timer are the same, for ease of explanation.

The timing control device 100aX outputs eight timing signals T1X to T8X having pulse waveforms based on the data output from the time timer 208X and the angle timer 209X. The timing signals T1X and T2X are supplied to the cylinder 310X provided in the 4-cylinder engine 300aX. Similarly, the timing signals T3X and T4X are supplied to the cylinder 320X. The timing signals T5X and T6X are supplied to the cylinder 330X. The timing signals T7X and T8X are supplied to the cylinder 340X.

The 4-cylinder engine 300aX changes the angle of the crank shaft to turn the rotating shaft by piston motions of the four cylinders. The cylinders repeat operations of four processes including "suction", "compression", "combustion", and "exhaust", to thereby perform the piston motion (see the cylinders shown in FIG. 23). The 4-cylinder engine 300aX performs these four processes for one cycle, thereby causing the rotating shaft to turn twice.

In the cylinder 310, the fuel injection control unit 311X is a unit that controls injection of fuel into the cylinders. The control driver 3111X drives the injector 3112X based on the timing signal T1X from the engine control microcomputer 200aX. The injector 3112X is driven by the control driver 3111X, thereby allowing the fuel to be injected into the cylinders. The injection of the fuel into the cylinders is performed in the process of "suction" as shown in FIG. 23, and the timing thereof is controlled based on the output data from each of the time timer 208X and the angle timer 209X.

In the cylinder 310X, the ignition control unit 312X is a unit that ignites the fuel injected into the cylinders. The control driver 3121X drives the igniter 3122X based on the timing signal T2X from the engine control microcomputer 200aX. The igniter 3122X is driven by the control driver 3121X, thereby igniting the fuel injected into the cylinders. The ignition of the fuel injected into the cylinders is performed in the process of "combustion" as shown in FIG. 23, and the timing thereof is controlled based on the output data from each of the time timer 208X and the angle timer 209X.

In the four cylinders, the operations of different processes are carried out in the same period as shown in FIG. 23. Accordingly, each of "fuel injection" and "fuel ignition" of the four cylinders are controlled at different timings.

The rotation angle sensor 307X detects an angular velocity of a rotational motion of the 4-cylinder engine 300aX, and outputs an angle signal having a pulse shape every time the rotating shaft changes at a certain angle. This angle signal is input to the angle timer 209X provided in the engine control microcomputer 200aX. The angle timer 209X increments and outputs the count value in synchronization with the angle signal. This allows the timing control device 100aX to detect control timings for "fuel injection" and "fuel ignition" of the four cylinders based on the data output from the angle timer 209X.

In this manner, the timing control device 100aX shown in FIG. 22 controls different timings for "fuel injection" and "fuel ignition" for each cylinder based on the data (count value) output from each of the time timer 208X and the angle timer 209X. That is, the timing control device 100aX shown in FIG. 22 can perform versatile timing control based on the data output from each of the data output devices.
(Configuration and Basic Operation Of Timing Control Device 100aX)

Figure 24:
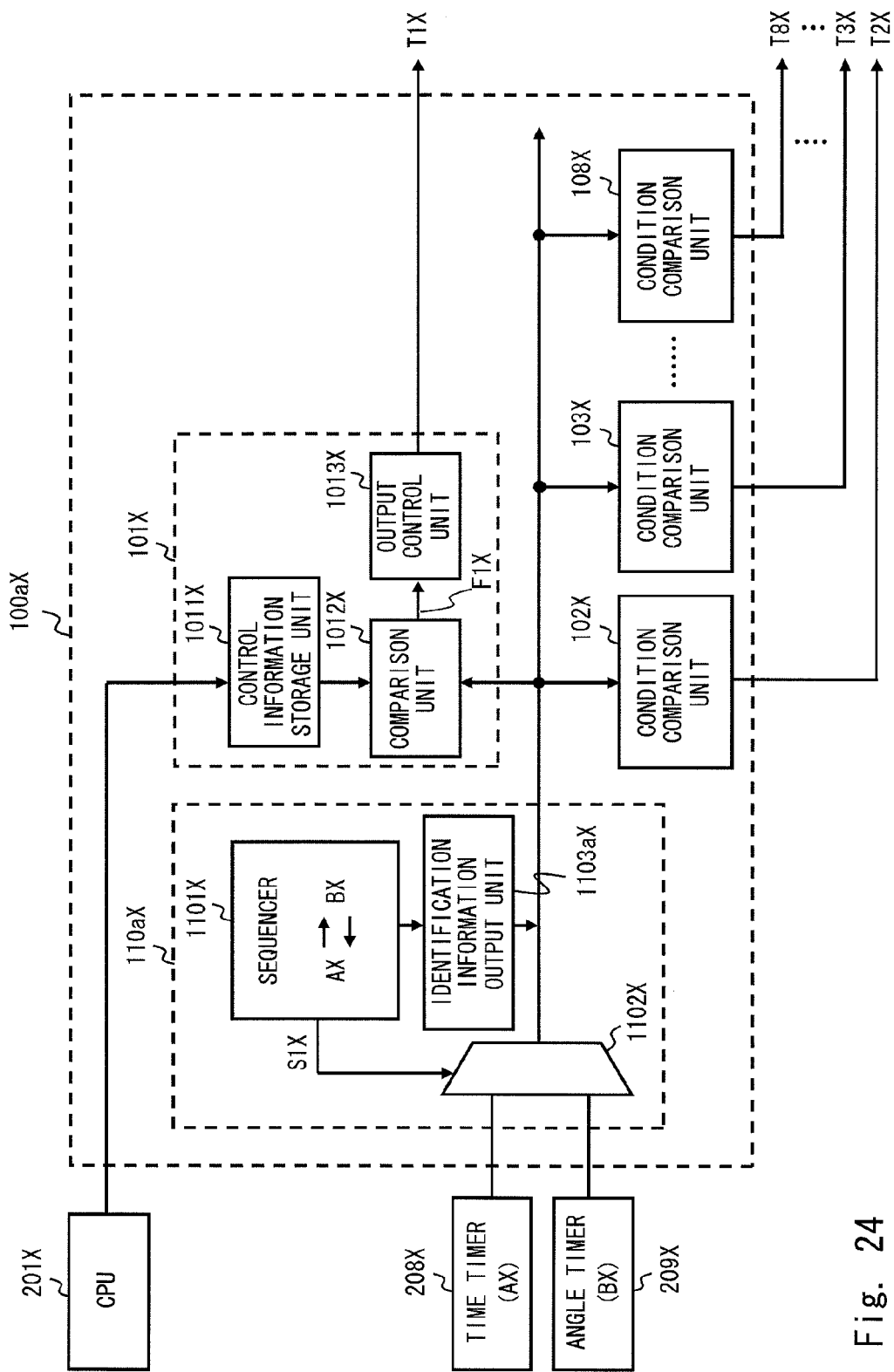
FIG. 24 is a block diagram showing a timing control device according to a seventh embodiment of the present invention.

Next, the configuration and basic operation of the timing control device 100aX will be described with reference to FIG. 24. FIG. 24 is a block diagram showing the timing control device 100aX according to the seventh embodiment.

As shown in FIG. 24, the timing control device 100aX includes a time-sharing controller 110aX and condition comparison units (timing signal generation units) 101X to 108X. The time-sharing controller 110aX includes the sequencer 1101X, the selector 1102X, and an identification information output unit 1103aX serving as the additional information output unit. The condition comparison unit 101X includes the timing control information storage unit 1011X, the comparison unit 1012X, and the output control unit 1013X. The circuit configuration of each of the condition comparison units 102X to 108X is similar to that of the condition comparison unit 101X, so the description thereof is omitted.

The sequencer 1101X outputs the switching signal S1X having a ½ cycle of the data update timing (for example, the internal clock). Accordingly, the selector 1102X outputs the data output from each of the time timer 208X and the angle timer 209X, and sequentially outputs the data as the time-shared data for each ½ cycle of the data update timing.

The identification information output unit 1103aX outputs the identification information of the output source (the time timer 208X and the angle timer 209X) of the data selected by the selector 1102X. Specifically, when the selector 1102X selects and outputs the data of the time timer 208X, the identification information output unit 1103aX outputs "0" as the identification information of the time timer 208X. Similarly, when the selector 1102X selects and outputs the data of the angle timer 209X, the identification information output unit 1103aX outputs "1" as the identification information of the angle timer 209X. Thus, the identification information output unit 1103aX outputs the corresponding identification information in synchronization with the switching signal S1X output from the sequencer 1101X.

In the seventh embodiment, the identification information output from the identification information output unit 1103aX is added to the most significant bit of the corresponding data included in the time-shared data. Specifically, in the seventh embodiment, the time-sharing controller 110aX outputs, as the time-shared data, data obtained by adding the corresponding identification information to the data output from the time timer 208X and the angle timer 209X, for each ½ cycle of the data update timing.

In the condition comparison unit 101X, the timing control information storage unit 1011X stores the timing control information according to an instruction from the CPU 201X. Specifically, the timing control information storage unit 1011X stores the identification information of any of the data output devices, and the corresponding expected value data. For example, the timing control information storage unit 1011X stores "1" as the identification information and "yyy0" as the expected value data.

The comparison unit 1012X compares the identification information included in the time-shared data, with the identification information stored in the timing control information storage unit 1011X, and further compares the corresponding data included in the time-shared data with the expected value data. When the above-mentioned identification information coincide with each other and the above-mentioned data coincide with each other, the comparison unit 1012X outputs the coincidence signal F1X. For example, when the identification information output from the time-sharing controller 110aX is "1" and the data included in the time-shared data at that time is "yyy0", that is, when the data transferred from the time-sharing controller 110aX is "1yyy0", the identification information stored in the timing control information storage unit 1011X and the expected value data coincide with respective data, so that the comparison unit 1012X outputs the coincidence signal F1X.

Upon receiving the coincide signal F1X from the comparison unit 1012X, the output control unit 1013X outputs the timing signal T1X according to the coincidence signal F1X. For example, upon receiving the coincidence signal F1X from the comparison unit 1012X, the output control unit 1013X inverts the logical value of the timing signal T1X in synchronization with the coincidence signal F1X.

Upon completion of this timing control, an interrupt for requesting the subsequent timing control information is generated from the condition comparison unit 101X to the CPU 201X. Accordingly, the timing control information storage unit 1011X stores the subsequent timing control information according to the instruction from the CPU 201X. For example, the timing control information storage unit 1011X stores "2" as the identification information and "zzz1" as the expected value data. After that, the same operation is repeated to thereby control the timing signal T1X. Such an operation is similarly performed in each of the condition comparison units 102X to 108X.

In this manner, in the timing control device 100aX according to the seventh embodiment, each of the condition comparison units 101X to 108X is configured to generate a single timing signal based on the data output from each of the data output devices. That is, the timing control device 100aX according to the seventh embodiment can perform versatile timing control based on the data output from each of the data output devices.

The cycle of the switching signal S1X of the sequencer 1101X, that is, the cycle at which the data selected by the selector 1102X is switched depends on the number of data output devices and the data update cycle of each data output device, but does not depend on the number of condition comparison units. Accordingly, even if the number of condition comparison units is increased, there is no need to further increase the operation frequency of each condition comparison unit.

Even if the number of condition comparison units is changed, the change has no effect on signal lines for the time-shared data. Accordingly, the number of condition comparison units can be easily changed.

The condition comparison units operate upon receiving the same time-shared data. Accordingly, the condition comparison units can operate easily in synchronization with each other.

Additionally, the number of data output devices can be easily changed by changing the cycle of the switching signal S1X.

(Timing Diagram)

Figure 25:
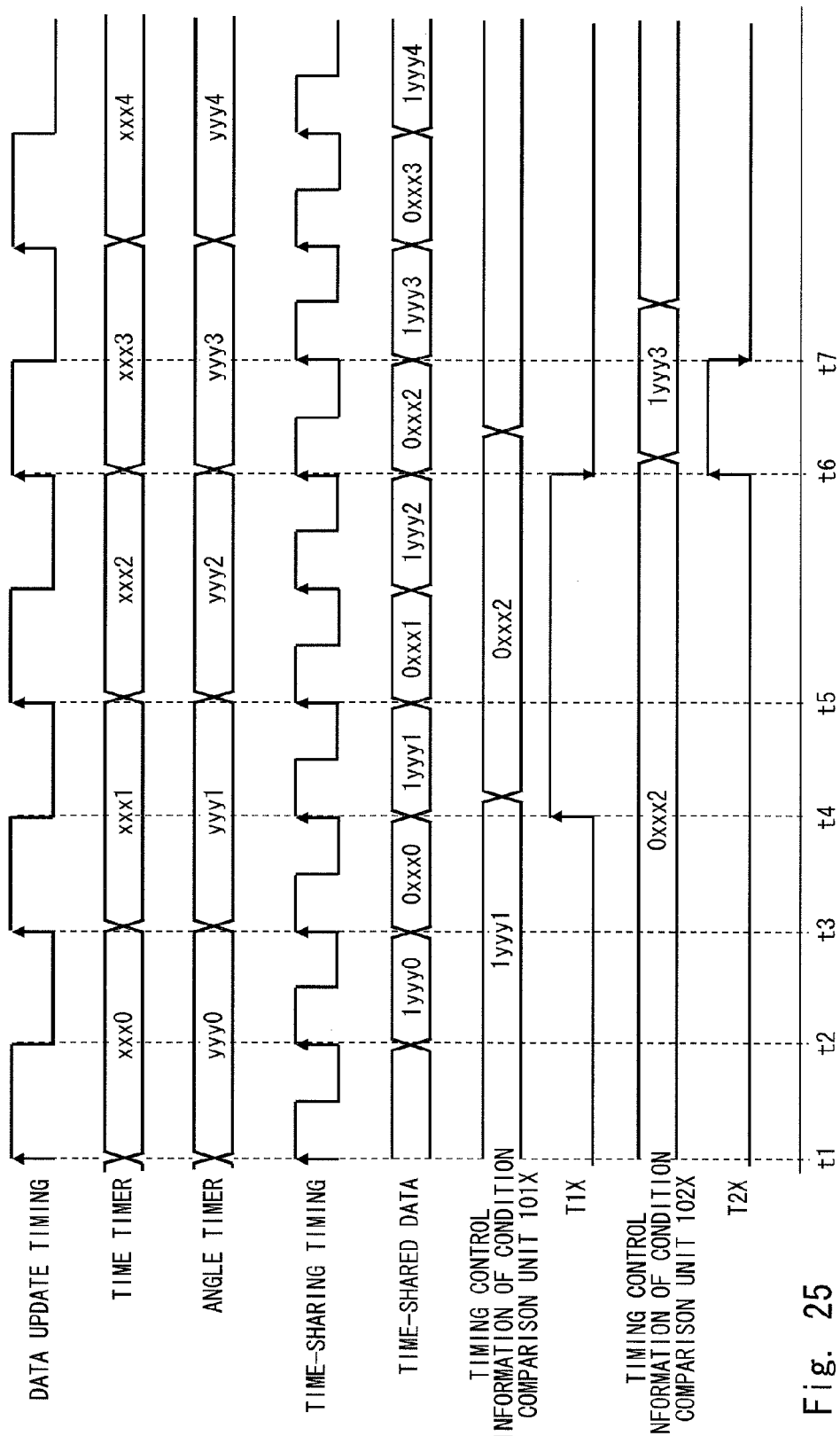
FIG. 25 is a timing diagram showing an operation of the timing control device according to the seventh embodiment of the present invention.

Next, the basic operation of the timing control device 100aX shown in FIG. 24 will be described in more detail with reference to FIG. 25. FIG. 25 is a timing diagram showing an operation of the timing control device 100aX shown in FIG. 24. FIG. 25 shows only the waveforms of the timing signals TX1 and T2X among the timing signals T1X to T8X. In the example of FIG. 25, the time timer 208X sequentially outputs data items "xxx0", "xxx1", "xxx2", "xxx3", and "xxx4" at the data update timing. The angle timer 209X sequentially outputs data items "yyy0", "yyy1", "yyy2", "yyy3", and "yyy4" at the data update timing.

In the example of FIG. 25, the timing control information storage unit 1011X stores "1" as the identification information and "yyy1" as the expected value data (time t1). The timing control information storage unit 1021X stores "0" as the identification information and "xxx2" as the expected value data (time t1).

First, the time timer 208X and the angle timer 209X respectively output the data items "xxx0" and "yyy0" at the data update timing (time t1). The time-sharing controller 110aX sequentially outputs, as the time-shared data, data obtained by adding the identification information "1" and "0" to the data items "yyy0" and "xxx0", respectively, for each ½ cycle of the data update timing (time t2 and time t3).

Next, the time timer 208X and the angle timer 209X respectively output the data items "xxx1" and "yyy1" at the data update timing (time t3). The time-sharing controller 110aX sequentially outputs, as the time-shared data, data obtained by adding the identification information "1" and "0" to the data items "yyy1" and "xxx 1", respectively, for each ½ cycle of the data update timing (time t4 and time t5). Such an operation is repeated.

In the condition comparison unit 101X, when the identification information output from the time-sharing controller 110aX is "1" and the data included in the time-shared data at that time is "yyy1", the comparison unit 1012X outputs the coincidence signal F1X (time t4). The output control unit 1013X inverts the timing signal T1X from the L level to the H level in synchronization with the coincidence signal F1X (time t4). Upon completion of this timing control, the timing control information storage unit 1011X stores the subsequent timing control information according to the instruction from the CPU (immediately after time t4). In the example of FIG. 25, the timing control information storage unit 1011X stores "0" as the identification information and "xxx2" as the expected value data.

Then, in the condition comparison unit 101X, when the identification information output from the time-sharing controller 110aX is "0" and the data included in the time-shared data at that time is "xxx2", the comparison unit 1012X outputs the coincidence signal F1X (time t6). The output control unit 1013X inverts the timing signal T1X from the H level to the L level in synchronization with the coincidence signal F1X (time t6).

Thus, the condition comparison unit 101X causes the timing signal T1X to rise based on the output data of the angle timer 209X (time t4), and causes the timing signal T1X to fall based on the output data of the time timer 208X (time t6). Similarly, the condition comparison unit 102X causes the timing signal T2X to rise based on the output data of the time timer 208X (time t6), and causes the timing signal T2X to fall based on the output data of the angle timer 209X (time t7).

Eighth Embodiment

Figure 26:
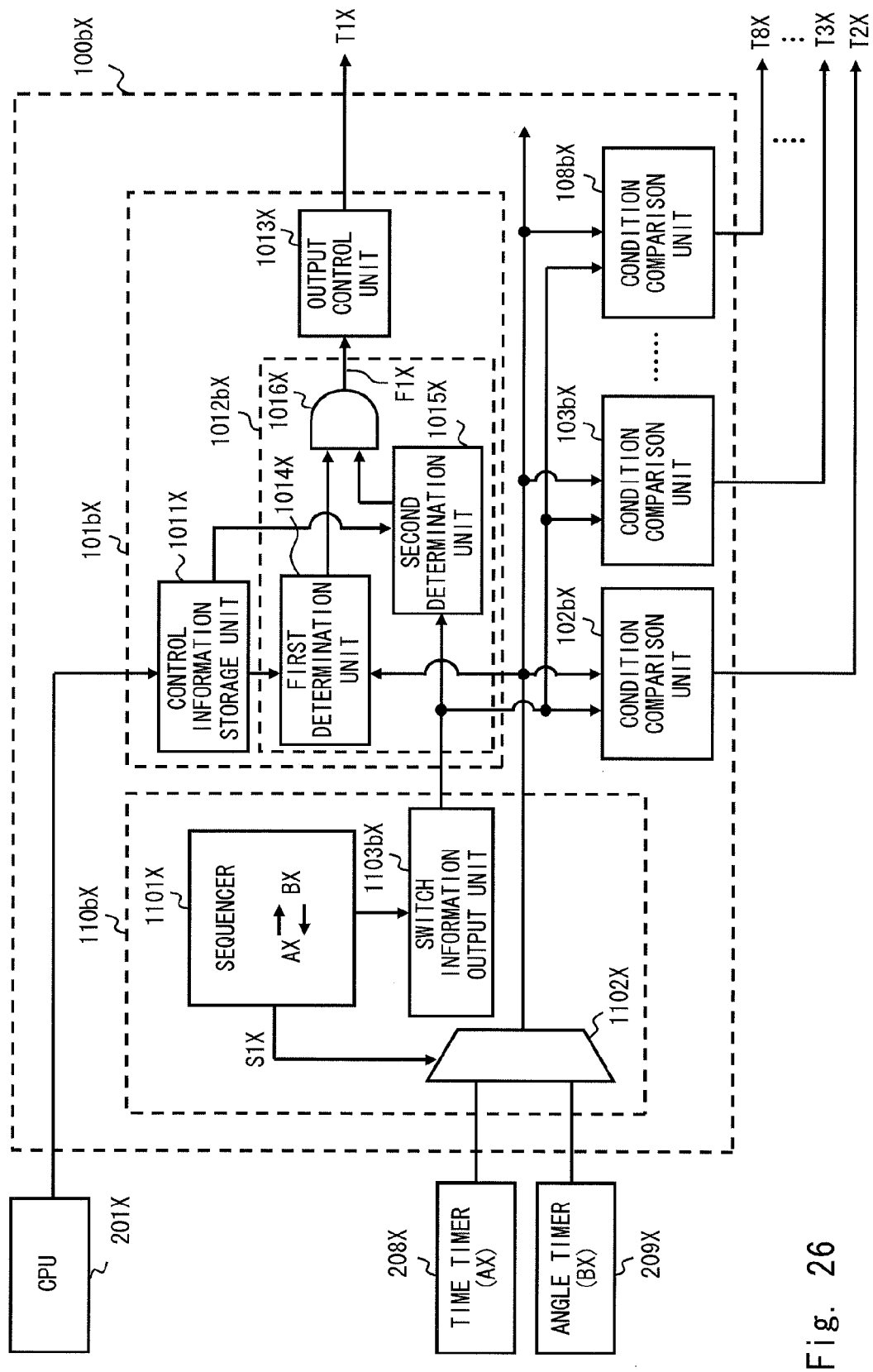
FIG. 26 is a block diagram showing a timing control device according to an eighth embodiment of the present invention.

FIG. 26 is a block diagram showing a timing control device 100bX as a modified example of the timing control device shown in FIG. 24. The eighth embodiment illustrates, by way of example, the case where the timing control device 100bX is mounted on the engine control microcomputer 200aX, but the present invention is not limited thereto. The timing control device 100bX can be mounted on various devices requiring timing control.

As shown in FIG. 26, the timing control device 100bX includes a time-sharing controller 110bX and condition comparison units (timing signal generation units) 101bX to 108bX. The time-sharing controller 110bX includes the sequencer 1101X, the selector 1102X, and a switching information output unit 1103bX serving as the additional information output unit. The condition comparison unit 101bX includes the timing control information storage unit 1011X, a comparison unit 1012bX, and the output control unit 1013X. The comparison unit 1012bX includes a first determination unit 1014X, a second determination unit 1015X, and an AND circuit (hereinafter referred to simply as "AND") 1016X. The circuit configuration of each of the condition comparison units 102bX to 108bX is similar to that of the condition comparison unit 101bX, so the description thereof is omitted. The eighth embodiment illustrates, by way of example, the case where the data update timings (count-up timings) of the time timer and the angle timer are the same, for ease of explanation.

The sequencer 1101X outputs the switching signal S1X having a ½ cycle of the data update timing (for example, the internal clock). Accordingly, the selector 1102X alternately outputs the data output from the time timer 208X and the data output from the angle timer 209X for each ½ cycle of the data update timing.

The switching information output unit 1103bX outputs information (switch information) on the timing for switching the data selected by the selector 1102X. In other words, the switching information output unit 1103bX outputs the information (switch information) of the switching signal S1X output from the sequencer 1101X. This allows the condition comparison unit 101bX to 108bX to recognize a change in the data.

In the condition comparison unit 101bX, the timing control information storage unit 1011X stores the identification information of any of the data output devices, and the corresponding expected value data.

The first determination unit 1014X compares the data included in the time-shared data with the expected value data, and outputs the comparison result. For example, the first determination unit 1014X outputs "1" as the comparison result when the data included in the time-shared data coincides with the expected value data, and outputs "0" as the comparison result when the data do not coincide with each other.

The second determination unit 1015X identifies the output source (data output device) of the data included in the time-shared data based on the switch information output from the switching information output unit 1103bX, and determines whether the data coincides with the identification information stored in the timing control information storage unit 1011X. For example, the second determination unit 1015X includes information on the order of selection of data by the selector 1102X, and identifies the output source of the data included in the time-shared data at that time, based on the switch information output from the switching information output unit 1103bX. When the identification information on the output source of the data included in the time-shared data coincides with the identification information stored in the timing control information storage unit 1011X, the second determination unit 1015X outputs "1" as the determination result "1", and when the data do not coincide with each other, the second determination unit 1015X outputs "0" as the determination result.

The AND 1016X outputs the logical product between the comparison result of the first determination unit 1014X and the determination result of the second determination unit 1015X to the output control unit 1013X. When the first determination unit 1014X outputs "1" as the comparison result and the second determination unit 1015X outputs "1" as the determination result, the AND 1016X outputs the coincidence signal F1X as the logical product therebetween.

As described above, upon receiving the coincidence signal F1X from the comparison unit 1012bX, the output control unit 1013X outputs the timing signal T1X according to the coincidence signal F1X. Such an operation is similarly performed in each of the condition comparison units 102bX to 108bX.

Thus, also in the case of the timing control device 100bX according to the eighth embodiment, the same advantageous effects as those of the timing control devices according to the sixth and seventh embodiments can be obtained. Further, in the timing control device 100bX according to the eighth embodiment, there is no need to transmit the identification information from the time-sharing controller to each condition comparison unit. This enables high-speed transmission of signals from the time-sharing controller to each condition comparison unit.

(Timing Diagram)

Figure 27:
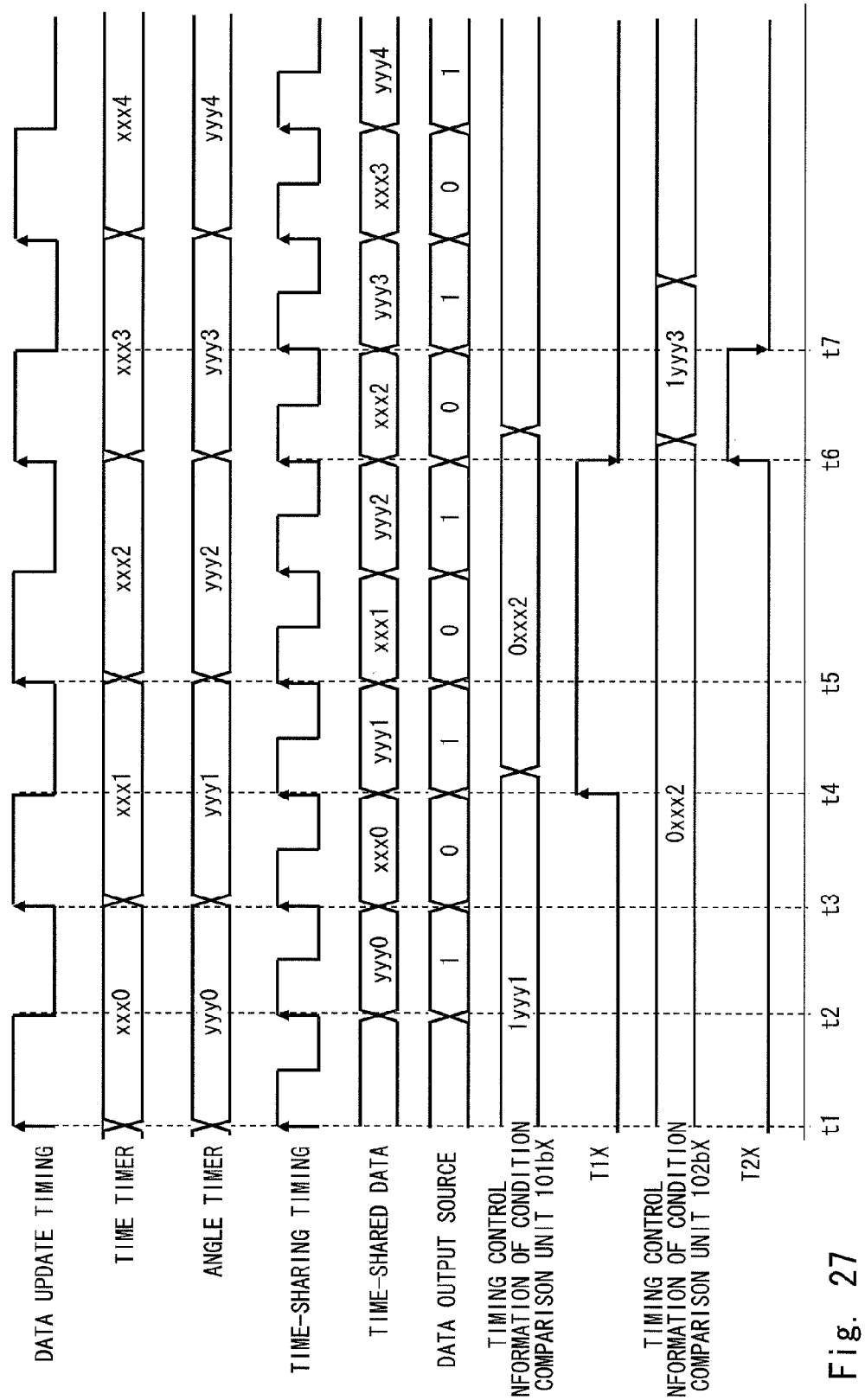
FIG. 27 is a timing diagram showing an operation of the timing control device according to the eighth embodiment of the present invention.

Next, the basic operation of the timing control device 100bX shown in FIG. 26 will be described in more detail with reference to FIG. 27. FIG. 27 is a timing diagram showing an operation of the timing control device 100bX shown in FIG. 26. FIG. 27 shows only the waveforms of the timing signals T1X and T2X among the timing signals T1X to T8X. The data output from each of the time timer 208X and the angle timer 209X is similar to that shown in FIG. 25.

In the example of FIG. 27, the timing control information storage unit 1011X stores "1" as the identification information and "yyy1" as the expected value data (time t1). The timing control information storage unit 1021X stores "0" as the identification information and "xxx2" as the expected value data (time t1).

First, the time timer 208X and the angle timer 209X respectively output data items "xxx0" and "yyy0" at the data update timing (time t1). The time-sharing controller 110bX sequentially outputs the data items "yyy0" and "xxx0" as the time-shared data for each ½ cycle of the data update timing (time t2 and time t3).

Next, the time timer 208X and the angle timer 209X respectively output the data items "xxx1" and "yyy1" at the data update timing (time t3). The time-sharing controller 110bX sequentially outputs data items "yyy1" and "xxx1" as the time-shared data for each ½ cycle of the data update timing (time t4 and time t5). Such an operation is repeated.

Note that the time-sharing controller 110bX further outputs information on the timing of the ½ cycle of the data update timing as the switch information.

In the condition comparison unit 101bX, the first determination unit 1014X outputs "1" as the comparison result when the data included in the time-shared data is "yyy1". The second determination unit 1015X outputs "1" as the determination result when the identification information of the output source of the data "yyy1" indicates "1". Accordingly, the AND 1016X outputs the coincidence signal F1X (time t4). The output control unit 1013X inverts the timing signal T1X from the L level to the H level in synchronization with the coincidence signal F1X (time t4). Upon completion of this timing control, the timing control information storage unit 1011X stores the subsequent timing control information according to the instruction from the CPU (immediately after time t4). In the example of FIG. 27, the timing control information storage unit 1011X stores "0" as the identification information and "xxx2" as the expected value data.

In the condition comparison unit 101bX, when the data included in the time-shared data is "xxx2", the first determination unit 1014X outputs "1" as the comparison result. Further, when the identification information of the output source of the data "xxx2" indicates "0", the second determination unit 1015X outputs "1" as the determination result. Accordingly, the AND 1016X outputs the coincidence signal F1X (time t6). The output control unit 1013X inverts the timing signal T1X from the H level to the L level in synchronization with the coincidence signal F1X (time t6).

Thus, the condition comparison unit 101bX causes the timing signal T1X to rise based on the output data of the angle timer 209X (time t4), and causes the timing signal T1X to fall based on the output data of the time timer 208X (time t6). Similarly, the condition comparison unit 102bX causes the timing signal T2X to rise based on the output data of the time timer 208X (time t6), and causes the timing signal T2X to fall based on the output data of the angle timer 209X (time t7).

Ninth Embodiment

Figure 28:
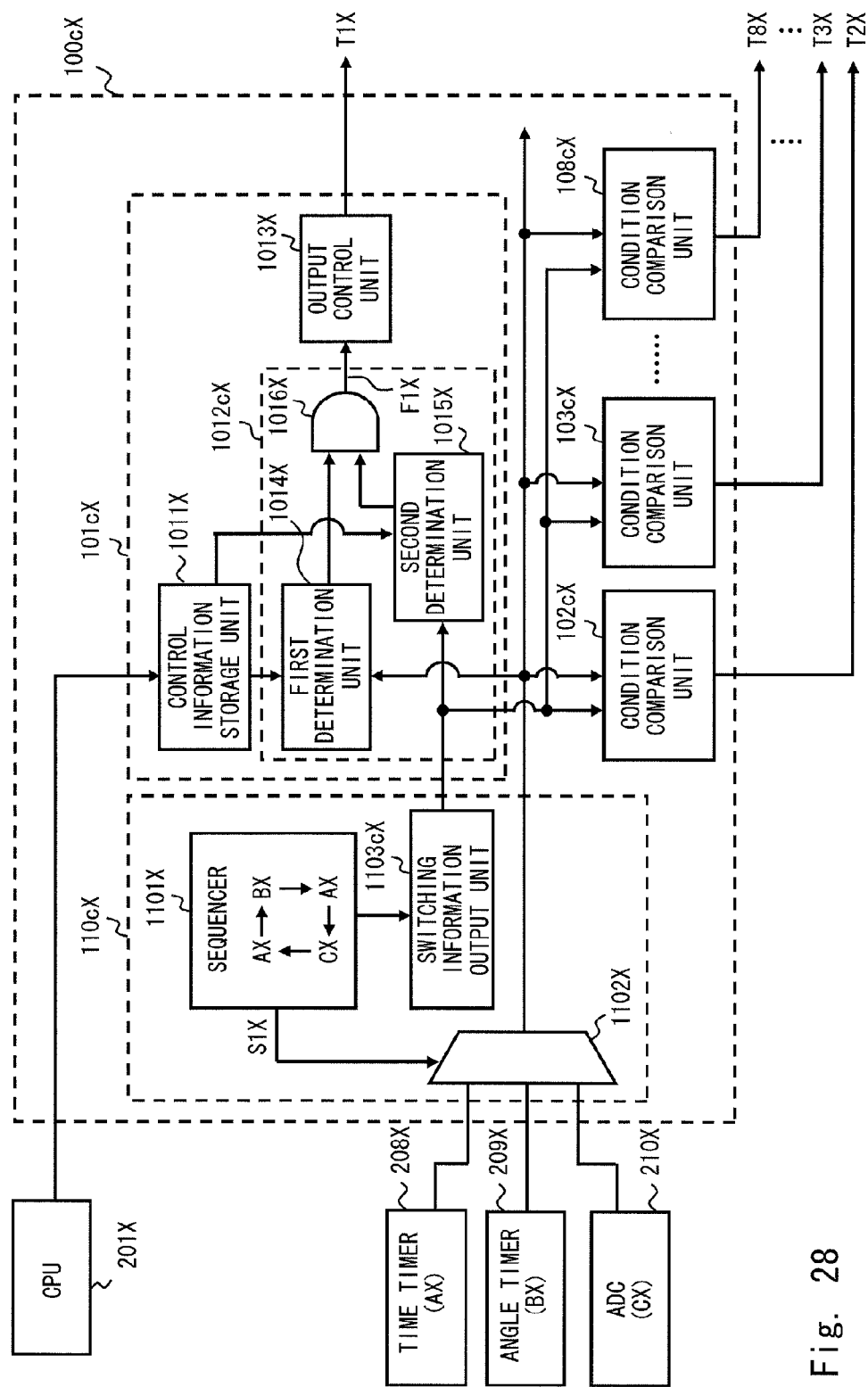
FIG. 28 is a block diagram showing a timing control device according to a ninth embodiment of the present invention.
Figure 29:
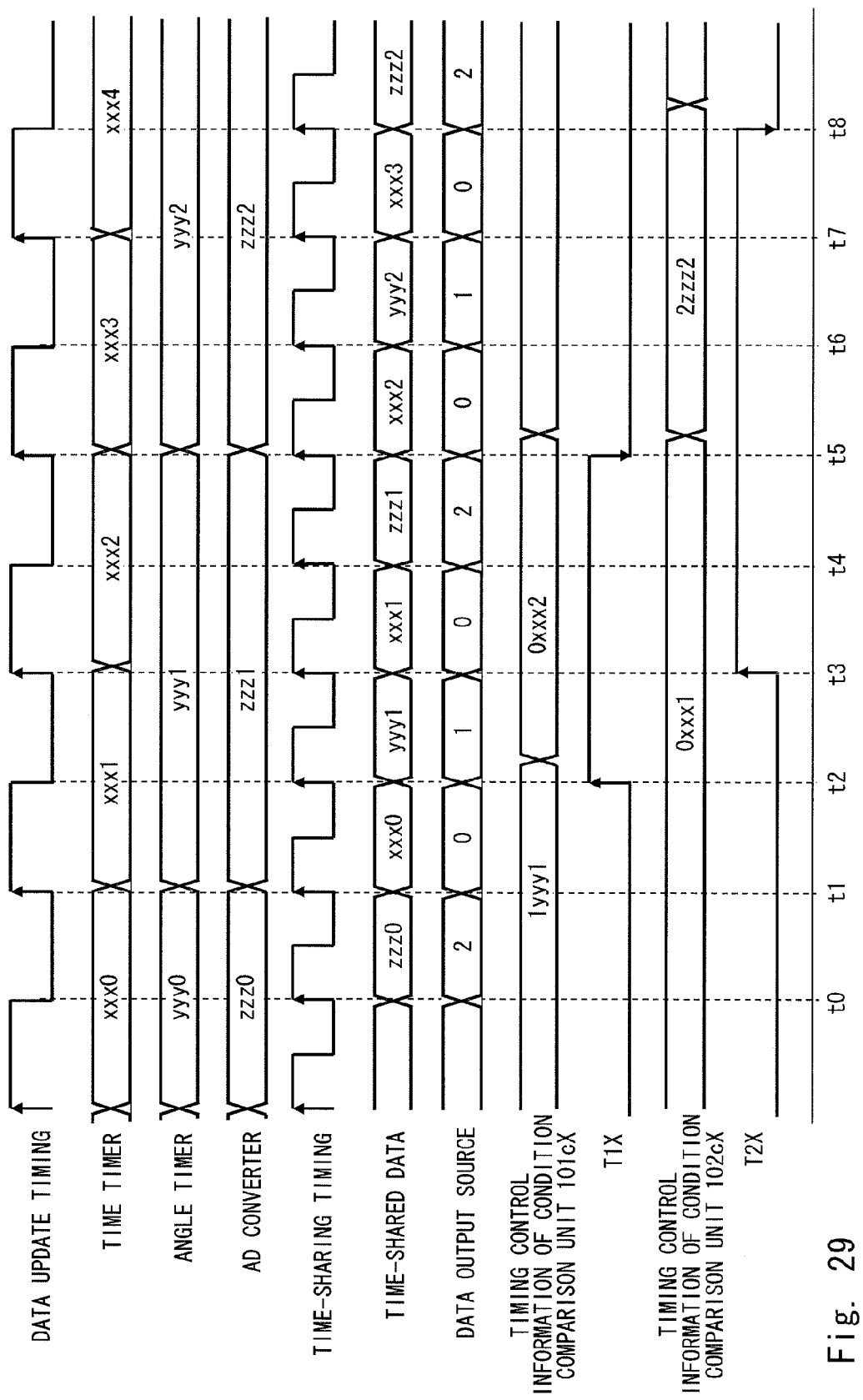
FIG. 29 is a timing diagram showing an operation of the timing control device according to the ninth embodiment of the present invention.

Referring to FIGS. 28 and 29, a ninth embodiment of the present invention illustrates an example in which the data output devices have different data update cycles. FIG. 28 is a block diagram showing a timing control device 100cX having a configuration similar to that of the timing control device 100bX shown in FIG. 26. FIG. 29 is a timing diagram showing an operation of the timing control device 100cX shown in FIG. 28. The ninth embodiment illustrates, by way of example, the case where the timing control device 100cX is mounted on the engine control microcomputer 200aX, but the present invention is not limited thereto. The timing control device 100cX can be mounted various devices requiring timing control.

As shown in FIG. 28, the timing control device 100cX includes a time-sharing controller 110cX and condition comparison units (timing signal generation units) 101cX to 108cX. The time-sharing controller 110cX includes the sequencer 1101X, the selector 1102X, and a switching information output unit 1103cX serving as the additional information output unit. The condition comparison unit 101cX includes the timing control information storage unit 1011X, a comparison unit 1012cX, and the output control unit 1013X. The comparison unit 1012cX includes the first determination unit 1014X, the second determination unit 1015X, and the AND circuit (hereinafter referred to simply as "AND") 1016X. The circuit configuration of each of the condition comparison units 102cX to 108cX is similar to that of the condition comparison unit 101cX, so the description thereof is omitted.

The selector 1102X receives the output data from each of the time timer 208X and the angle timer 209X, as well as the output data from the AD converter 210X. The ninth embodiment illustrates, by way of example, the case where the data update cycle of each of the AD converter 210X and the angle timer 209X is twice as long as the data update cycle of the time timer 208X.

The sequencer 1101X outputs the switching signal S1X having the ½ cycle of the data update timing (for example, the internal clock) of the time timer 208X. At this time, the sequencer 1101X outputs the switching signal S1X so that the selector 1102X selects and outputs the output data in the order of the time timer 208X, the angle timer 209X, the time timer 208X, and the AD converter 210X. Accordingly, the selector 1102X sequentially outputs, as the time-shared data, the data output from the time timer 208X, the angle timer 209X, the time timer 208X, and the AD converter 210X for each ½ cycle of the data update timing of the time timer 208X.

In this manner, the time-sharing controller 110cX selects the data output from each of the data output devices at the ratio of the data update frequency of each of the data output devices, and outputs the selected data. As a result, the time-sharing controller 110cX loads all the data output from each of the data output devices and outputs the data as the time-shared data. The time-sharing controller 110cX may repeatedly select and output the same data output from the same data output device. To avoid such a case, each condition comparison unit at the subsequent stage is configured to prevent the coincidence signal from being generated based on the same data until the subsequent timing control information is set, in the case of generating the coincidence signal based on certain data.

The other circuit configuration of the timing control device 100cX shown in FIG. 28 is similar to that of the timing control device 100bX shown in FIG. 26, so the description thereof is omitted.

The time-sharing controller 110cX can set the cycle of the switching signal S1X to be longer than that in the case where the data output from the data output devices is simply selected and output at regular intervals. This enables the time-sharing controller 110cX to efficiently output the data output from the data output devices as the time-shared data. In the case of simply selecting and outputting the data output from the data output devices at regular intervals, the cycle of the switching signal S1X needs to be set to a cycle obtained by dividing "the shortest data update cycle among the data update cycles of the data output devices" by "the number of the data output devices". In this case, the operation frequency of the time-sharing controller and each condition comparison unit becomes higher, which causes problems such as an increase in power consumption and an increase in the difficulty of design.

In the timers such as the time timer 208X for use in timing control, the output data is generally updated with the same cycle. Therefore, no problem occurs even when the frequency of selection of the data output from these timers (counters) is weighted. On the other hand, in the AD converter 210X and the like, the update cycle of the output data is long, unlike the time timer 208X and the like. The AD converter 210X has a number of channels in many cases. In other words, the AD converter 210X simultaneously outputs data with a long update cycle in many cases. Accordingly, particularly when the time timers and the AD converters are present in a mixed manner, the timing control device 100cX according to the ninth embodiment can perform timing control with efficiency.

(Timing Diagram)

Next, the basic operation of the timing control device 100cX shown in FIG. 28 will be described in more detail with reference to the timing diagram of FIG. 29. FIG. 29 shows only the waveforms of the timing signals T1X and T2X among the timing signals T1X to T8X. In the example of FIG. 29, the time timer 208X sequentially outputs data items "xxx0", "xxx1", "xxx2", "xxx3", and "xxx4" at the data update timing. The angle timer 209X sequentially outputs data items "yyy0", "yyy1", and "yyy2" at the data update timing of a cycle twice as long as that of the time timer 208X. The AD converter 210X sequentially outputs data items "zzz0", "zzz1", and "zzz2" at the same data update timing as that of the angle timer 209X.

In the example of FIG. 29, the timing control information storage unit 1011X stores "1" as the identification information and "yyy1" as the expected value data (time t0). The timing control information storage unit 1021X stores "0" as the identification information and "xxx2" as the expected value data (time t0).

The time timer 208X, the angle timer 209X, and the AD converter 210X respectively output the data items "xxx0", "yyy0", and "zzz0" (time t0). After that, the time timer 208X, the angle timer 209X, and the AD converter 210X respectively output the data items "xxx1", "yyy1", and "zzz1" at the data update timing (time t1). The time timer 208X outputs "xxx2" at the subsequent data update timing (time t3). At this time, the output data of each of the angle timer 209X and the AD converter 210X is not updated.

After that, the time timer 208X, the angle timer 209X, and the AD converter 210X respectively output the data items "xxx3", "yyy2", and "zzz2" at the subsequent data update timing (time t5). The time timer 208X outputs "xxx4" at the subsequent data update timing (time t7). At this time, the output data of each of the angle timer 209X and the AD converter 210X is not updated.

The time-sharing controller 110cX sequentially outputs the data items "xxx0", "yyy1", "xxx1", and "zzz1" as the time-shared data for each ½ cycle of the data update timing of the time timer 208X (times t1, t2, t3, and t4).

After that, the time-sharing controller 110cX sequentially outputs the data items "xxx2", "yyy2", "xxx3", and "zzz2" as the time-shared data for each ½ cycle of the data update timing (times t5, t6, t7, and t8).

The time-sharing controller 110cX further outputs information on the timing of the ½ cycle of the data update timing of the time timer 208X as the switch information.

In the condition comparison unit 101cX, when the data included in the time-shared data is "yyy1", the first determination unit 1014X outputs "1" as the comparison result. When the identification information of the output source of the data "yyy1" indicates "1", the second determination unit 1015X outputs "1" as the determination result. Accordingly, the AND 1016X outputs the coincidence signal F1X (time t2). The output control unit 1013X inverts the timing signal T1X from the L level to the H level in synchronization with the coincidence signal F1X (time t2). Upon completion of this timing control, the timing control information storage unit 1011X stores the subsequent timing control information according to the instruction from the CPU (immediately after time t2). In the example of FIG. 29, the timing control information storage unit 1011X stores "0" as the identification information and "xxx2" as the expected value data.

In the condition comparison unit 101cX, when the data included in the time-shared data is "xxx2", the first determination unit 1014X outputs "1" as the comparison result. When the identification information of the output source of the data "xxx2" indicates "0", the second determination unit 1015X outputs "1" as the determination result. Accordingly, the AND 1016X outputs the coincidence signal F1X (time t5). The output control unit 1013X inverts the timing signal T1X from the H level to the L level in synchronization with the coincidence signal F1X (time t5).

Thus, the condition comparison unit 101cX causes the timing signal T1X to rise based on the output data of the angle timer 209X (time t2), and causes the timing signal T1X to fall based on the output data of the time timer 208X (time t5). Similarly, the condition comparison unit 102bX causes the timing signal T2X to rise based on the output data of the time timer 208X (time t3), and causes the timing signal T2X to fall based on the output data of the AD converter 210X (time t8).

As described above, the timing control device according to the embodiments described above can generate the timing signal based on the data output from each of the data output devices. Accordingly, the timing control device according to the embodiments described above can perform versatile timing control based on the data output from each of the data output devices.

Further, the timing control device according to the embodiments described above can determine how to control the timing control target based on the state of the timing control target, and can perform versatile timing control in real time.

Note that the present invention is not limited to the embodiments described above, but can be appropriately changed without departing from the scope of the invention. Though the above embodiments mainly describe the example where the timing control device is mounted on the engine control microcomputer, the configuration of the timing control device is not limited thereto. The timing control device may be mounted on various devices requiring timing control.

Figure 31A:
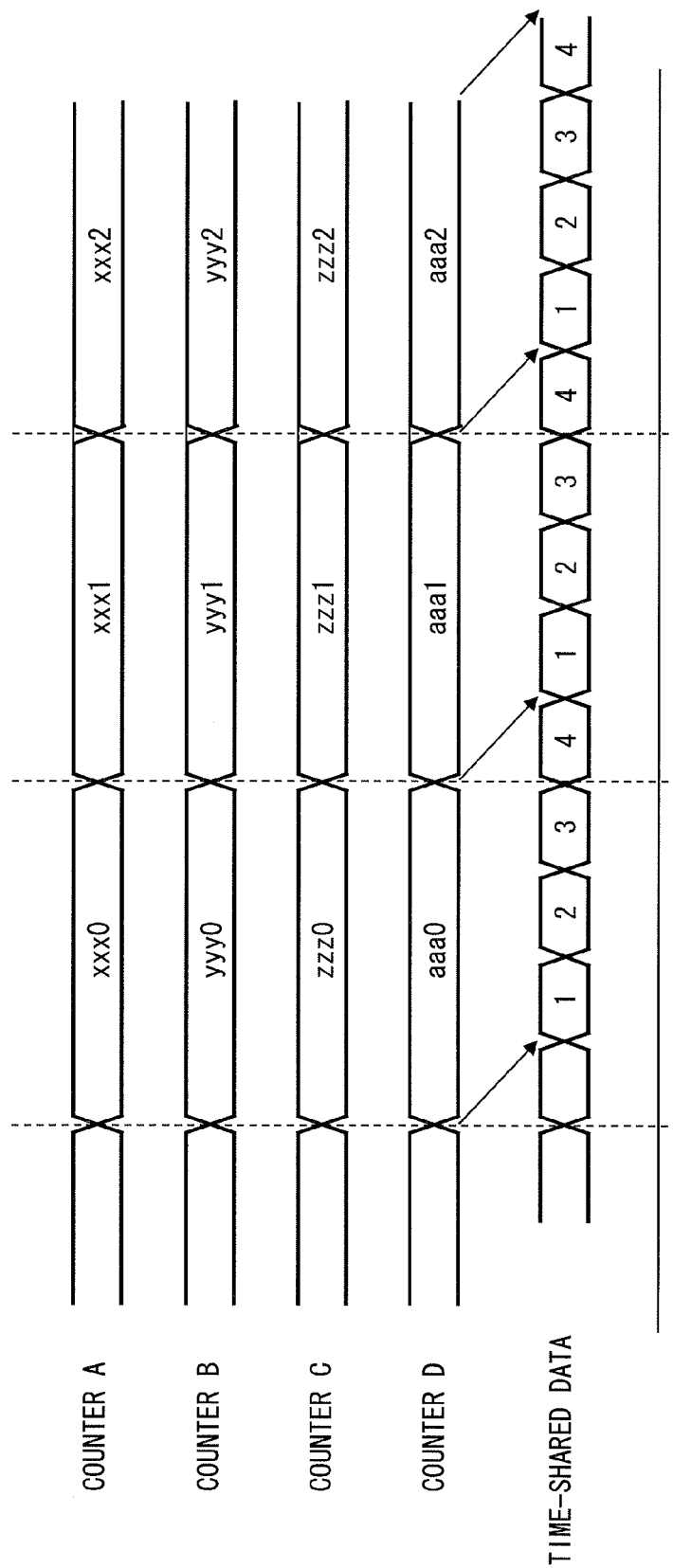
FIG. 31A is a timing diagram for explaining a problem of the timer/counter circuit of the related art.
Figure 31B:
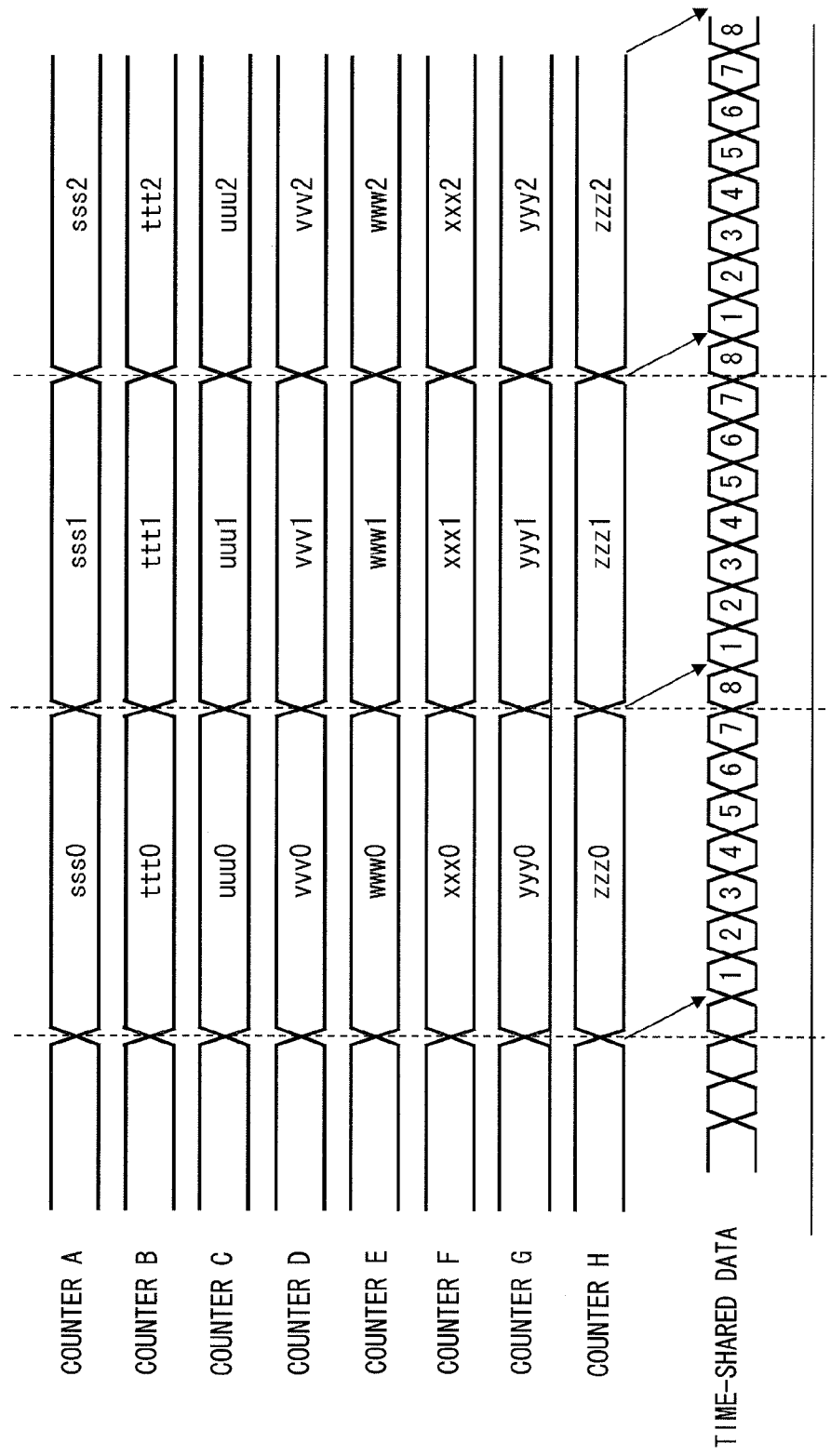
FIG. 31B is a timing diagram for explaining a problem of the timer/counter circuit of the related art.

In the timer/counter circuit of the related art shown in FIG. 30, when the count value of one counter circuit coincides with the corresponding timer value, one corresponding timing signal (interrupt signal) is generated. Accordingly, in the case of generating a plurality of timing signals in parallel using the timer/counter circuit, a number of counter circuits corresponding to the number of timing signals to be generated are required. In this case, it is necessary to increase the operation frequency of the timing signal generation units (e.g., a timing register and a coincidence flag) depending on the number of counter circuits (see FIGS. 31A and 31B). Otherwise, it is necessary to decrease the count-up cycle of each counter circuit. Particularly, in the field of engine control, about 100 timing signals may be generated in some cases. In this case, it is technically difficult to increase the operation frequency of each timing signal generation unit depending on the number of timing signals to be generated.

On the other hand, in the timing control device according to the embodiments described above, the data switch cycle of the selector 1102X does not depend on the number of timing signal generation units (condition comparison units). That is, in the timing control device according to the above embodiments, there is no need to increase the operation frequency of each timing signal generation unit even when the number of timing signal generation units (condition comparison units) is increased.

Tenth Embodiment

Figure 32:
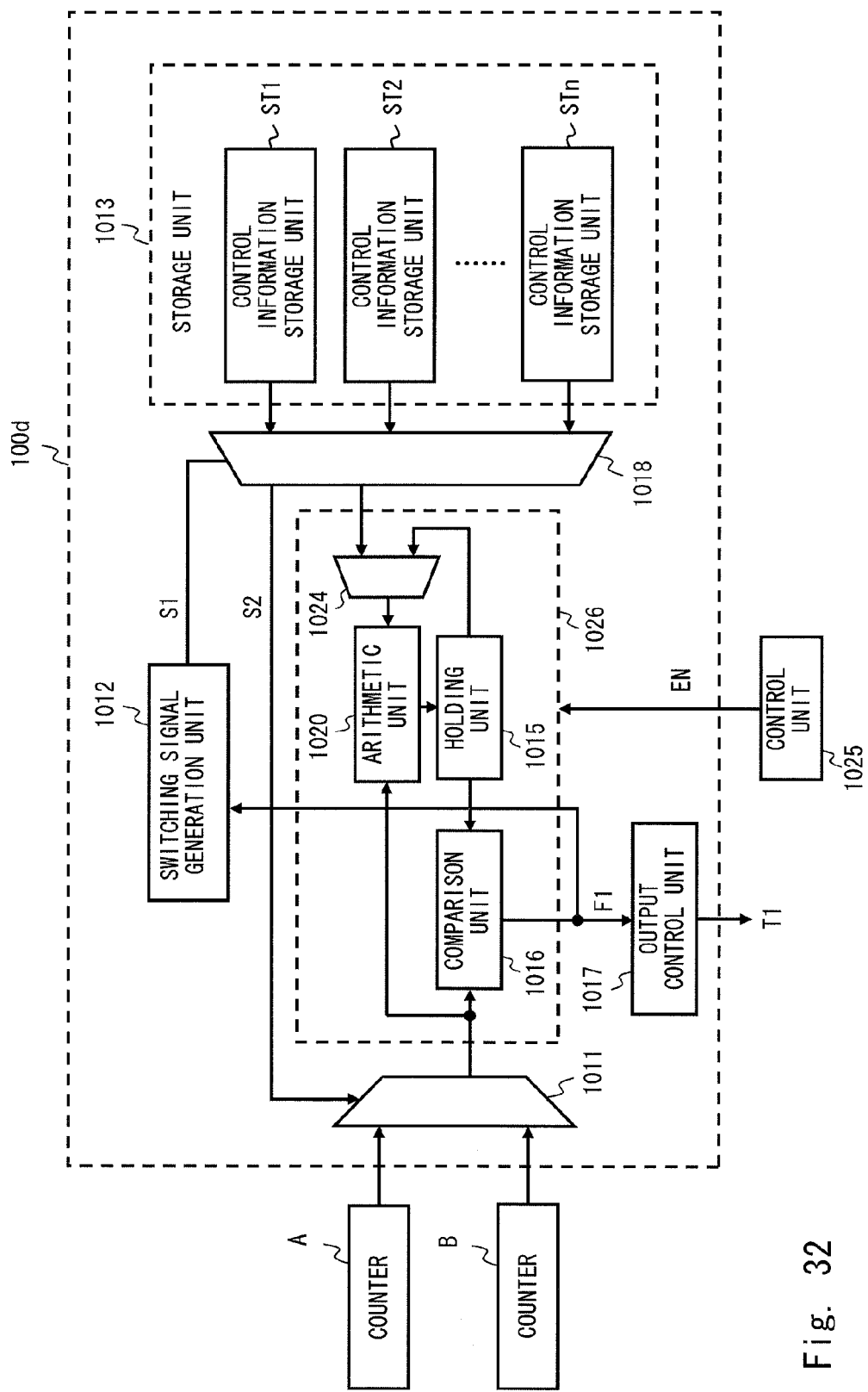
FIG. 32 is a block diagram showing a timing control device according to a tenth embodiment of the present invention.

FIG. 32 is a block diagram showing a timing control device 100d as a modified example of the timing control device 100 shown in FIG. 1.

Compared with the timing control device shown in FIG. 1, the timing control device 100d shown in FIG. 32 includes an arithmetic unit 1020 instead of the arithmetic unit 1014, and further includes a selection circuit (fourth selector) 1024. A control unit 1025 is provided outside the timing control device 100d. The control unit 1025 may be provided in the timing control device 100d. The other circuit configuration of the timing control device 100d shown in FIG. 32 is similar to that of the timing control device shown in FIG. 1, so the description thereof is omitted. The arithmetic unit 1020, the data holding unit 1015, the comparison unit 1016, and the selection circuit 1024 constitute a comparison arithmetic unit 1026.

The control unit 1025 is a unit that outputs a control signal EN. For example, when comparison operation is performed by the comparison arithmetic unit 1026, the control unit 1025 outputs the control signal EN of the L level. When comparison operation is not performed by the comparison arithmetic unit 1026, the control unit 1025 outputs the control signal EN of the H level.

The selection circuit 1024 selects one of the expected value data output from the selection circuit 1018 and the data held in the data holding unit 1015, based on the control signal EN from the control unit 1025, and outputs the selected data to the arithmetic unit 1020. For example, when the control signal EN is at the L level, the selection circuit 1024 selects the expected value data output from the selection circuit 1018, and outputs the selected data to the arithmetic unit 1020. That is, when the control signal EN is at the L level, the timing control device 100d executes the same operation as that of the timing control device 100 shown in FIG. 1. On the other hand, when the control signal EN is at the H level, the selection circuit 1024 selects the data held in the data holding unit 1015 and outputs the selected data to the arithmetic unit 1020.

Accordingly, when the control signal EN is at the L level, the arithmetic unit 1020 adds the data output from the selection circuit 1011 and the expected value data output from the selection circuit 1018 and outputs the addition result. On the other hand, when the control signal EN at the H level, the arithmetic unit 1020 outputs the difference between the data output from the selection circuit 1011 and the data held in the data holding unit 1015.

Figure 33:
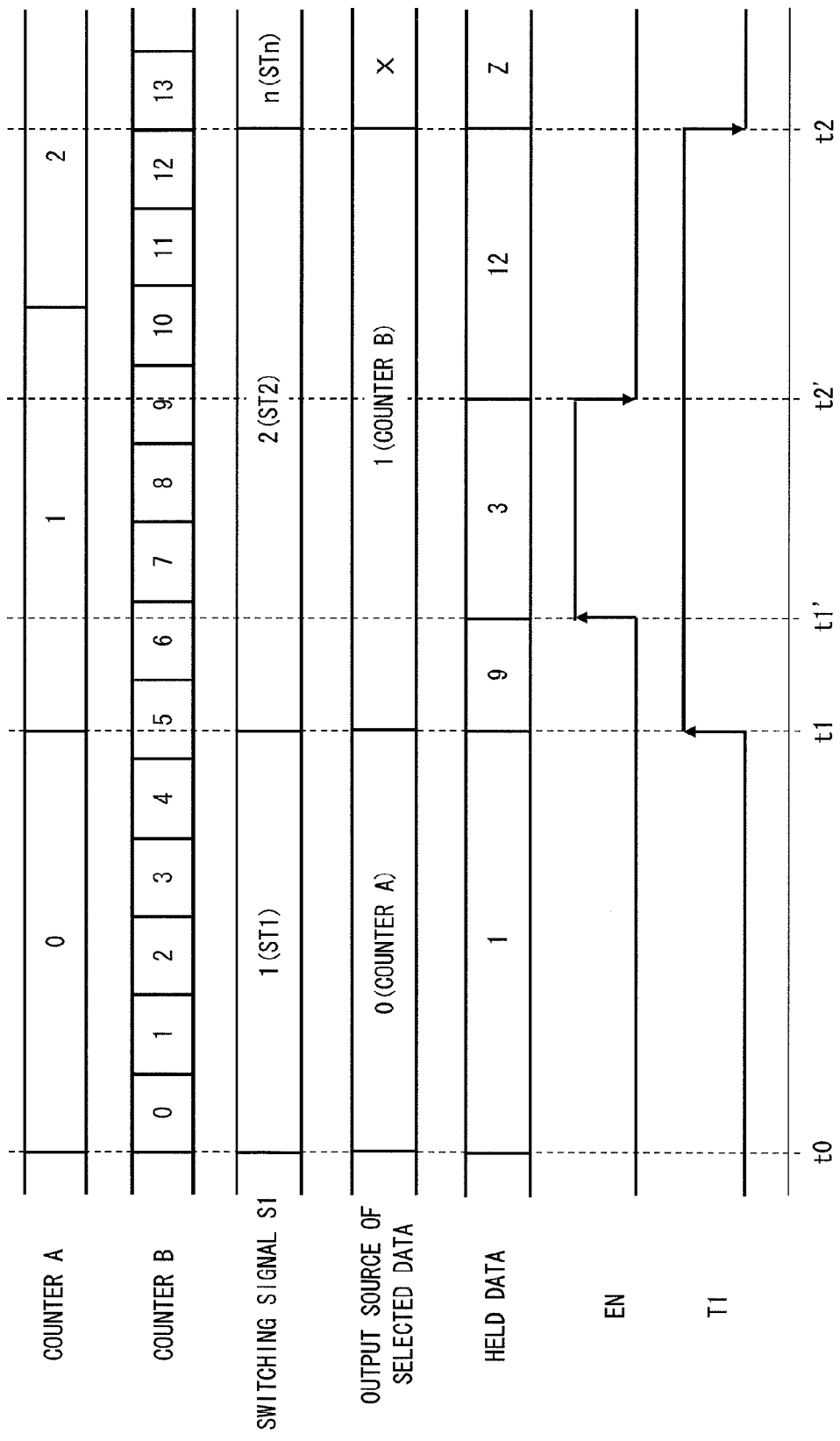
FIG. 33 is a timing diagram showing an operation of the timing control device according to the tenth embodiment of the present invention.

Referring next to FIG. 33, an operation of the timing control device 100d shown in FIG. 32 will be described. FIG. 33 is a timing diagram showing an operation of the timing control device 100d shown in FIG. 32.

In the example of FIG. 33, after resetting of the count value to "0" (time t0), the counter A increments and outputs the count value at its own data update timing. After resetting of the count value to "0" (time t0), the counter B increments and outputs the count value at the data update timing of a cycle smaller than that of the counter A.

In the example of FIG. 33, the control information storage unit ST1 stores "0" (identification information of the counter A) as the identification information, and "1" (relative value) as the expected value data. The control information storage unit ST2 stores "1" (identification information of the counter B) as the identification information, and "4" (relative value) as the expected value data.

First, the selection circuit 1018 selects and outputs the timing control information stored in the control information storage unit ST1 based on the switching signal S1 (time t0). Specifically, the selection circuit 1018 outputs the identification information "0" as the switching signal S2, and outputs the expected value data "1". The selection circuit 1011 selects and outputs the data output from the counter A based on the switching signal S2 corresponding to the identification information "0". At this time, the control signal EN indicates the L level. Accordingly, the selection circuit 1024 selects and outputs the expected value data "1" output from the selection circuit 1018.

Immediately after resetting of the counter A, the arithmetic unit 1020 outputs the result "1" of the addition between the data "0" output from the selection circuit 1011 and the expected value data "1". Then, the data holding unit 1015 holds the operation result "1" of the arithmetic unit 1020. That is, the data holding unit 1015 holds the result "1" of the addition between the output data "0" of the selection circuit 1011 and the expected value data "1" immediately after resetting of the counter A.

When the output data of the counter A, which is output from the selection circuit 1011, is "1", the output data coincides with the data held in the data holding unit 1015, so that the comparison unit 1016 outputs the coincide signal F1 (time t1). Upon receiving the coincidence signal F1 from the comparison unit 1016, the output control unit 1017 inverts the timing signal T1 from the L level to the H level in synchronization with the coincidence signal F1 (time t1).

Upon receiving the coincidence signal F1 from the comparison unit 1016, the switching signal generation unit 1012 outputs the switching signal S1 so that the selection circuit 1018 selects the timing control information stored in the subsequent control information storage unit ST2 (time t1). Accordingly, the selection circuit 1018 selects and outputs the timing control information stored in the control information storage unit ST2. Specifically, the selection circuit 1018 outputs the identification information "1" as the switching signal S2, and the expected value data "4" (relative value). The selection circuit 1011 selects and outputs the data output from the counter B, based on the switching signal S2 corresponding to the identification information "1". At this time, the control signal EN indicates the L level. Accordingly, the selection circuit 1024 selects and outputs the expected value data "4" output from the selection circuit 1018.

Immediately after switching of the timing control information selected by the selection circuit 1018, the arithmetic unit 1020 outputs the result "9" of the addition between the data "5" output from the selection circuit 1011 and the expected value data "4". Then, the data holding unit 1015 holds the operation result "9" of the arithmetic unit 1020. Specifically, when the timing control information selected by the selection circuit 1018 is switched, the data holding unit 1015 holds the result "9" of the addition between the initial output data "5" of the selection circuit 1011 and the expected value data "4" immediately after the switching.

Then, the control signal EN is switched from the L level to the H level before the data "9" held in the data holding unit 1015 coincides with the output data of the counter B (time tn. More specifically, when the output data of the counter B is "6", the control signal EN is switched from the L level to the H level (time tn. Accordingly, the selection circuit 1024 selects and outputs the data "9" held in the data holding unit 1015. Then, the arithmetic unit 1020 outputs the difference "3" between the data "6" output from the selection circuit 1011 and the held data "9". The data holding unit 1015 holds the operation result "3" of the arithmetic unit 1020.

After that, when the output data of the counter B is "9", the control signal EN is switched from the H level to the L level (time t2'). Accordingly, the arithmetic unit 1020 outputs the result "12" of the addition between the data "9" output from the selection circuit 1011 and the held data "3". The data holding unit 1015 holds the operation result "12" of the arithmetic unit 1020.

When the output data of the counter B, which is output from the selection circuit 1011, is "12", the output data coincides with the data held in the data holding unit 1015, so that the comparison unit 1016 outputs the coincide signal F1 (time t2). Upon receiving the coincidence signal F1 from the comparison unit 1016, the output control unit 1017 inverts the timing signal T1 from the H level to the L level in synchronization with the coincidence signal F1 (time t2).

Upon receiving the coincidence signal F1 from the comparison unit 1016, the switching signal generation unit 1012 outputs the switching signal S1 so that the selection circuit 1018 selects the timing control information stored in the subsequent control information storage unit ST3 (time t2). Accordingly, the selection circuit 1018 selects and outputs the timing control information stored in the control information storage unit ST3.

Thus, the timing control device 100*d* causes the timing signal T1 to rise based on the output data of the counter A (time t1), and causes the timing signal T1 to fall based on the output data of the counter B (time t2). When the control signal EN is at the L level, the timing control device 100*d* performs comparison using the comparison arithmetic unit 1026 (that is, the timing control device 100*d* operates in the same manner as in the timing control device 100). When the control signal EN is at the H level, the timing control device 100*d* does not perform comparison using the comparison arithmetic unit 1026.

This configuration allows the change timing of the timing signal T1 to be easily changed only by switching the control signal EN without changing the information of the control information storage unit, when the change timing of the timing signal T1 is to be changed from the preset timing, for example. At this time, the change of the change timing of the timing signal T1 by the control signal EN has no adverse effect on the setting of the subsequent operation. On the other hand, when the change timing of the timing signal T1 is changed by changing the information of the control information storage unit, it is necessary to recreate the whole timing information after the timing to be changed.

Further, since the control using the control signal EN allows the timing to be easily changed without changing the information of the control storage unit, there is no adverse effect on the real-time performance. Therefore, the timing control device 100*d* can maintain the high-speed operation.

Though the tenth embodiment illustrates, by way of example, the case where the control signal EN is generated by the control unit 1025, the control signal EN may be generated by another circuit provided in advance. Further, one or more control signals EN may be generated. This allows the change timing of the timing signal T1 to be more finely changed depending on the state, while maintaining the real-time performance.

The whole or part of the exemplary embodiments disclosed above can be described as, but not limited to, the following supplementary notes.

(Supplementary Note 1)

A timing control device comprising:

a time-sharing controller that sequentially selects data items output from a plurality of data output devices and outputs the data items as time-shared data; and a timing signal generation unit that generates a timing signal based on the time-shared data, wherein the timing signal generation unit comprises:

a timing control information storage unit that stores expected value data of one of the data output devices;

a comparison unit that compares the expected value data of the one of the data output devices with a data item included in the time-shared data and corresponding to the one of the data output devices, and outputs a coincide signal when the expected value data coincides with the data item; and an output control unit that outputs the timing signal according to the coincidence signal.

(Supplementary Note 2)

The timing control device according to Supplementary note 1, wherein the time-sharing controller further outputs additional information corresponding to each data item included in the time-shared data, the timing control information storage unit further stores identification information of any one of the data output devices, in addition to the expected value data of any one of the data output devices, and the comparison unit compares the identification information of the data output device obtained based on the additional information with the identification information stored in the timing control information storage unit, further compares the corresponding data item included in the time-shared data with the expected value data, and outputs the coincidence signal when the identification information of the data output device coincides with the identification information stored in the timing control information storage unit and the corresponding data item coincides with the expected value data.

(Supplementary Note 3)

The timing control device according to Supplementary note 2, wherein the time-sharing controller comprises:
- a sequencer that outputs a switching signal having a cycle corresponding to a cycle of updating the data items output from the data output devices;
- a selector that selectively switches the data items in synchronization with the switching signal and outputs the data items as the time-shared data; and
- an additional information output unit that outputs identification information corresponding to the data items output from the selector as the additional information in synchronization with the switching signal.

(Supplementary Note 4)

The timing control device according to Supplementary note 3, wherein the time-sharing controller adds the additional information to the corresponding data item, and outputs the additional information with the data item as the time-shared data.

(Supplementary note 5)

The timing control device according to Supplementary note 2, wherein
- the time-sharing controller comprises:
- a sequencer that outputs a switching signal having a cycle corresponding to a cycle of updating the data items output from the data output devices;
- a selector that selectively switches the data items in synchronization with the switching signal and outputs the data items as the time-shared data; and
- an additional information output unit that outputs, as the additional information, information on a timing of switching the data items selected by the selector,
- the comparison unit comprises:
- a first determination unit that determines whether a data item included in the time-shared data coincides with the expected value data; and
- a second determination unit that identifies a data output device outputting the data item based on the additional information, and determines whether the identification information coincides with the identification information stored in the timing information storage unit, and
- the comparison unit outputs the coincidence signal based on determination results of the first and second determination units.

(Supplementary Note 6)

The timing control device according to any one of Supplementary notes 1 to 5, wherein the time-sharing controller selectively switches the data items output from the data output devices at a cycle obtained by dividing a shortest data update cycle among data update cycles of the data output devices by the number of data output devices, and outputs the data items as the time-shared data.

(Supplementary Note 7)

The timing control device according to any one of Supplementary notes 1 to 5, wherein the time-sharing controller selectively switches the data items output from the data output devices at a ratio of a data update frequency of each of the data output devices, and outputs the data items as the time-shared data.

(Supplementary Note 8)

The timing control device according to any one of Supplementary notes 1 to 7, wherein at least one of the data output devices outputs data based on a state of a control target device, timing of the control target device being controlled by the timing signal.

(Supplementary Note 9)

The timing control device according to Supplementary note 8, wherein the control target device is an on-vehicle engine.

(Supplementary Note 10)

The timing control device according to Supplementary note 9, wherein at least one of the data output devices is a first timer that outputs data according to an angle of a rotating shaft of the on-vehicle engine.

(Supplementary Note 11)

The timing control device according to Supplementary note 9 or 10, wherein at least one of the data output devices is a second timer that counts up and outputs a count value at regular intervals.

(Supplementary note 12)

The timing control device according to any one of Supplementary notes 1 to 11, further comprising a plurality of timing signal generation units.

(Supplementary note 13)

A control system comprising:
- a microcomputer comprising the timing control device according to any one of Supplementary notes 1 to 12, and the plurality of data output devices; and
- the control target device, operation of the control target device being controlled by the microcomputer.

(Supplementary Note 14)

A control method of a timing control device, comprising:
- sequentially selecting data items output from a plurality of data output devices and outputting the data items as time-shared data;
- comparing expected value data of one of the data output devices stored in a timing control information storage unit with a data item included in the time-shared data and corresponding to the one of the data output devices, and outputting a coincide signal when the expected value data coincides with the data item; and
  - outputting the timing signal according to the coincidence signal.

The first to tenth embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A timing control device comprising:
- a sequencer that selects one from among a first data output unit and a second data output unit at a first timing and selects the other from among the first data output unit and the second data output unit at a second timing;
- a first comparison unit that compares an output data from the first data output unit with a first expected value and compares an output data from the second data output unit with a second expected value; and a first output control unit that outputs a first signal having a first pulse width determined by results of the first comparison unit,
wherein the second timing is a timing when the first comparison unit indicates that the output data from the first data output unit and the first expected value are matched.

2. The timing control device according to claim 1, wherein the sequencer is a time-sharing unit that switches the first and the second data output units, periodically.

3. The timing control device according to claim 1, wherein the first data output unit is a timer unit.

4. The timing control device according to claim 1,
wherein the first signal includes a first edge and a second edge,
wherein the first edge occurs when the first comparison unit indicates that the output data from the first data output unit and the first expected value are matched, and
wherein the second edge occurs when the first comparison unit indicates that the output data from the second data output unit and the second expected value are matched.

5. The timing control device according to claim 1, further comprising:
a second comparison unit that compares the output data from the first data output unit with a third expected value and compares the output data from the second data output unit with a fourth expected value; and
a second output control unit that outputs a second signal having a second pulse width determined by results of the second comparison unit.

6. The timing control device according to claim 5,
wherein the second signal includes a third edge and a fourth edge,
wherein the third edge occurs when the second comparison unit indicates that the output data from the first data output unit and the third expected value are matched, and
wherein the fourth edge occurs when the second comparison unit indicates that the output data from the second data output unit and the fourth expected value are matched.

7. The timing control device according to claim 1, further comprising a selector configured to select from among the first data output unit and the second data output unit based on a selection signal output by the sequencer.

8. The timing control device according to claim 7, wherein the selector is a multiplexer comprising a plurality of inputs including a first input for receiving the output data of the first data output unit and a second input for receiving the output data of the second data output unit, a selection input for selecting from among the plurality of inputs.

9. A timing control device comprising:
a sequencer that selects one from among a first data output unit and a second data output unit at a first timing and selects the other from among the first data output unit and the second data output unit at a second timing;
a first comparison unit that compares an output data from the first data output unit with a first expected value and compares an output data from the second data output unit with a second expected value; and
a first output control unit that outputs a first signal having a first pulse width determined by results of the first comparison unit,
wherein the sequencer outputs the output data from the first data output unit with a first identification information and outputs the output data from the second data output unit with a second identification information,
wherein the first comparison unit compares the output data from the first data output unit with the first expected value when the sequencer outputs the first identification information, and
wherein the first comparison unit compares the output data from the second data output unit with the second expected value when the sequencer outputs the second identification information.

* * * * *